(12) United States Patent
Shigihara

(10) Patent No.: US 7,941,025 B2
(45) Date of Patent: May 10, 2011

(54) SEMICONDUCTOR PHOTONIC DEVICE

(75) Inventor: Kimio Shigihara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/475,688

(22) Filed: Jun. 1, 2009

(65) Prior Publication Data

US 2009/0237798 A1    Sep. 24, 2009

Related U.S. Application Data

(62) Division of application No. 11/281,364, filed on Nov. 18, 2005, now abandoned.

(30) Foreign Application Priority Data

Nov. 30, 2004    (JP) .................................. 2004-345415

(51) Int. Cl.
  *G02B 6/10* (2006.01)
(52) U.S. Cl. ........................ 385/131; 372/49.01; 257/13
(58) Field of Classification Search .................. 385/1, 4, 385/14, 127, 131; 372/49.01; 257/13
  See application file for complete search history.

(56) References Cited

U.S. PATENT DOCUMENTS

| 5,282,219 A | 1/1994 | Shigihara et al. |
| 5,729,323 A * | 3/1998 | Arden et al. .................. 351/163 |
| 6,946,684 B2 | 9/2005 | Shigihara et al. |
| 6,990,283 B2 | 1/2006 | Lee et al. |
| 2003/0168667 A1 * | 9/2003 | Shigihara et al. ............... 257/80 |
| 2004/0062507 A1 | 4/2004 | Shigihara et al. |
| 2006/0258026 A1 | 11/2006 | Miyashi et al. |

FOREIGN PATENT DOCUMENTS

| JP | 3-111799 A | 5/1991 |
| JP | 4-350600 A | 12/1992 |
| JP | 5-243689 A | 9/1993 |
| JP | 7-201859 A | 8/1995 |
| JP | 8-45901 A | 2/1996 |
| JP | 9-55351 A | 2/1997 |
| JP | 2000-114639 A | 4/2000 |
| JP | 2004-88049 A | 3/2004 |
| JP | 2004-111622 A | 4/2004 |
| JP | 2004-289108 A1 | 10/2004 |
| WO | WO 2004/082085 A1 | 9/2004 |

OTHER PUBLICATIONS

Pedrotti et al. Introduction to Optics, 1993, Prentice Hall Inc. pp. 393-398.*

Shigihara et al., "Antireflection coating for laser diodes", *Electronics Letters*., vol. 31, No. 18, pp. 1574-1576, (Aug. 31, 1995).

* cited by examiner

*Primary Examiner* — Mark A Robinson
*Assistant Examiner* — Erin D Chiem
(74) *Attorney, Agent, or Firm* — Leydig, Voit & Mayer, Ltd.

(57) ABSTRACT

A coating film is provided on an end surface of a semiconductor photonic element including an active layer through which light propagates. The coating film has a two-layer structure including a first layer film and a second layer film arranged in a stacked relation. The thicknesses of the first and second layer films are determined so that the value of the amplitude reflectivity of the coating film is equal to an imaginary number.

9 Claims, 48 Drawing Sheets

F I G . 7
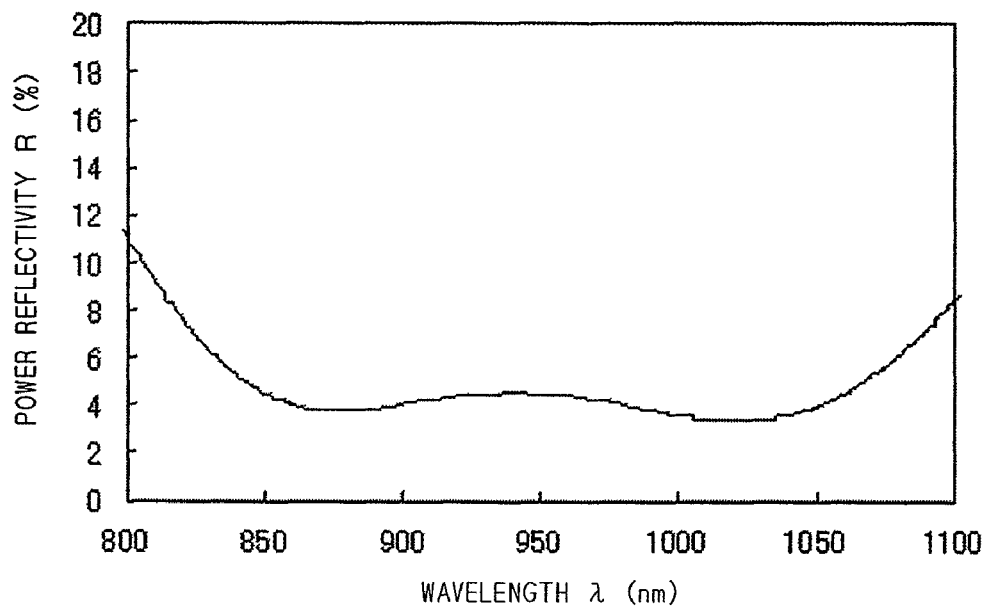
F I G . 8
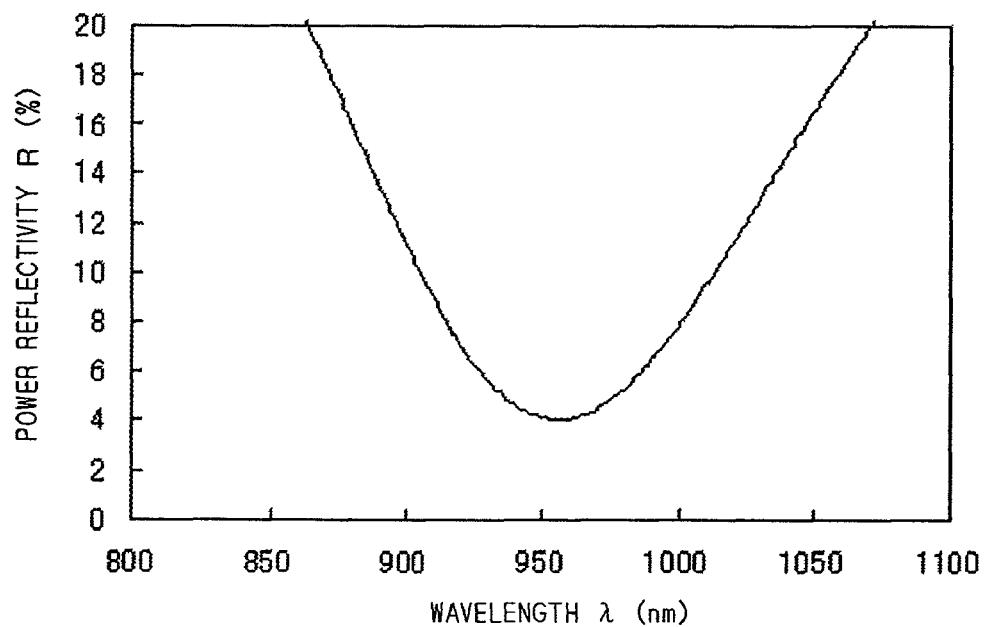

F I G . 9
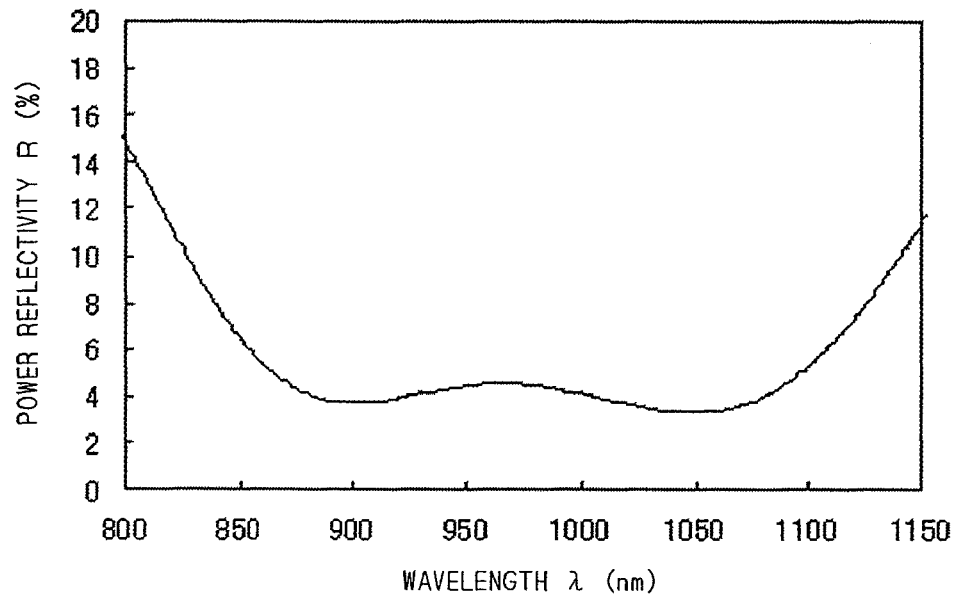
F I G . 1 0
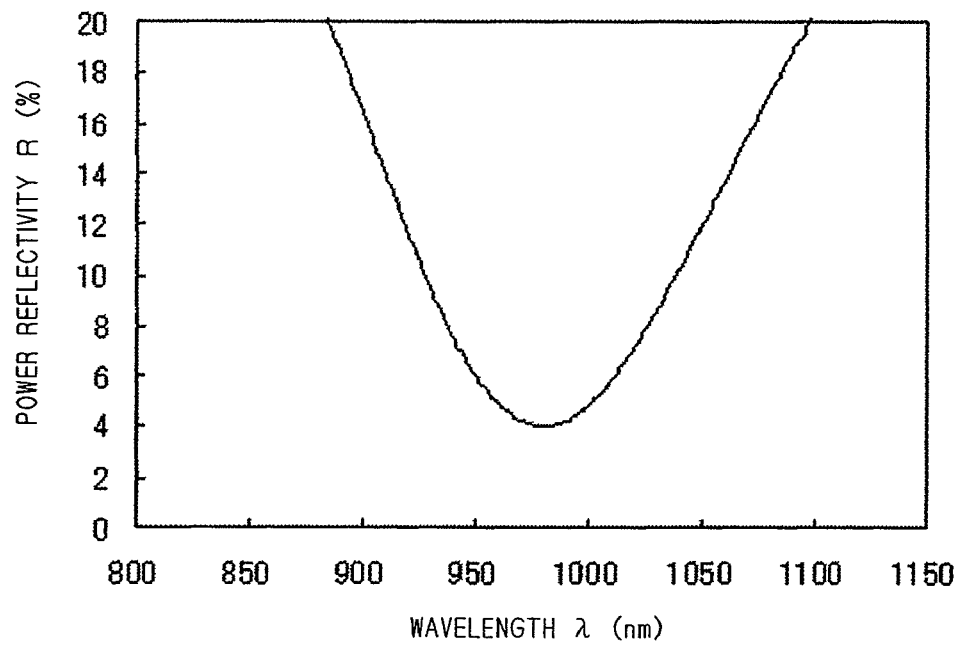

F I G. 2 1
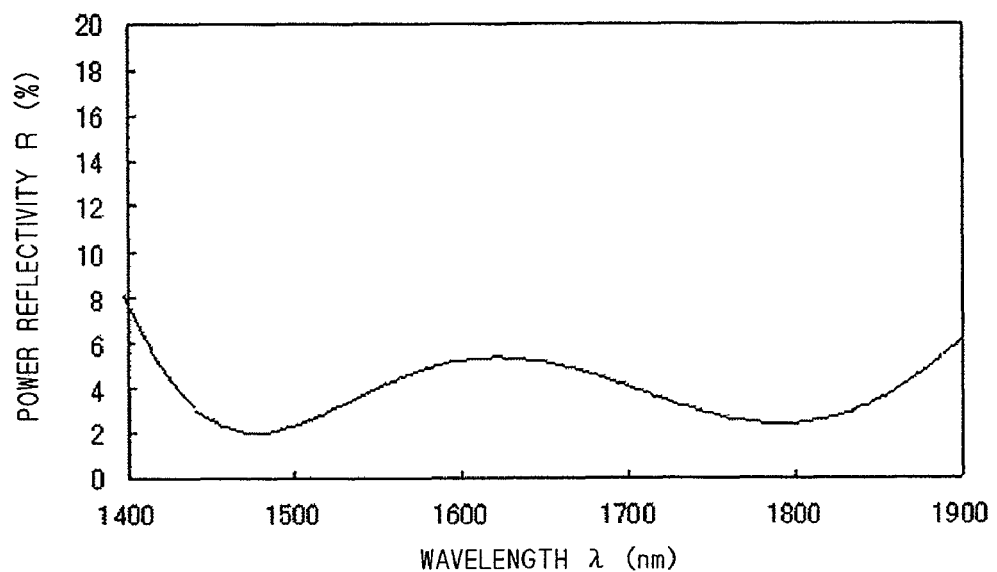
F I G. 2 2
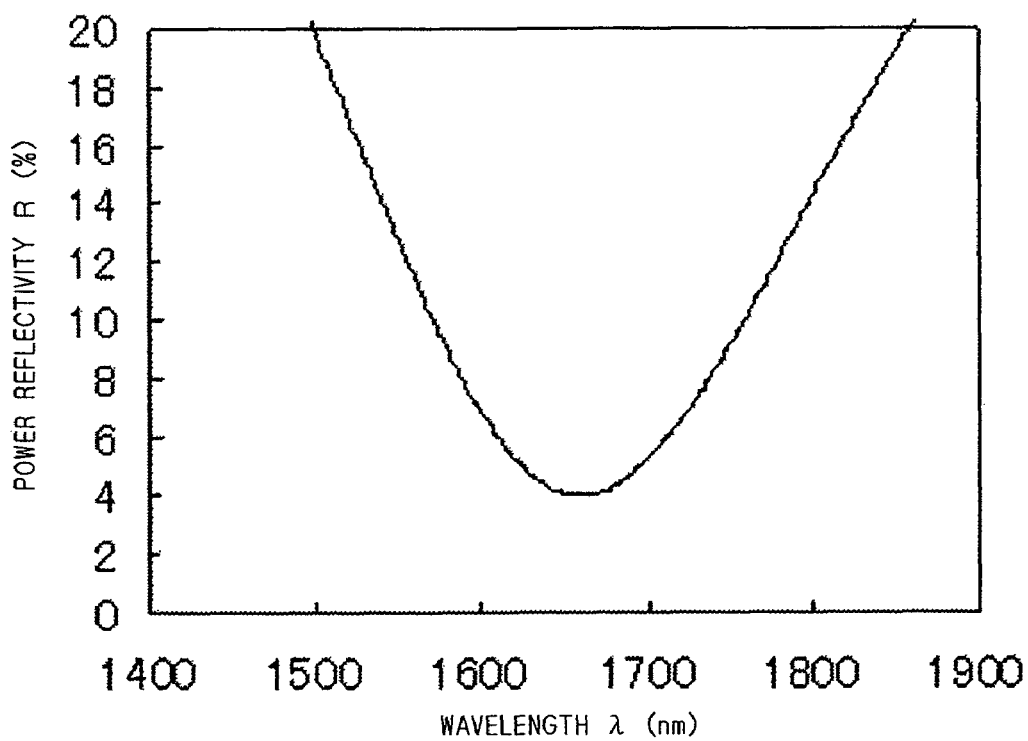

F I G. 2 3
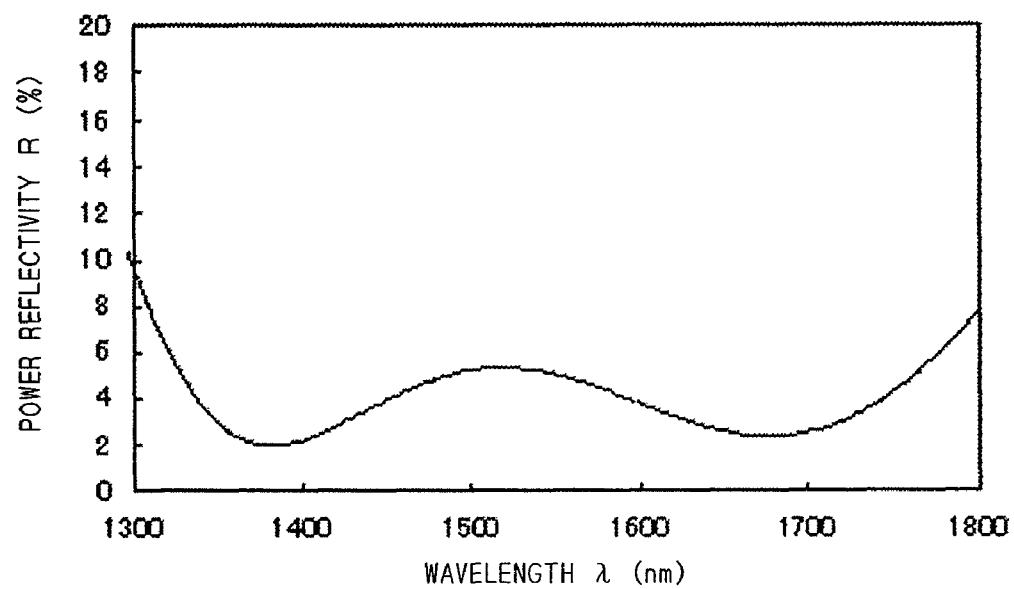
F I G. 2 4
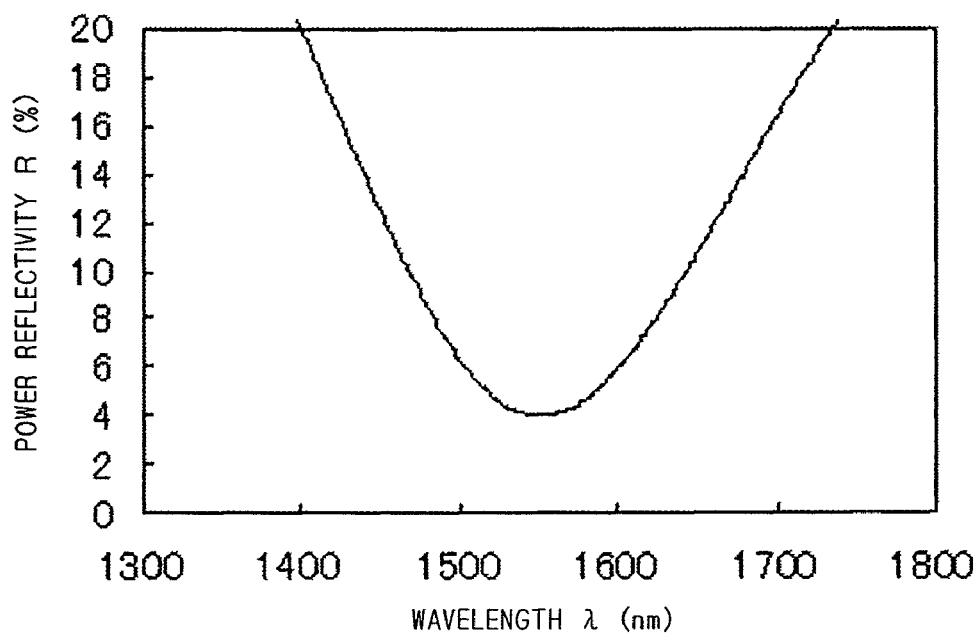

F I G . 4 3
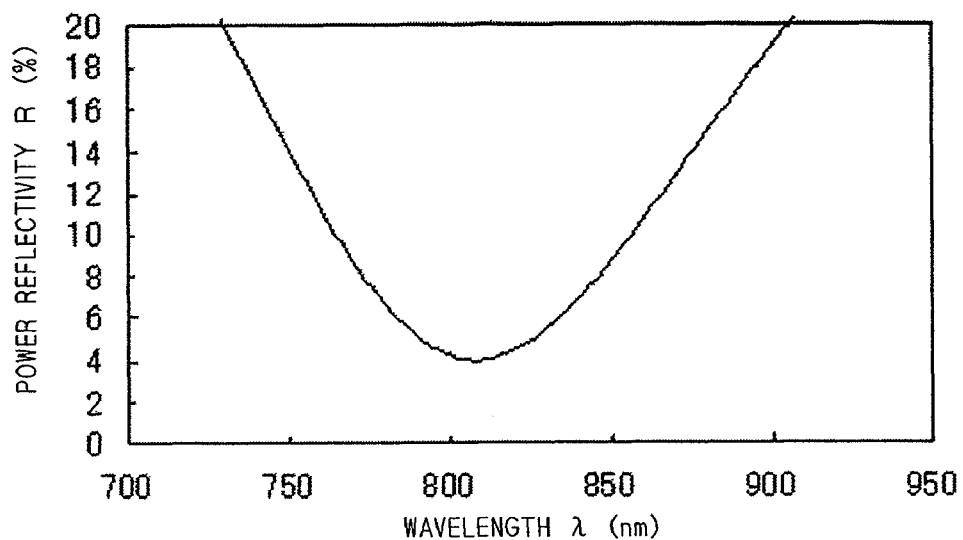
F I G . 4 4
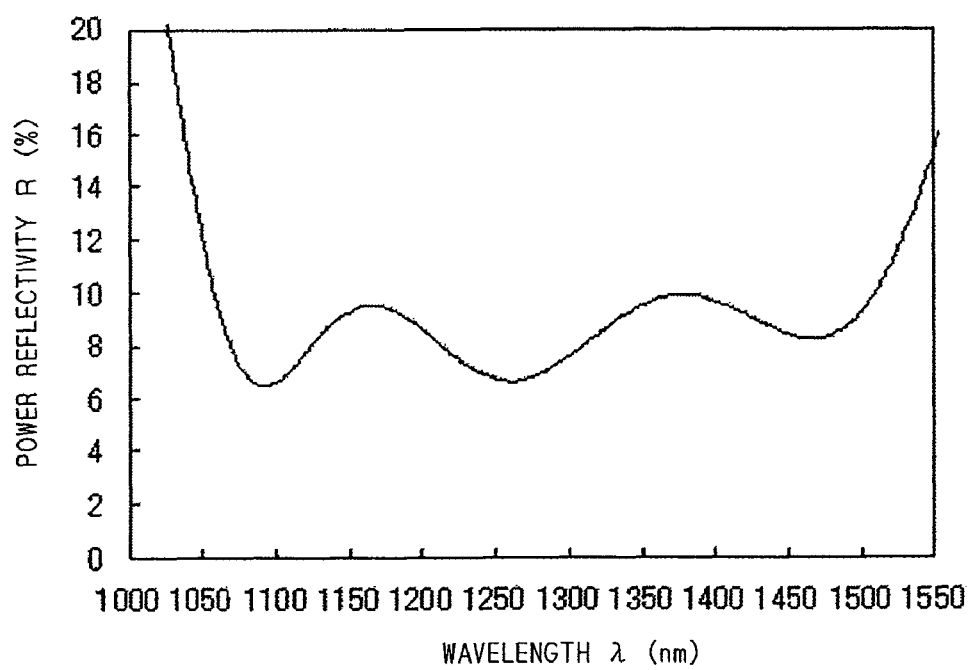

F I G . 5 1
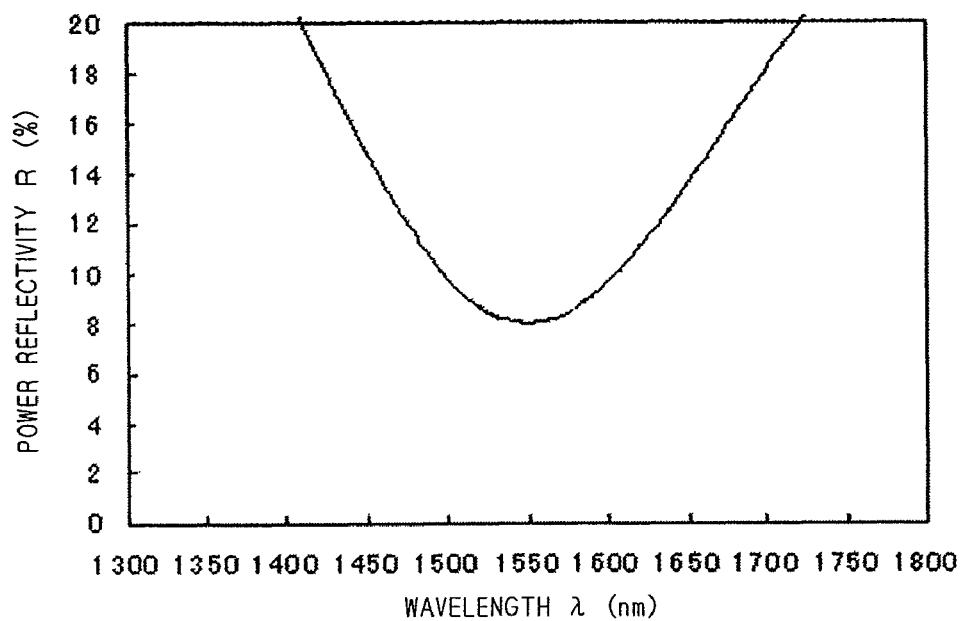
F I G . 5 2
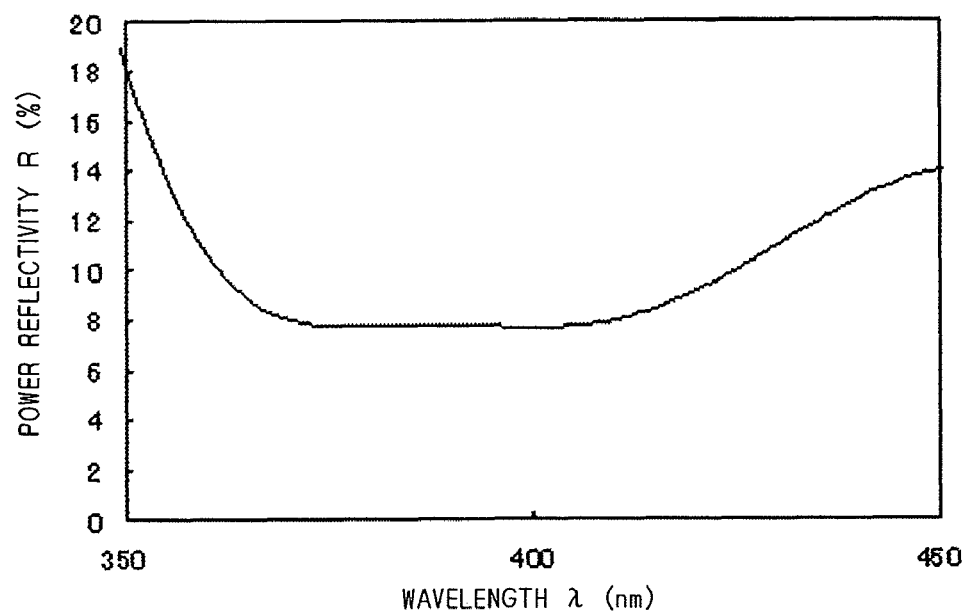

F I G . 6 7
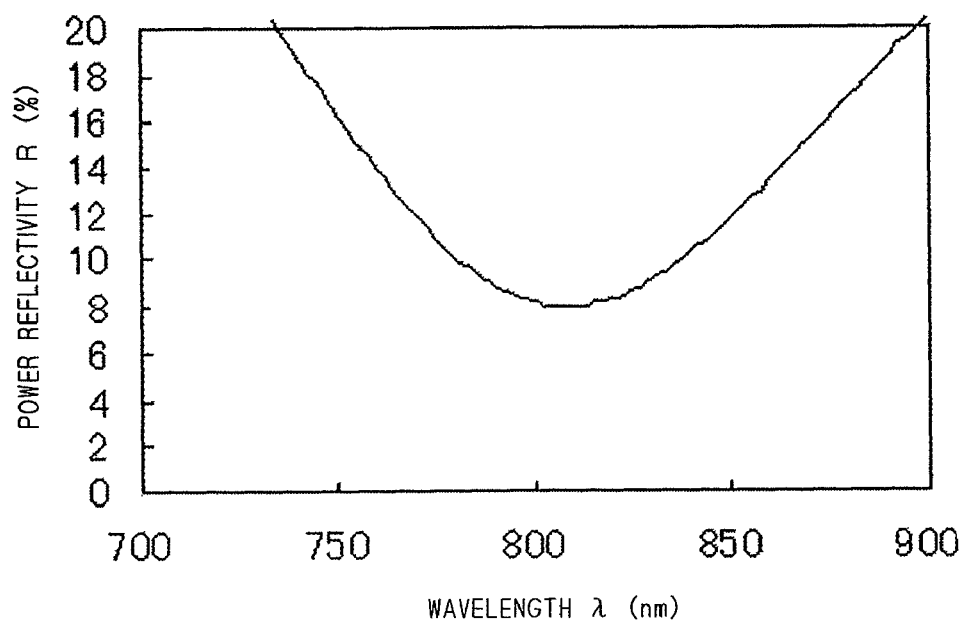
F I G . 6 8
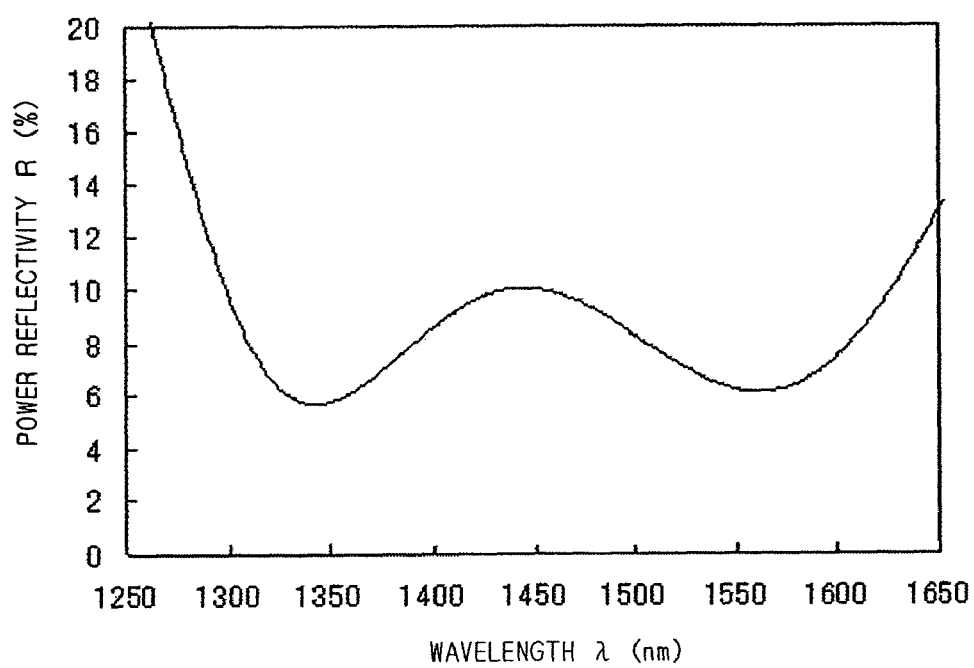

F I G . 8 7
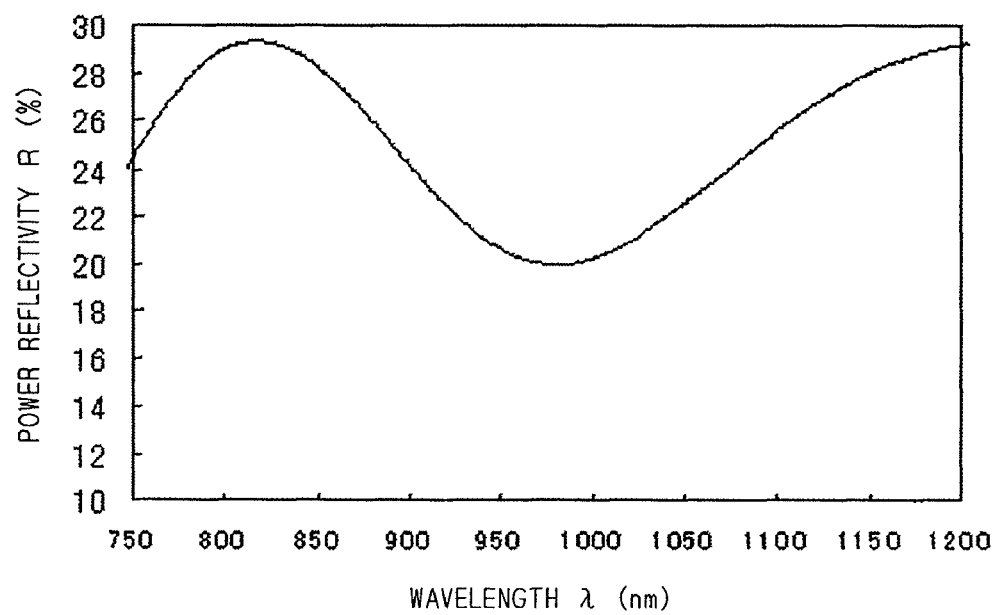
F I G . 8 8
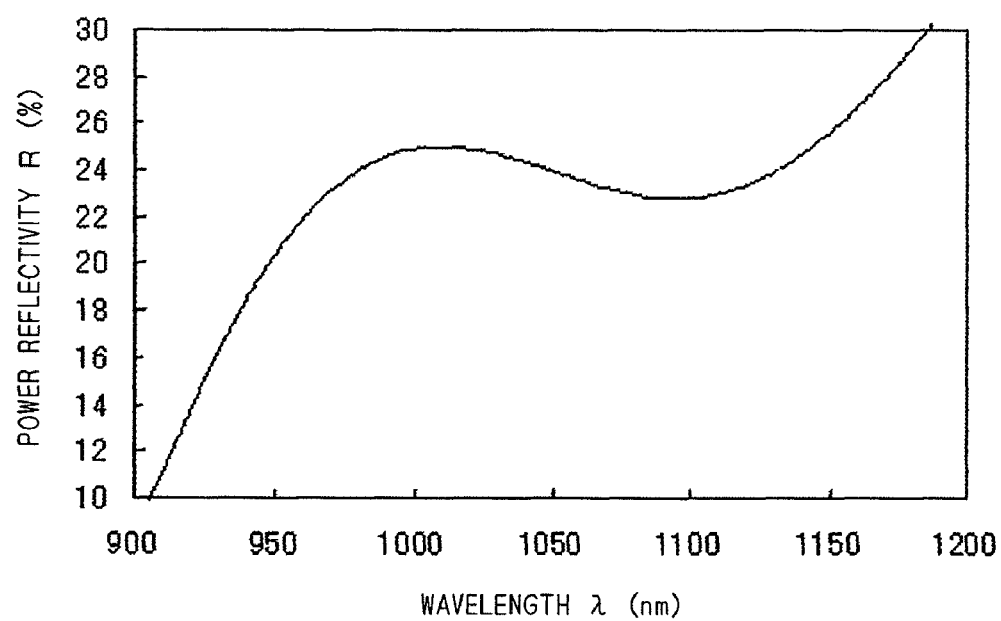

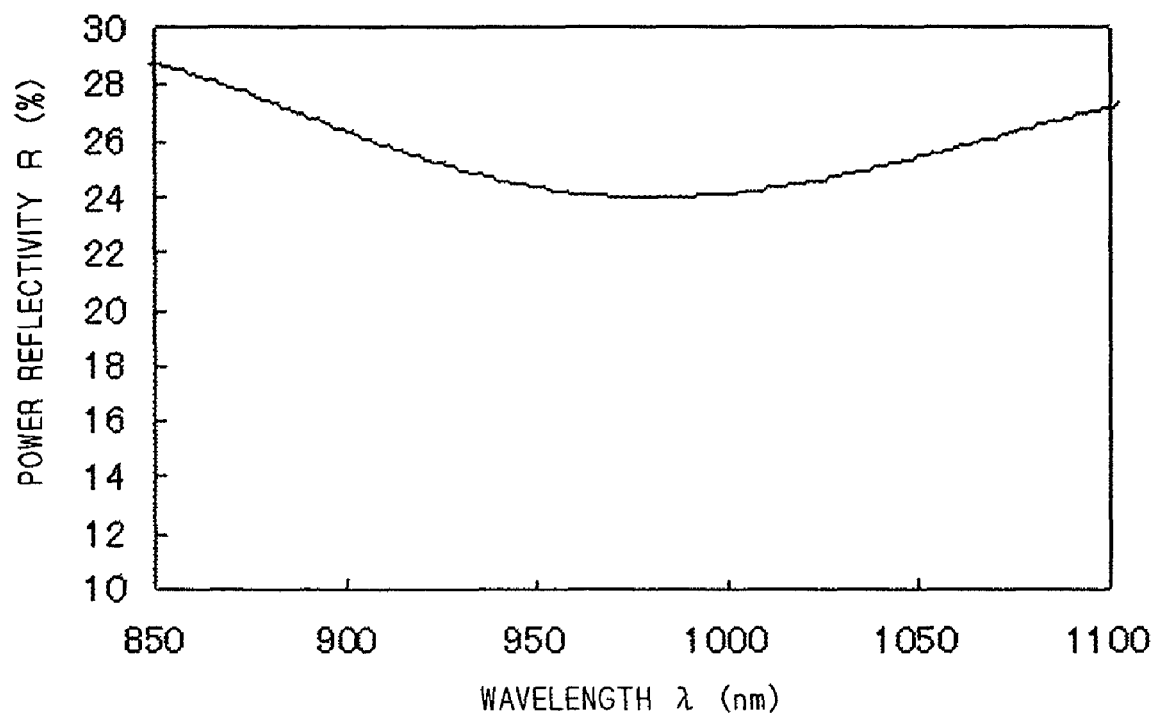
F I G . 9 1

FIG. 92

| PREFERRED EMBODIMENT | ALLOWABLE REFLECTIVITY RANGE | TOTAL NUMBER OF LAYERS | NUMBER OF MATERIAL LAYERS | COATING FILM STRUCTURE | QUADRANT | $\theta$ (°) | DESIGN WAVELENGTH (nm) |
|---|---|---|---|---|---|---|---|
| 1 | 4%±2% | 6 | 2 | $Ta_2O_5/SiO_2/Ta_2O_5/SiO_2/Ta_2O_5/SiO_2$ | 1 | 60 | 980 |
| 2 | 4%±2% | 6 | 2 | $Ta_2O_5/Al_2O_3/Ta_2O_5/Al_2O_3/Ta_2O_5/Al_2O_3$ | 2 | 150 | 808 |
| 3 | 4%±2% | 7 | 2 | $Al_2O_3/Ta_2O_5/Al_2O_3/Ta_2O_5/Al_2O_3/Ta_2O_5/Al_2O_3$ | 3 | 225 | 1310 |
| 4 | 4%±2% | 7 | 3 | $AlN/Ta_2O_5/Al_2O_3/Ta_2O_5/Al_2O_3/Ta_2O_5/Al_2O_3$ | 4 | 330 | 1550 |
| 5 | 4%±2% | 8 | 2 | $Ta_2O_5/SiO_2/Ta_2O_5/SiO_2/Ta_2O_5/SiO_2/Ta_2O_5/SiO_2$ | 1 | 45 | 410 |
| 6 | 4%±2% | 8 | 3 | $AlN/SiO_2/Ta_2O_5/SiO_2/Ta_2O_5/SiO_2/Ta_2O_5/SiO_2$ | 2 | 135 | 650 |
| 7 | 4%±2% | 9 | 2 | $Al_2O_3/Ta_2O_5/Al_2O_3/Ta_2O_5/Al_2O_3/Ta_2O_5/Al_2O_3/Ta_2O_5/Al_2O_3$ | 3 | 240 | 980 |
| 8 | 4%±2% | 10 | 3 | $Al_2O_3/SiO_2/AlN/SiO_2/Ta_2O_5/SiO_2/AlN/SiO_2/AlN/SiO_2$ | 4 | 315 | 808 |
| 9 | 8%±2% | 6 | 2 | $Ta_2O_5/SiO_2/Ta_2O_5/SiO_2/Ta_2O_5/SiO_2$ | 1 | 30 | 1310 |
| 10 | 8%±2% | 6 | 2 | $Ta_2O_5/Al_2O_3/Ta_2O_5/Al_2O_3/Ta_2O_5/Al_2O_3$ | 2 | 120 | 1550 |
| 11 | 8%±2% | 7 | 2 | $SiO_2/Ta_2O_5/SiO_2/Ta_2O_5/SiO_2/Ta_2O_5/SiO_2$ | 3 | 210 | 410 |
| 12 | 8%±2% | 7 | 3 | $AlN/Ta_2O_5/Al_2O_3/Ta_2O_5/Al_2O_3/Ta_2O_5/Al_2O_3$ | 4 | 300 | 650 |
| 13 | 8%±2% | 8 | 2 | $Ta_2O_5/SiO_2/Ta_2O_5/SiO_2/Ta_2O_5/SiO_2/Ta_2O_5/SiO_2$ | 1 | 15 | 980 |
| 14 | 8%±2% | 8 | 3 | $AlN/Ta_2O_5/SiO_2/Ta_2O_5/SiO_2/Ta_2O_5/SiO_2/Ta_2O_5$ | 2 | 105 | 808 |
| 15 | 8%±2% | 9 | 2 | $Ta_2O_5/Al_2O_3/Ta_2O_5/Al_2O_3/Ta_2O_5/Al_2O_3/Ta_2O_5/Al_2O_3/Ta_2O_5$ | 3 | 195 | 1310 |
| 16 | 8%±2% | 10 | 3 | $AlN/SiO_2/Ta_2O_5/SiO_2/Ta_2O_5/SiO2/Ta_2O_5/SiO_2/Ta_2O_5/SiO_2$ | 4 | 285 | 1550 |
| 17 | 12%±2% | 7 | 2 | $Ta_2O_5/SiO_2/Ta_2O_5/SiO_2/Ta_2O_5/SiO_2/Ta_2O_5$ | 1 | 75 | 980 |
| 18 | 16%±2% | 7 | 2 | $Ta_2O_5/SiO_2/Ta_2O_5/SiO_2/Ta_2O_5/SiO_2/Ta_2O_5$ | 2 | 165 | 980 |
| 19 | 20%±2% | 7 | 2 | $Ta_2O_5/SiO_2/Ta_2O_5/SiO_2/Ta_2O_5/SiO_2/Ta_2O_5$ | 3 | 255 | 980 |
| 20 | 24%±2% | 7 | 2 | $Ta_2O_5/SiO_2/Ta_2O_5/SiO_2/Ta_2O_5/SiO_2/Ta_2O_5$ | 4 | 345 | 980 |

FIG. 93

| PREFERRED EMBODIMENT | CENTER WAVELENGTH $\lambda_c$ (nm) | WAVELENGTH BANDWIDTH W (nm) | W/$\lambda_c$ | WAVELENGTH BANDWIDTH $W_r$ (nm) | FILM THICKNESS RATIO $t/t_r$ |
|---|---|---|---|---|---|
| 1 | 956 | 245 | 0.256 | 58 | 6.19 |
| | 981 | 252 | 0.257 | 60 | 6.20 |
| 2 | 871 | 183 | 0.210 | 54 | 5.93 |
| | 809 | 170 | 0.210 | 50 | 5.95 |
| 3 | 1250 | 267 | 0.216 | 77 | 5.94 |
| | 1311 | 281 | 0.214 | 81 | 5.95 |
| 4 | 1659 | 478 | 0.288 | 103 | 5.88 |
| | 1550 | 455 | 0.294 | 97 | 5.89 |
| 5 | 437 | 102 | 0.233 | 38 | 9.63 |
| | 410 | 95 | 0.224 | 36 | 9.55 |
| 6 | 683 | 106 | 0.155 | 42 | 7.70 |
| | 650 | 101 | 0.155 | 39 | 7.68 |
| 7 | 972 | 118 | 0.121 | 60 | 8.07 |
| | 980 | 118 | 0.120 | 60 | 8.07 |
| 8 | 843 | 100 | 0.119 | 52 | 7.78 |
| | 808 | 90 | 0.111 | 60 | 7.77 |
| 9 | 1284 | 450 | 0.356 | 89 | 9.02 |
| | 1310 | 459 | 0.350 | 91 | 9.00 |
| 10 | 1655 | 427 | 0.258 | 114 | 5.92 |
| | 1550 | 400 | 0.258 | 108 | 5.92 |
| 11 | 393 | 62 | 0.158 | 42 | 9.70 |
| | 410 | 65 | 0.159 | 44 | 9.61 |
| 12 | 652 | 115 | 0.176 | 45 | 9.95 |
| | 650 | 115 | 0.177 | 44 | 9.92 |
| 13 | 1032 | 195 | 0.189 | 71 | 6.17 |
| | 980 | 186 | 0.190 | 68 | 6.17 |
| 14 | 849 | 89 | 0.105 | 58 | 11.59 |
| | 808 | 84 | 0.104 | 56 | 11.58 |
| 15 | 1492 | 268 | 0.180 | 103 | 7.66 |
| | 1310 | 235 | 0.179 | 91 | 7.65 |
| 16 | 1597 | 125 | 0.078 | 110 | 12.14 |
| | 1550 | 121 | 0.078 | 108 | 12.11 |
| 17 | 1013 | 149 | 0.147 | 79 | 10.13 |
| | 980 | 145 | 0.148 | 77 | 10.12 |
| 18 | 1082 | 274 | 0.253 | 100 | 5.85 |
| | 980 | 247 | 0.252 | 90 | 5.86 |
| 19 | 1138 | 454 | 0.399 | 131 | 6.15 |
| | 980 | 392 | 0.400 | 113 | 6.16 |
| 20 | 1057 | 192 | 0.182 | 172 | 5.60 |
| | 981 | 179 | 0.182 | 159 | 5.60 |

SEMICONDUCTOR PHOTONIC DEVICE

BACKGROUND OF THE INVENTION

1. Field of the Invention

The present invention relates to a semiconductor photonic device including a semiconductor laser device for use as a light source for optical information processing, a signal source for optical communication and a pumping source for a fiber amplifier, a light emitting diode device, a semiconductor amplifier device, a semiconductor modulator and the like, and to a coating film for use in the semiconductor photonic device.

2. Description of the Background Art

In general, a coating film is formed on an end surface of a semiconductor photonic element in a semiconductor photonic device such as a semiconductor laser device and a light emitting diode device for purposes of protection and reflectivity adjustment. Conventionally, various studies have been done on the power reflectivity of such a coating film.

A technique for forming an anti-reflection coating film on an end surface of a semiconductor laser element is disclosed, for example, in: K. Shigihara et al., "Antireflection coating for laser diodes," ELECTRONICS LETTERS, 31 Aug. 1995, Vol. 31, No. 18, pp. 1574-1576; and Japanese Patent Application Laid-Open No. 5-243689 (1993). According to this technique, if a single-layer coating film having a refractive index $n_1$ and a thickness $d_1$ is formed on an end surface of a semiconductor laser having an effective refractive index $n_c$, the coating film becomes an anti-reflection film when the following conditions are satisfied: $n_1=n_c^{1/2}$ and $d_1=\lambda_0/(4 \cdot n_1)$, where $\lambda_0$ is the value of the lasing wavelength of the semiconductor laser. At this time, the magnitude of the reflection amplitude vector of the coating film is zero. The "reflection amplitude vector" used herein refers to the amplitude vector of a reflected wave obtained when the amplitude vector of an incident wave (referred to hereinafter as an "incident amplitude vector") is placed on the positive real axis in a complex plane and is defined to have a magnitude of "1." Thus, the reflection amplitude vector is a vector indicative of the position of an amplitude reflectivity in the complex plane.

A technique for improving the design flexibility of an anti-reflection coating film is disclosed in Japanese Patent Application Laid-Open No. 2004-88049.

A coating film having a power reflectivity greater than zero is disclosed in Japanese Patent Application Laid-Open No. 2004-289108. According to Japanese Patent Application Laid-Open No. 2004-289108, if the coating film is a single-layer film, the power reflectivity of the coating film takes on a relative minimum value not equal to zero when the following conditions are satisfied: $n_1 \neq n_c^{1/2}$ and $d_1=\lambda_0/(4 \cdot n_1) \times m$ (where m is an odd number). Thus, when $n_1 \neq n_c^{1/2}$ and the thickness of the coating film is an odd multiple of $\lambda_0/(4 \cdot n_1)$, the reflection amplitude vector of the coating film is present on the negative real axis in a complex plane. In this case, there is a phase difference of 180 degrees between the incident amplitude vector and the reflection amplitude vector. Then, the imaginary components of the incident and reflection amplitude vectors are equal to zero, and a difference between the real components of the vectors is equal to a power transmissivity. The value of the power reflectivity is obtained by subtracting the power transmissivity from one.

For designing the coating film having a power reflectivity greater than zero, the conventional techniques establish the condition that the thickness of the coating film is an odd multiple of $\lambda_0/(4 \cdot n_1)$ as described above to result in the reflection amplitude vector positioned on the real axis in the complex plane. It is hence necessary to determine the thickness of the coating film so that the amplitude reflectivity is a real number when designing the thickness of the coating film having the power reflectivity greater than zero. This results in a low degree of design flexibility of the thickness of the coating film, and creates a likelihood that the coating film having a desired characteristic is not designed.

SUMMARY OF THE INVENTION

It is an object of the present invention to provide a technique capable of improving the design flexibility of the thickness of a coating film provided on an end surface of a semiconductor photonic element.

A first aspect of the present invention is intended for a method of designing the thickness of a coating film including a plurality of layers and provided on an end surface of a semiconductor photonic element including an active layer through which light propagates. According to the present invention, the method includes the following steps (a) and (b). The step (a) is to select an imaginary number as a value of an amplitude reflectivity of the coating film. The step (b) is to determine the thickness of each of the plurality of layers of the coating film so that the value of the amplitude reflectivity of the coating film is equal to the imaginary number selected in the step (a).

According to a second aspect of the present invention, a semiconductor photonic device includes a semiconductor photonic element, and a coating film. The semiconductor photonic element includes an active layer through which light propagates. The coating film includes a plurality of layers and is provided on an end surface of the semiconductor photonic element. The coating film has an amplitude reflectivity taking on a value set at an imaginary value.

The use of the imaginary value as the value of the amplitude reflectivity of the coating film makes it possible to design the thickness of the coating film having a predetermined power reflectivity in consideration for more complex numbers having the same amplitude as the value of the amplitude reflectivity than real numbers when used. This improves the design flexibility of the thickness of the coating film to make the coating film having a desired characteristic easy to design.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a graph showing the wavelength dependence of the power reflectivity of a coating film according to the first preferred embodiment of the present invention;

FIG. 8 is a graph showing the wavelength dependence of the power reflectivity of the single-layer coating film;

FIG. 9 is a graph showing the wavelength dependence of the power reflectivity of the coating film according to the first preferred embodiment of the present invention;

FIG. 10 is a graph showing the wavelength dependence of the power reflectivity of the single-layer coating film;

FIG. 21 is a graph showing the wavelength dependence of the power reflectivity of a coating film according to the fourth preferred embodiment of the present invention;

FIG. 22 is a graph showing the wavelength dependence of the power reflectivity of the single-layer coating film;

FIG. 23 is a graph showing the wavelength dependence of the power reflectivity of the coating film according to the fourth preferred embodiment of the present invention;

FIG. 24 is a graph showing the wavelength dependence of the power reflectivity of the single-layer coating film;

FIG. 43 is a graph showing the wavelength dependence of the power reflectivity of the single-layer coating film;

FIG. 44 is a graph showing the wavelength dependence of the power reflectivity of a coating film according to a ninth preferred embodiment of the present invention;

FIG. 51 is a graph showing the wavelength dependence of the power reflectivity of the single-layer coating film;

FIG. 52 is a graph showing the wavelength dependence of the power reflectivity of a coating film according to an eleventh preferred embodiment of the present invention;

FIG. 67 is a graph showing the wavelength dependence of the power reflectivity of the single-layer coating film;

FIG. 68 is a graph showing the wavelength dependence of the power reflectivity of a coating film according to a fifteenth preferred embodiment of the present invention;

FIG. 87 is a graph showing the wavelength dependence of the power reflectivity of the single-layer coating film;

FIG. 88 is a graph showing the wavelength dependence of the power reflectivity of a coating film according to a twentieth preferred embodiment of the present invention;

FIG. 91 is a graph showing the wavelength dependence of the power reflectivity of the single-layer coating film; and FIGS. 92 and 93 are tables listing conditions and results according to the first to twentieth preferred embodiments of the present invention.

DESCRIPTION OF THE PREFERRED EMBODIMENTS

Figure 1:
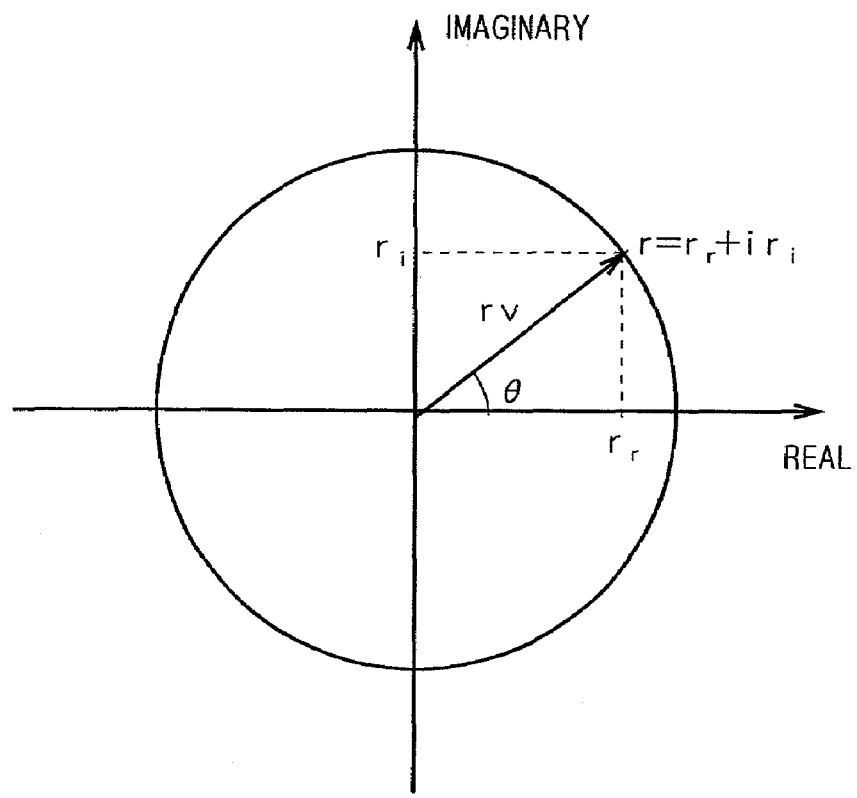
FIG. 1 shows the amplitude reflectivity of a coating film represented in a complex plane.

FIG. 1 shows that the amplitude reflectivity r of a coating film provided on an end surface of a semiconductor photonic element having an active layer, such as a semiconductor laser element, is represented in a complex plane. A phase angle θ in FIG. 1 is an angle formed by a positive real axis and a reflection amplitude vector rv, that is, a vector indicative of the position of the amplitude reflectivity r in the complex plane.

When the wavelength of light propagating through the active layer is denoted generally by λ, the amplitude reflectivity r for the light is expressed by $r=r_r(\lambda)+ir_i(\lambda)$ where $r_r(\lambda)$ and $r_i(\lambda)$ are the real part and the imaginary part, respectively, of the amplitude reflectivity r, is an imaginary unit, and $i^2=-1$.

For $\lambda=\lambda_0$, the amplitude reflectivity r equals zero and a power reflectivity R expressed by $|r|^2$ also equals zero when $r_r(\lambda)$ and $r_i(\lambda)$ satisfy $$r_r(\lambda_0)=0 \tag{1}$$

$$r_i(\lambda_0)=0 \tag{2}$$

Thus, an anti-reflection coating film is prepared by designing the coating film so that Equations (1) and (2) are satisfied.

Figure 2:
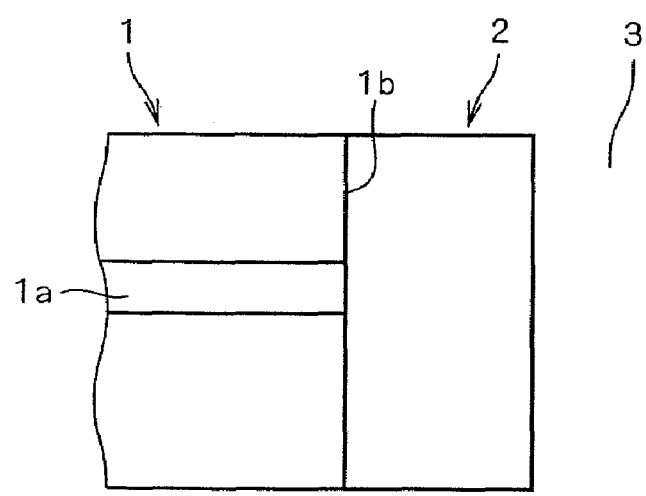
FIG. 2 is a side view showing a structure of a semiconductor photonic device having a single-layer coating film on an end surface of a semiconductor photonic element.

The above-mentioned method, however, cannot be employed for the preparation of a coating film having a power reflectivity R greater than zero, rather than the anti-reflection coating film. FIG. 2 is a side view showing a structure of a semiconductor photonic device having a single-layer coating film 2 provided on an end surface 1b of a semiconductor photonic element 1 including an active layer 1a. The power reflectivity R of the single-layer coating film 2 in contact with free space 3 filled with air or nitrogen as shown in FIG. 2 takes on a relative minimum value for the wavelength $\lambda=\lambda_0$ when the following equation is satisfied:

$$d_f = \frac{\lambda_0}{4n_f}(2m+1) \tag{3}$$

where $d_f$ is the thickness of the single-layer coating film 2, $n_f$ is the refractive index of the coating film 2, and m is a non-negative integer such as 0, 1 and 2. The amplitude reflectivity r at this time is expressed by:

$$r = \frac{n_c - n_f^2}{n_c + n_f^2} \tag{4}$$

where $n_c$ is the effective refractive index of the semiconductor photonic element 1.

Setting the thickness $d_f$ of the coating film 2 so that Equation (3) is satisfied causes the power reflectivity R to take on a relative minimum value of 4% for the wavelength $\lambda=\lambda_0$ when the effective refractive index $n_c$ of the semiconductor photonic element 1 is 3.37 and the refractive index $n_f$ of the coating film 2 is 2.248 or 1.499.

Figure 3:
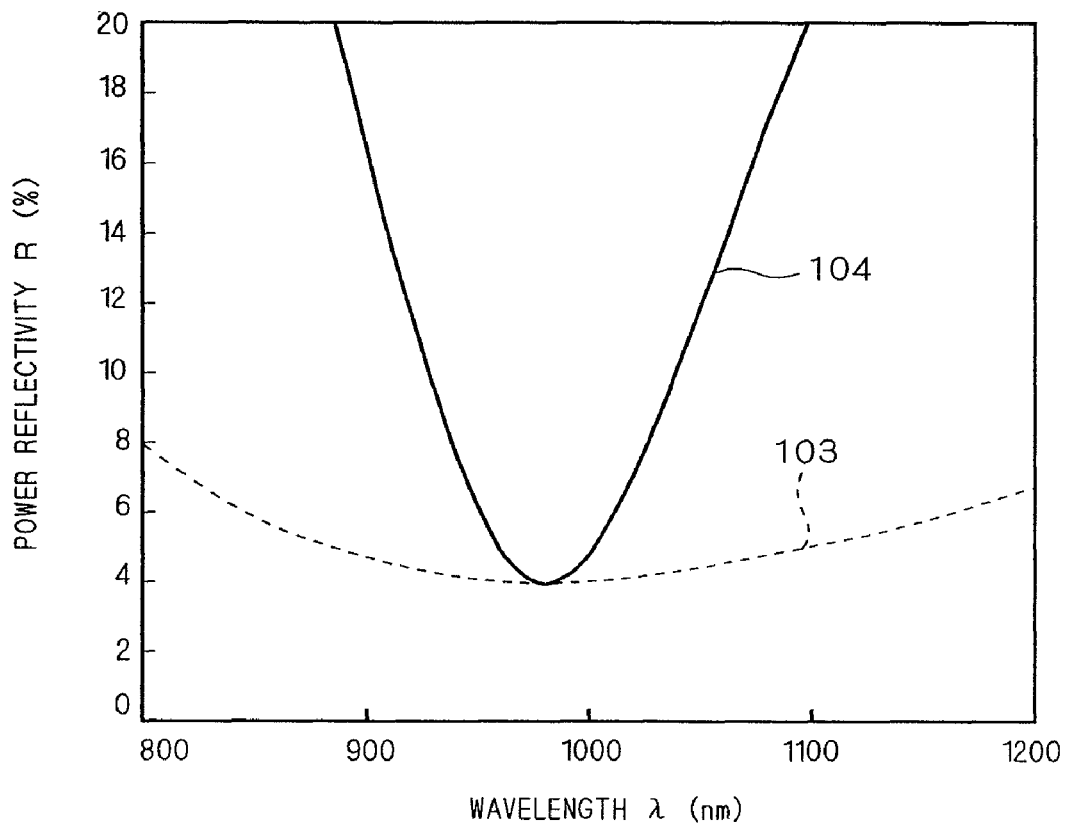
FIG. 3 is a graph showing the wavelength dependence of the power reflectivity of the single-layer coating film.

FIG. 3 is a graph showing the wavelength dependence of the power reflectivity R of the coating film 2 when $\lambda_0$=980 nm, $n_c$=3.37 and $n_f$=1.499 are set. In FIG. 3, a curve 103 is plotted for the thickness $d_f=\lambda_0/(4n_f)$=169.08 nm of the coating film 2, and a curve 104 is plotted for the thickness $d_f=5\lambda_0/(4n_f)$=845.41 nm.

As illustrated in FIG. 3, the power reflectivity R takes on a relative minimum value of 4% for the wavelength $\lambda$ of 980 nm, whether the thickness $d_f$ is set at $\lambda_0/(4n_f)$ or at $5\lambda_0/(4n_f)$. For the thickness $d_f$ set at $\lambda_0/(4n_f)$, the curve 103 shows that a wavelength band for which the power reflectivity R falls within ±2% from the relative minimum value of 4% is from 848 nm to 1161 nm to provide a wavelength bandwidth of 313 nm. For the thickness $d_f$ set at $5\lambda_0/(4n_f)$, the curve 104 shows that a wavelength band for which the power reflectivity R falls within ±2% from the relative minimum value of 4% is from 951 nm to 1011 nm to provide a wavelength bandwidth of 60 nm. The value obtained by dividing the wavelength bandwidth of 60 nm by 981 nm that is the median value of the wavelength band is approximately 0.06, which is a measure of the extent of the wavelength band. For the coating film 2 as shown in FIG. 2, as the thickness $d_f$ thereof is increased in increments of an odd multiple of $\lambda_0/(4n_f)$, the wavelength band for which the power reflectivity R falls within a predetermined range becomes narrower.

As discussed above, when the thickness $d_f$ of the coating film 2 is set at an odd multiple of $\lambda_0/(4n_f)$, the amplitude reflectivity r is a real number as will be understood from Equation (4) described above, and thus the reflection amplitude vector rv for the coating film 2 is present on the real axis. In other words, it is necessary to design the thickness of the coating film so that the reflection amplitude vector rv is positioned on the real axis. Thus, this method is low in the degree of design flexibility of the coating film, and sometimes cannot provide a desired characteristic.

The present invention employs an imaginary number, i.e. a complex number having a nonzero imaginary part, as the value of the amplitude reflectivity r to make it possible to design the thickness of the coating film having a predetermined power reflectivity R in consideration for various complex numbers having the same amplitude as the value of the amplitude reflectivity, thereby improving the design flexibility of the thickness of the coating film. The basic principle of the present invention will now be described by using the coating film having a two-layer structure as an example.

<Basic Principle of Present Invention>

Figure 4:
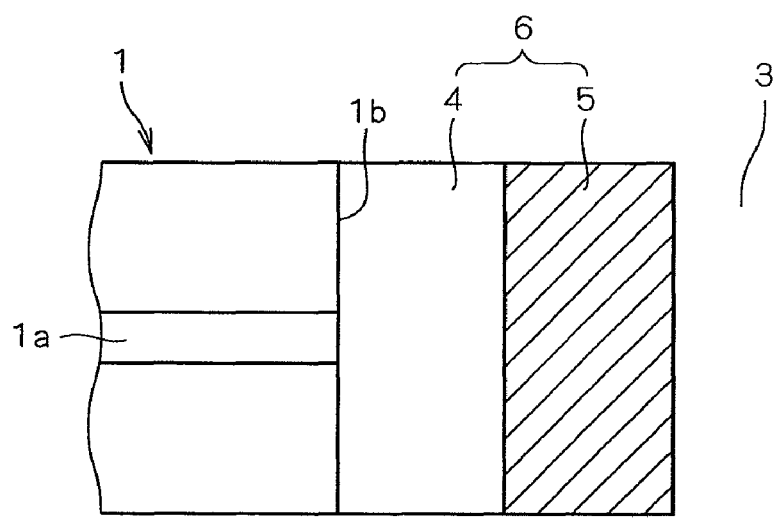
FIG. 4 is a side view showing a structure of a semiconductor photonic device according to the present invention.

FIG. 4 is a side view showing a structure of a semiconductor photonic device provided with a coating film 6 having a two-layer structure on the end surface 1b of the semiconductor photonic element 1. The semiconductor photonic device shown in FIG. 4 may be used as a semiconductor laser device, a light emitting diode device, a semiconductor amplifier device or a semiconductor modulator. As shown in FIG. 4, the semiconductor photonic element 1 has the active layer 1a which propagates light therethrough. When the semiconductor photonic element 1 is a semiconductor laser element, the light generated in the active layer 1a is repeatedly reflected from a pair of cladding layers (not shown) which hold the active layer 1a therebetween, whereby laser light is outputted from the semiconductor photonic element 1.

The coating film 6 includes a first layer film 4 having a refractive index $n_1$ and a thickness $d_1$, and a second layer film 5 having a refractive index $n_2$ and a thickness $d_2$. The first layer film 4 and the second layer film 5 are stacked in the order named on the end surface 1b of the semiconductor photonic element 1 including an end surface of the active layer 1a.

When the wavelength of light propagating through the active layer 1a is denoted generally by $\lambda$, the amount of phase change $\phi_1$ of light in the first layer film 4 and the amount of phase change $\phi_2$ of light in the second layer film 5 are expressed respectively as:

$$\phi_1 = \frac{2\pi}{\lambda} n_1 d_1 \tag{5a}$$

$$\phi_2 = \frac{2\pi}{\lambda} n_2 d_2 \tag{5b}$$

The amplitude reflectivity r in the complex plane is expressed as:

$$r = \frac{(m_{11} + m_{12})n_c - (m_{21} + m_{22})}{(m_{11} + m_{12})n_c + (m_{21} + m_{22})} \tag{6}$$

where $m_{11}$, $m_{12}$, $m_{21}$ and $m_{22}$ are elements of a characteristic matrix for the coating film 6, and satisfy the following determinant:

$$\begin{bmatrix} m_{11} & m_{12} \\ m_{21} & m_{22} \end{bmatrix} = \begin{bmatrix} \cos\phi_1 & -\frac{i}{n_1}\sin\phi_1 \\ -in_1\sin\phi_1 & \cos\phi_1 \end{bmatrix} \times \begin{bmatrix} \cos\phi_2 & -\frac{i}{n_2}\sin\phi_2 \\ -in_2\sin\phi_2 & \cos\phi_2 \end{bmatrix} \tag{7a}$$

Using Equation (7a), Equation (6) is rewritten as:

$$r = \frac{(n_c-1)\cos\phi_1\cos\phi_2 + \left(\frac{n_1}{n_2} - \frac{n_2 n_c}{n_1}\right)\sin\phi_1\sin\phi_2 - i\left\{\left(\frac{n_c}{n_2} - n_2\right)\cos\phi_1\sin\phi_2 + \left(\frac{n_c}{n_1} - n_1\right)\sin\phi_1\cos\phi_2\right\}}{(n_c+1)\cos\phi_1\cos\phi_2 - \left(\frac{n_2 n_c}{n_1} + \frac{n_1}{n_2}\right)\sin\phi_1\sin\phi_2 - i\left\{\left(\frac{n_c}{n_2} + n_2\right)\cos\phi_1\sin\phi_2 + \left(\frac{n_c}{n_1} + n_1\right)\sin\phi_1\cos\phi_2\right\}} \tag{6a}$$

Equation (6a) defines the amplitude reflectivity r by using the refractive indices $n_1$ and $n_2$ and the amounts of phase change $\phi_1$ and $\phi_2$ for the respective layers of the coating film 6, and the effective refractive index $n_c$ of the semiconductor photonic element 1. The amount of phase change $\phi_1$ is defined by the thickness $d_1$, the refractive index $n_1$ and the wavelength $\lambda$ of the light propagating through the active layer 1a according to Equation (5a). The amount of phase change $\phi_2$ is defined by the thickness $d_2$, the refractive index $n_2$ and the wavelength $\lambda$ according to Equation (5b). Therefore, it may be said that Equation (6) defines the amplitude reflectivity r based on the refractive indices $n_1$ and $n_2$, the effective refractive index $n_c$, the thicknesses $d_1$ and $d_2$, and the wavelength $\lambda$.

Because the magnitude |r| of the amplitude reflectivity r of the coating film 6 having the power reflectivity R=$R_t$ is equal to $R_t^{1/2}$, the amplitude reflectivity r is positioned on a circle with its center at the origin and with a radius equal to $R_t^{1/2}$. Thus, for designing the coating film 6 having the power reflectivity $R=R_t$ where $R_t$ is the design value of the power reflectivity R, it is necessary to set the position of the amplitude reflectivity r in the complex plan at any position lying on the circle with its center at the origin and with the radius equal to $R_t^{1/2}$. In other words, it is necessary to define the reflection amplitude vector rv as any vector with its initial point at the origin and with a magnitude equal to $R_t^{1/2}$. The design value $R_t$ of the power reflectivity R is referred to hereinafter as a "design reflectivity $R_t$."

In accordance with the above, the coating film 6 having the power reflectivity $R=R_t$ is designed by determining the amounts of phase change $\phi_1$ and $\phi_2$ so that the value of the amplitude reflectivity r in Equation (6a) equals a complex number positioned at any point lying on the circle with its center at the origin and with the radius equal to $R_t^{1/2}$ and then determining the thicknesses $d_1$ and $d_2$ of the respective layers of the coating film 6 using Equations (5a) and (5b). A method of determining the thicknesses $d_1$ and $d_2$ of the respective layers of the coating film 6 having the power reflectivity $R=R_t$ for the wavelength $\lambda=\lambda_t$ will be described below.

Figure 5:
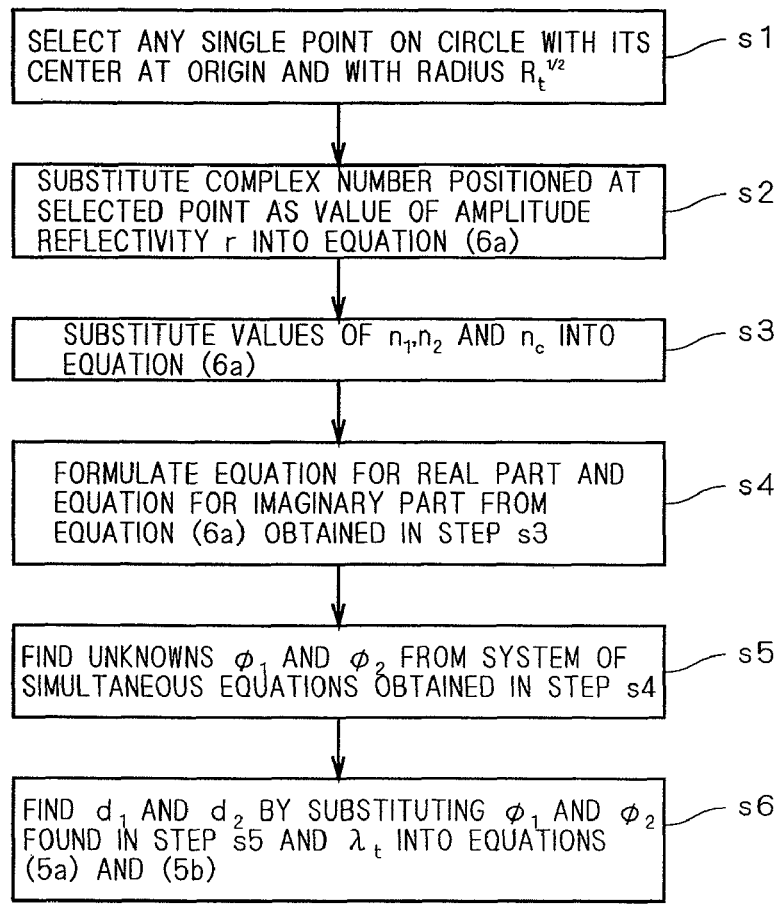
FIG. 5 is a flowchart showing a method of designing the thickness of a coating film according to the present invention.

FIG. 5 is a flowchart showing a method of designing the thickness of a coating film. As shown in FIG. 5, any single point lying on a circle with its center at the origin and with a radius equal to $R_t^{1/2}$ is selected in a complex plane in Step s1. In Step s2, a complex number positioned at the point selected in Step s1 is substituted as the value of the amplitude reflectivity r into Equation (6a). In Step s3, the refractive indices $n_1$ and $n_2$ of the respectively layers of the coating film 6 and the effective refractive index $n_c$ are substituted into Equation (6a). This provides Equation (6a) in which the amounts of phase change $\phi_1$ and $\phi_2$ are unknowns.

Next, the left-hand and right-hand sides of Equation (6a) obtained in Step s3 are decomposed into a real part and an imaginary part, and an equation for the real part and an equation for the imaginary part are formulated in Step s4. If the values on the left-hand and right-hand sides of Equation (6a) are, for example, a+ib and c+id respectively, the equation a=b and the equation c=d are formulated. This provides a system of two simultaneous equations with two unknowns. In Step s5, the values of the amounts of phase change $\phi_1$ and $\phi_2$ are found from the system of two simultaneous equations obtained in Step s4.

In Step s6, the thicknesses $d_1$ and $d_2$ are found by substituting the amounts of phase changes $\phi_1$ and $\phi_2$ found in Step s5 into Equations (5a) and (5b) respectively, and further substituting the design value $\lambda_t$ of the wavelength $\lambda$ into Equations (5a) and (5b). This determines the thicknesses $d_1$ and $d_2$ of the respective layers of the coating film 6. The design value $\lambda_t$ of the wavelength $\lambda$ is referred to hereinafter as a "design wavelength $\lambda_t$."

Thus, the coating film 6 which satisfies the power reflectivity $R=R_t$ for the wavelength $\lambda=\lambda_t$ is designed by substituting the complex number having the magnitude of $R_t^{1/2}$ as the value of the amplitude reflectivity r into Equation (6a) and then determining the thicknesses $d_1$ and $d_2$ using the equations obtained by the substitution.

If a real number is employed as the value of the amplitude reflectivity r as disclosed in Japanese Patent Application Laid-Open No. 2004-289108 described above, only a point on the positive real axis or a point on the negative real axis is selectable in Step s1. As a result, there are only two pairs of thicknesses $d_1$ and $d_2$ determined in Step s6. It is hence impossible to ensure a sufficient degree of design flexibility of the thickness of the coating film 6.

To solve such a problem, the present invention employs an imaginary number as the value of the amplitude reflectivity r for substitution into Equation (6a) to determine the thickness of each of the layers of the coating film 2 so that the value of the amplitude reflectivity r is an imaginary number. This allows the selection of any point on the circle with its center at the origin and with the radius equal to $R_t^{1/2}$ except the points on the real axis in Step s1, thereby to achieve the selection of more than two points. Thus, more complex numbers having the same magnitude can be substituted into Equation (6a) in Step s2, and more pairs of thicknesses $d_1$ and $d_2$ can be determined in Step s6. This improves the design flexibility of the thickness of the coating film 6 to make the coating film 6 having a desired characteristic easy to design.

First to twentieth preferred embodiments to be described below illustrate the characteristics of coating films designed using a film thickness designing method according to the present invention under various conditions established regarding a layer structure of the coating films and the like.

First Preferred Embodiment

Figure 6:
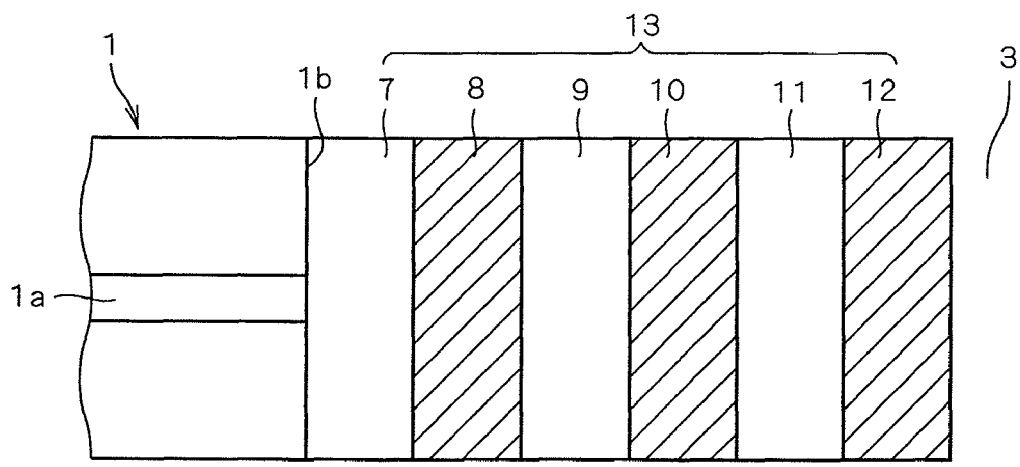
FIG. 6 is a side view showing a structure of the semiconductor photonic device according to a first preferred embodiment of the present invention.

FIG. 6 is a side view showing a structure of the semiconductor photonic device provided with a coating film 13 having a six-layer structure on the end surface 1b of the semiconductor photonic element 1. As illustrated in FIG. 6, the coating film 13 according to the first preferred embodiment of the present invention includes: a first layer film 7 having the refractive index $n_1$ and a thickness $Ad_1$; a second layer film 8 having the refractive index $n_2$ and a thickness $Ad_2$; a third layer film 9 having the refractive index $n_1$ and a thickness $Bd_1$; a fourth layer film 10 having the refractive index $n_2$ and a thickness $Bd_2$; a fifth layer film 11 having the refractive index $n_1$ and a thickness $Cd_1$; and a sixth layer film 12 having the refractive index $n_2$ and a thickness $Cd_2$.

Each of the first layer film 7, the third layer film 9 and the fifth layer film 11 is a tantalum oxide ($Ta_2O_5$) layer, and each of the second layer film 8, the fourth layer film 10 and the sixth layer film 12 is a silicon oxide ($SiO_2$) layer. Thus, the coating film 13 according to the first preferred embodiment is composed of two material layers: the tantalum oxide layer and the silicon oxide layer.

In the first preferred embodiment, the first and second layer films 7 and 8, the third and fourth layer films 9 and 10, and the fifth and sixth layer films 11 and 12 constitute unit layer pairs each composed of the tantalum oxide layer and the silicon oxide layer arranged in a stacked relation. In other words, the coating film 13 according to the first preferred embodiment includes three unit layer pairs each composed of the tantalum oxide layer and the silicon oxide layer arranged in a stacked relation. The reference characters A, B and C which determine the thicknesses of the respective layers of the coating film 13 designate parameters individually determined for the respective unit layer pairs and each indicating a contribution ratio of the thickness of a corresponding unit layer pair to the thickness of the entire coating film 13. The reference characters $d_1$ and $d_2$ according to the first preferred embodiment designate basic thicknesses individually determined for the respective material layers. Thus, the first preferred embodiment determines the thicknesses of the respective layers of the coating film 13 by multiplying the basic thicknesses by the parameters indicating the contribution ratios.

The amounts of phase change for the first to sixth layer films 7 to 12 are designated by $A\phi_1$, $A\phi_2$, $B\phi_1$, $B\phi_2$, $C\phi_1$ and $C\phi_2$, respectively, using Equations (5a) and (5b). The reference characters $\phi_1$ and $\phi_2$ according to the first preferred embodiment designate the basic amounts of phase change individually determined for the respective material layers. Therefore, the elements $m_{11}$, $m_{12}$, $m_{21}$ and $m_{22}$ of a characteristic matrix for the coating film 13 according to the first preferred embodiment satisfy the following determinant:

$$\begin{bmatrix} m_{11} & m_{12} \\ m_{21} & m_{22} \end{bmatrix} = \begin{bmatrix} \cos A\phi_1 & -\frac{i}{n_1}\sin A\phi_1 \\ -in_1\sin A\phi_1 & \cos A\phi_1 \end{bmatrix} \quad (7b)$$

$$\begin{bmatrix} \cos A\phi_2 & -\frac{i}{n_2}\sin A\phi_2 \\ -in_2\sin A\phi_2 & \cos A\phi_2 \end{bmatrix} \times$$

$$\begin{bmatrix} \cos B\phi_1 & -\frac{i}{n_1}\sin B\phi_1 \\ -in_1\sin B\phi_1 & \cos B\phi_1 \end{bmatrix} \begin{bmatrix} \cos B\phi_2 & -\frac{i}{n_2}\sin B\phi_2 \\ -in_2\sin B\phi_2 & \cos B\phi_2 \end{bmatrix} \times$$

$$\begin{bmatrix} \cos C\phi_1 & -\frac{i}{n_1}\sin C\phi_1 \\ -in_1\sin C\phi_1 & \cos C\phi_1 \end{bmatrix} \begin{bmatrix} \cos C\phi_2 & -\frac{i}{n_2}\sin C\phi_2 \\ -in_2\sin C\phi_2 & \cos C\phi_2 \end{bmatrix}$$

For designing the thickness of the coating film 13 so that the value of the amplitude reflectivity r is an imaginary number, the first preferred embodiment previously determines the values of the parameters A to C, and executes Steps s1 to s5 using Equations (6) and (7b) described above to determine the values of the basic amounts of phase change $\phi_1$ and $\phi_2$. Thereafter, Step s6 is executed to determine the values of the basic thicknesses $d_1$ and $d_2$, and the thicknesses of the respective layers of the coating film 13 are determined using the previously determined values of the parameters A to C and the values of the basic thicknesses $d_1$ and $d_2$ determined in Step s6. If the designed characteristic of the coating film 13 is insufficient, the basic thicknesses $d_1$ and $d_2$ are determined again by changing the parameters A to C, and the thicknesses of the respective layers of the coating film 13 are designed again.

In the first preferred embodiment, the effective refractive index $n_c$ of the semiconductor photonic element 1 is "3.37." The refractive index $n_1$ is "2.057" which is greater than $n_c^{1/2}$ (=1.84), and the refractive index $n_2$ is "1.480" which is less than $n_c^{1/2}$. The design wavelength $\lambda_t$ is 980 nm.

For designing the thickness of the coating film 13 having the power reflectivity R of 4% ($R_t$=4%) when the wavelength $\lambda$ equals the design wavelength of 980 nm under the above-mentioned conditions, a point which provides a phase angle $\theta$ of 60 degrees is selected, for example, in Step s1 so that the reflection amplitude vector rv is located in the first quadrant (or the upper right quadrant) of the complex plane. Then, because the magnitude of the complex number at the selected point is 0.2, the values of the real and imaginary parts $r_r$ and $r_i$ of the complex number inputted as the value of the amplitude reflectivity r are "+0.1" and "+0.17320508," respectively, in Step s2.

When A=1.22, B=1.84 and C=2.19 are set, the basic amounts of phase change $\phi_1$ and $\phi_2$ determined in Step s5 are "1.3449" and "0.463002," respectively. Accordingly, the thicknesses of the first to sixth layer films 7 to 12 determined in Step s6 are 124.41 nm, 59.53 nm, 187.64 nm, 89.78 nm, 223.33 nm and 106.86 nm, respectively.

FIG. 7 shows the wavelength dependence of the power reflectivity R of the coating film 13 thus designed, that is, how the power reflectivity R changes as the wavelength $\lambda$ is hypothetically changed. As illustrated in FIG. 7, the power reflectivity R is 4% when the wavelength $\lambda$ equals the design wavelength of 980 nm. A wavelength band for which the power reflectivity R is approximately equal to the design reflectivity of 4% is wide. The power reflectivity R falls within a range from 3.3% to 6.0% for the wavelength $\lambda$ ranging from 833 nm to 1078 nm.

When the allowable range of the power reflectivity R (referred to hereinafter as an "allowable reflectivity range") is, for example, ±2% from the design reflectivity of 4%, the wavelength band for which the power reflectivity R falls within the allowable reflectivity range is also from 833 nm to 1078 nm, to provide a wavelength bandwidth W of 245 nm. The center wavelength $\lambda_c$ of the wavelength band is 956 nm. The value obtained by dividing the wavelength bandwidth W by the center wavelength $\lambda_c$ is approximately 0.256, which is a measure of the extent of the wavelength band. This value is greater than 0.06, and is also sufficiently greater than that obtained when the above-mentioned coating film 2 having the characteristic indicated by the curve 103 of FIG. 3 is provided on the end surface 1b of the semiconductor photonic element 1. Therefore, it may be said that the wavelength band for which the power reflectivity R falls within the allowable reflectivity range is a wide band.

If the value of the center wavelength $\lambda_c$ has a decimal part, the value of the center wavelength $\lambda_c$ is herein rounded to the nearest whole number. The same is true for a value $t_r$ to be described later which is a quarter of the center wavelength $\lambda_c$.

Because the thicknesses of the first to sixth layer films 7 to 12 take on the above-mentioned values, the optical thickness t of the coating film 13, i.e. the sum of the products of the refractive indices and thicknesses of the respective layers of the coating film 13, is 1480.41 nm. This value is approximately 6.19 times the value $t_r$ (239 nm) which is a quarter of the center wavelength $\lambda_c$, and is sufficiently greater than $3\lambda_c/4$. Thus, the coating film 13 is a very thick film. This improves heat dissipation characteristics at the end surface 1b of the semiconductor photonic element 1 to suppress the increase in temperature of the end surface 1b.

The semiconductor photonic device shown in FIG. 2 will be considered for comparison with the semiconductor photonic device of the first preferred embodiment. For the semiconductor photonic device shown in FIG. 2, the power reflectivity R takes on a relative minimum value of 4% for the wavelength $\lambda$ equal to $\lambda_c$ (956 nm) when the coating film 2 having a refractive index $n_f$ of "1.4989" and a thickness $d_f$ of five times 159.45 nm, i.e. five times $\lambda_c/(4n_f)$, is provided on the end surface 1b of the semiconductor photonic element 1. FIG. 8 shows the wavelength dependence of the power reflectivity R in this case. As illustrated in FIG. 8, the wavelength band for which the power reflectivity R falls within ±2% from the design reflectivity of 4% is from 928 nm to 986 nm, to provide a wavelength bandwidth $W_r$ of 58 nm.

The above-mentioned value "1.4989" of the refractive index $n_f$ is obtained by substituting $R_t$=0.04 and $n_c$=3.37 into $$R_t = ((n_c - n_f^2)/(n_c + n_f^2))^2 \quad (8)$$

As described above, the wavelength bandwidth W (245 nm) for the coating film 13 of the first preferred embodiment is greater than the wavelength bandwidth $W_r$ (58 nm) for the coating film 2 shown in FIG. 2. It may be said that the wavelength band for the coating film 13 is a wide band.

In general, the wavelength $\lambda$ of light propagating through the active layer 1a is sometimes varied from the design wavelength $\lambda_t$ depending on temperature change and the like. To obtain stable characteristics of the semiconductor photonic device even if the wavelength $\lambda$ is varied, it is desirable that the center wavelength $\lambda_c$ of the wavelength band for which the power reflectivity R falls within the allowable reflectivity range be equal to or close to the design wavelength $\lambda_t$. For example, the center wavelength $\lambda_c$ takes on a value close to the design wavelength $\lambda_t$ of 980 nm when the thickness of the coating film 13 is determined using the basic thicknesses $d_1$ and $d_2$ obtained by setting the basic amounts of phase change $\phi_1$ and $\phi_2$ at "1.3449" and "0.463002," respectively, in a similar manner to the above instance and substituting 1006 nm, rather than the design wavelength $\lambda_t$, for $\lambda$ in Equations (5a) and (5b). FIG. 9 shows the wavelength dependence of the power reflectivity R in this case.

As illustrated in FIG. 9, the power reflectivity R falls within a range from 3.3% to 6.0% for the wavelength $\lambda$ ranging from 855 nm to 1107 nm. The wavelength band for which the power reflectivity R falls within ±2% from the design reflectivity of 4% is also from 855 nm to 1107 nm, to provide a wavelength bandwidth W of 252 nm. The center wavelength $\lambda_c$ of the wavelength band is 981 nm, which is very close to the design wavelength of 980 nm. The value obtained by dividing the wavelength bandwidth W (252 nm) by the center wavelength $\lambda_c$ (981 nm) is approximately 0.257, which is greater than 0.06 and shows that the wavelength band for which the power reflectivity R falls within the allowable reflectivity range is a wide band.

In this case, the thicknesses of the first to sixth layer films 7 to 12 of the coating film 13 are 127.71 nm, 61.11 nm, 192.63 nm, 92.16 nm, 229.26 nm and 109.69 nm, respectively. The optical thickness t of the coating film 13, i.e. the sum of the products of the refractive indices and thicknesses of the respective layers of the coating film 13, is 1519.69 nm. This value is approximately 6.20 times the value $t_r$ (245 nm) which is a quarter of the center wavelength $\lambda_c$. Thus, the coating film 13 is a very thick film. This improves heat dissipation characteristics at the end surface 1b of the semiconductor photonic element 1 to suppress the increase in temperature of the end surface 1b.

The semiconductor photonic device shown in FIG. 2 will be considered for comparison with the semiconductor photonic device including the coating film 13 having the characteristics shown in FIG. 9. For the semiconductor photonic device shown in FIG. 2, the power reflectivity R takes on a relative minimum value of 4% for the wavelength $\lambda$ equal to $\lambda_c$ (981 nm) when the coating film 2 having the above-mentioned refractive index $n_f$ of "1.4989" and a thickness $d_f$ of five times 163.62 nm, i.e. five times $\lambda_c/(4n_f)$, is provided on the end surface 1b of the semiconductor photonic element 1. FIG. 10 shows the wavelength dependence of the power reflectivity R in this case. As illustrated in FIG. 10, the wavelength band for which the power reflectivity R falls within ±2% from the design reflectivity of 4% is from 951 nm to 1011 nm, to provide a wavelength bandwidth $W_r$ of 60 nm.

Thus, even when the center wavelength $\lambda_c$ is made closer to the design wavelength $\lambda_t$, the wavelength bandwidth W (252 nm) for the coating film 13 is greater than the wavelength bandwidth $W_r$ (60 nm) for the coating film 2 shown in FIG. 2.

Although the center wavelength $\lambda_c$ is close to the design wavelength $\lambda_t$ in the above instance, the center wavelength $\lambda_c$ may be made exactly equal to the design wavelength $\lambda_t$ by adjusting the values of the parameters A to C or the value substituted for $\lambda$ in Equations (5a) and (5b).

If the coating film 13 is absent on the end surface 1b of the semiconductor photonic element 1, the value of the power reflectivity R on the end surface 1b is approximately 29.4%. This value is defined by the effective refractive index $n_c$ (3.37) of the semiconductor photonic element 1 and a refractive index in the free space 3, and is calculated as $((3.37-1)/(3.37+1))^2$ assuming that the refractive index in the free space 3 is "1."

As illustrated in FIG. 7, the power reflectivity R is 4% when the wavelength $\lambda$ is equal to the design wavelength $\lambda_t$. Therefore, when the wavelength $\lambda$ takes on the same value as the design wavelength $\lambda_t$, the power reflectivity R for the semiconductor photonic device of the first preferred embodiment is lower than the power reflectivity R on the end surface 1b obtained when the coating film 13 is absent on the end surface 1b of the semiconductor photonic element 1.

Second Preferred Embodiment

Figure 11:
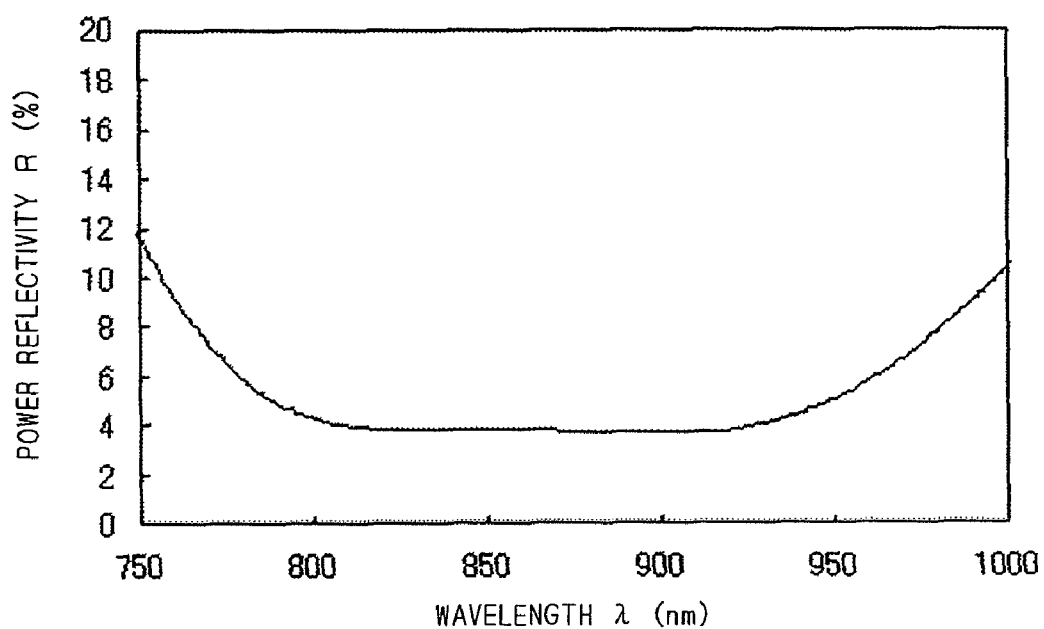
FIG. 11 is a graph showing the wavelength dependence of the power reflectivity of a coating film according to a second preferred embodiment of the present invention.

FIG. 11 shows the wavelength dependence of the power reflectivity R of the coating film 13 in the semiconductor photonic device according to the second preferred embodiment of the present invention. The semiconductor photonic device according to the second preferred embodiment is similar to the semiconductor photonic device according to the first preferred embodiment except that an alumina ($Al_2O_3$) layer is employed in place of the silicon oxide layer as the material layer for the second, fourth and sixth layer films 8, 10 and 12 of the coating film 13. Thus, the coating film 13 according to the second preferred embodiment is composed of two material layers: the tantalum oxide layer and the alumina layer.

Because the alumina layer is employed in place of the silicon oxide layer, the refractive index $n_2$ according to the second preferred embodiment is "1.620." The design wavelength $\lambda_t$ is set at 808 nm according to the second preferred embodiment.

For designing the thickness of the coating film 13 having the power reflectivity R of 4% ($R_t$=4%) when the wavelength $\lambda$ equals the design wavelength of 808 nm in the semiconductor photonic device as mentioned above, a point which provides a phase angle $\theta$ of 150 degrees is selected, for example, in Step s1 so that the reflection amplitude vector rv is located in the second quadrant (or the upper left quadrant) of the complex plane. Then, the values of the real and imaginary parts $r_r$ and $r_i$ of the complex number inputted as the value of the amplitude reflectivity r are "−0.17320508" and "+0.1," respectively, in Step s2.

When A=2.15, B=2.00 and C=2.00 are set, the basic amounts of phase change $\phi_1$ and $\phi_2$ determined in Step s5 are "0.587068" and "1.04832," respectively. Accordingly, the thicknesses of the first to sixth layer films 7 to 12 determined in Step s6 are 78.91 nm, 178.92 nm, 73.40 nm, 166.43 nm, 73.40 nm and 166.43 nm, respectively.

FIG. 11 shows the wavelength dependence of the power reflectivity R of the coating film 13 thus designed. As illustrated in FIG. 11, the power reflectivity R is 4% when the wavelength $\lambda$ equals the design wavelength of 808 nm. The wavelength band for which the power reflectivity R is approximately equal to the design reflectivity of 4% is wide. The power reflectivity R falls within a range from 3.6% to 6.0% for the wavelength $\lambda$ ranging from 779 nm to 962 nm.

When the allowable reflectivity range is, for example, ±2% from the design reflectivity of 4%, the wavelength band for which the power reflectivity R falls within the allowable reflectivity range is also from 779 nm to 962 nm, to provide a wavelength bandwidth W of 183 nm. The center wavelength $\lambda_c$ of the wavelength band is 871 nm. The value obtained by dividing the wavelength bandwidth W by the center wavelength $\lambda_c$ is approximately 0.210, which is greater than 0.06. It may be said that the wavelength band for which the power reflectivity R falls within the allowable reflectivity range is a wide band.

Because the thicknesses of the first to sixth layer films 7 to 12 take on the above-mentioned values, the optical thickness t of the coating film 13, i.e. the sum of the products of the refractive indices and thicknesses of the respective layers of the coating film 13, is 1293.37 nm. This value is approximately 5.93 times the value $t_r$ (218 nm) which is a quarter of the center wavelength $\lambda_c$, and is sufficiently greater than $3\lambda_c/4$. Thus, the coating film 13 is a very thick film. This improves heat dissipation characteristics at the end surface 1b of the semiconductor photonic element 1 to suppress the increase in temperature of the end surface 1b.

Figure 12:
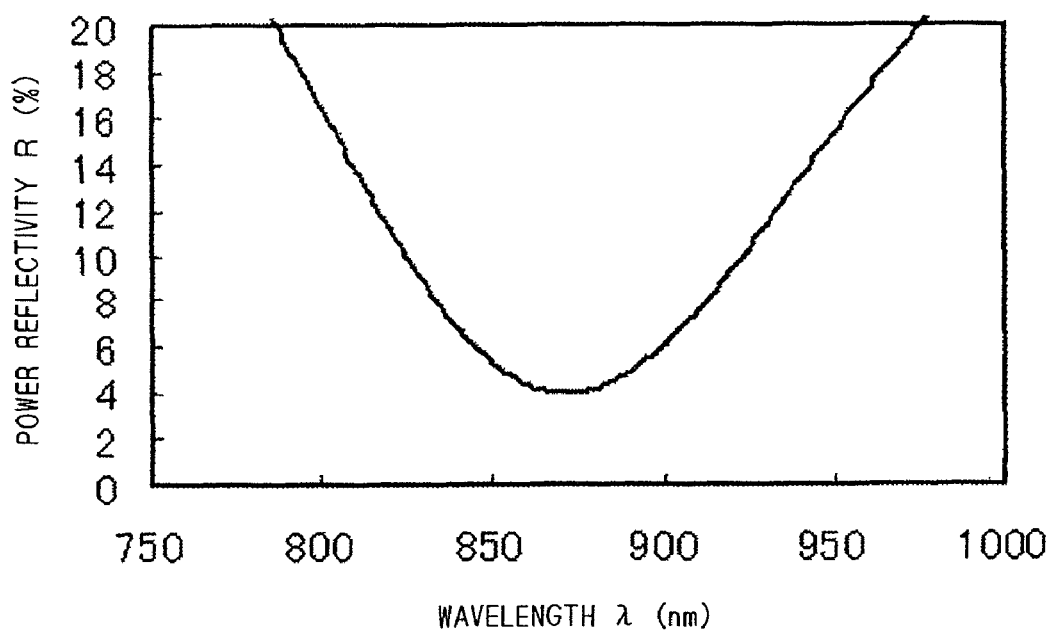
FIG. 12 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R takes on a relative minimum value of 4% for the wavelength $\lambda$ equal to $\lambda_c$ (871 nm) when the coating film 2 having the refractive index $n_f$ of "1.4989" as in the first preferred embodiment and a thickness $d_f$ of five times 145.27 nm, i.e. five times $\lambda_c/(4n_f)$, is provided on the end surface 1b of the semiconductor photonic element 1. FIG. 12 shows the wavelength dependence of the power reflectivity R in this case. As illustrated in FIG. 12, the wavelength band for which the power reflectivity R falls within ±2% from the design reflectivity of 4% is from 845 nm to 899 nm, to provide a wavelength bandwidth $W_r$ of 54 nm.

Thus, the wavelength bandwidth W (183 nm) for the coating film 13 of the second preferred embodiment is greater than the wavelength bandwidth $W_r$ (54 nm) for the coating film 2 shown in FIG. 2.

Figure 13:
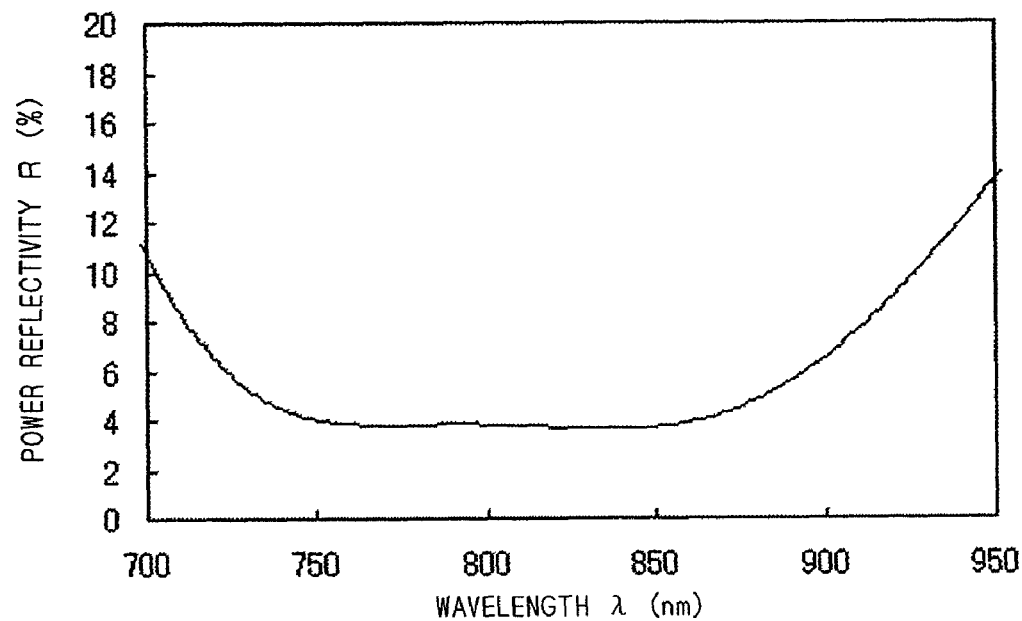
FIG. 13 is a graph showing the wavelength dependence of the power reflectivity of the coating film according to the second preferred embodiment of the present invention.

As mentioned above, because the wavelength $\lambda$ of light propagating through the active layer 1a is sometimes varied, it is desirable that the center wavelength $\lambda_c$ of the wavelength band for which the power reflectivity R falls within the allowable reflectivity range be equal to or close to the design wavelength $\lambda_t$. For example, the center wavelength $\lambda_c$ takes on a value close to the design wavelength $\lambda_t$ of 808 nm when the thickness of the coating film 13 is determined using the basic thicknesses $d_1$ and $d_2$ obtained by setting the basic amounts of phase change $\phi_1$ and $\phi_2$ at "0.587068" and "1.04832," respectively, in a similar manner to the above instance and substituting 751 nm, rather than the design wavelength $\lambda_t$, for $\lambda$ in Equations (5a) and (5b). FIG. 13 shows the wavelength dependence of the power reflectivity R in this case.

As illustrated in FIG. 13, the power reflectivity R falls within a range from 3.3% to 6.0% for the wavelength $\lambda$ ranging from 724 nm to 894 nm. The wavelength band for which the power reflectivity R falls within ±2% from the design reflectivity of 4% is also from 724 nm to 894 nm, to provide a wavelength bandwidth W of 170 nm. The center wavelength $\lambda_c$ of the wavelength band is 809 nm, which is very close to the design wavelength of 808 nm. The value obtained by dividing the wavelength bandwidth W (170 nm) by the center wavelength $\lambda_c$ (809 nm) is approximately 0.210, which is greater than 0.06 and shows that the wavelength band for which the power reflectivity R falls within the allowable reflectivity range is a wide band.

In this case, the thicknesses of the first to sixth layer films 7 to 12 of the coating film 13 are 73.34 nm, 166.29 nm, 68.23 nm, 154.69 nm, 68.23 nm and 154.69 nm, respectively. The optical thickness t of the coating film 13, i.e. the sum of the products of the refractive indices and thicknesses of the respective layers of the coating film 13, is 1202.14 nm. This value is approximately 5.95 times the value $t_r$ (202 nm) which is a quarter of the center wavelength $\lambda_c$. Thus, the coating film 13 is a very thick film.

Figure 14:
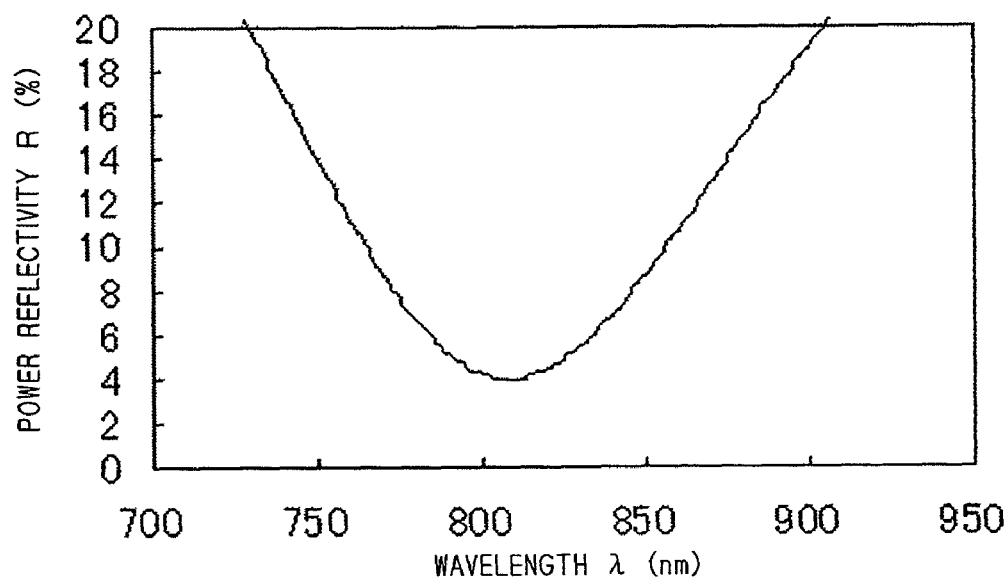
FIG. 14 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 4% for the wavelength $\lambda$ equal to $\lambda_c$ (809 nm) when the coating film 2 having the above-mentioned refractive index $n_f$ of "1.4989" and a thickness $d_f$ of five times 134.93 nm, i.e. five times $\lambda_c/(4n_f)$, is provided on the end surface 1b of the semiconductor photonic element 1. FIG. 14 shows the wavelength dependence of the power reflectivity R in this case. As illustrated in FIG. 14, the wavelength band for which the power reflectivity R falls within ±2% from the design reflectivity of 4% is from 784 nm to 834 nm, to provide a wavelength bandwidth $W_r$ of 50 nm.

Thus, even when the center wavelength $\lambda_c$ is made closer to the design wavelength $\lambda_t$, the wavelength bandwidth W (170 nm) for the coating film 13 is greater than the wavelength bandwidth $W_r$ (50 nm) for the coating film 2 shown in FIG. 2.

Although the center wavelength $\lambda_c$ is close to the design wavelength $\lambda_t$ in the above instance, the center wavelength $\lambda_c$ may be made exactly equal to the design wavelength $\lambda_t$ by adjusting the values of the parameters A to C or the value substituted for $\lambda$ in Equations (5a) and (5b), as in the first preferred embodiment.

Third Preferred Embodiment

Figure 15:
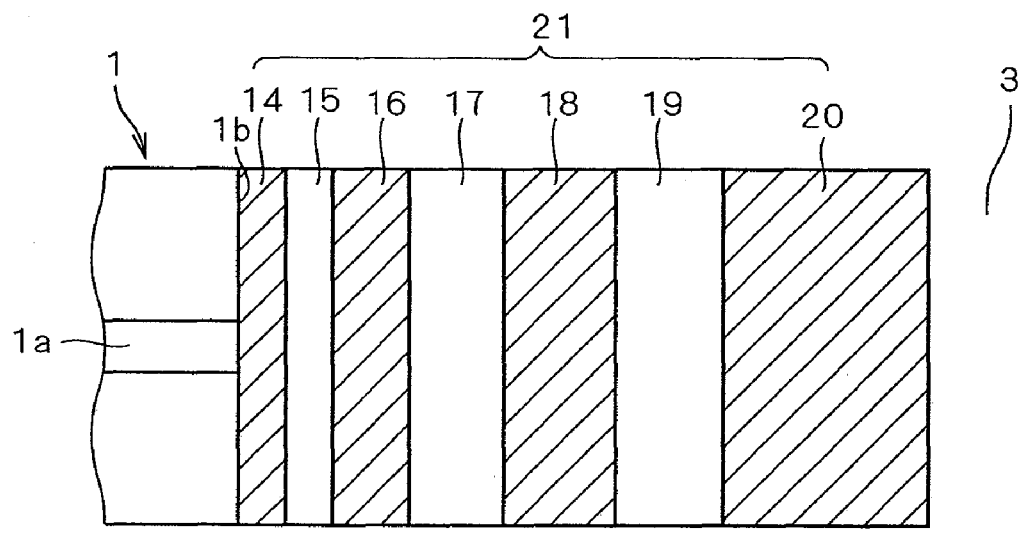
FIG. 15 is a side view showing a structure of the semiconductor photonic device according to a third preferred embodiment of the present invention.

FIG. 15 is a side view showing a structure of the semiconductor photonic device according to the third preferred embodiment of the present invention. A coating film 21 having a seven-layer structure is provided on the end surface 1b of the semiconductor photonic element 1 in the third preferred embodiment.

As illustrated in FIG. 15, the coating film 21 according to the third preferred embodiment of the present invention includes: a first layer film 14 having the refractive index $n_2$ and a thickness $Od_2$; a second layer film 15 having the refractive index $n_1$ and the thickness $Ad_1$; a third layer film 16 having the refractive index $n_2$ and the thickness $Ad_2$; a fourth layer film 17 having the refractive index $n_1$ and the thickness $Bd_1$; a fifth layer film 18 having the refractive index $n_2$ and the thickness $Bd_2$; a sixth layer film 19 having the refractive index $n_1$ and the thickness $Cd_1$; and a seventh layer film 20 having the refractive index $n_2$ and the thickness $Cd_2$.

Each of the first layer film 14, the third layer film 16, the fifth layer film 18 and the seventh layer film 20 is an alumina layer, and each of the second layer film 15, the fourth layer film 17 and the sixth layer film 19 is a tantalum oxide layer. Thus, the coating film 21 according to the third preferred embodiment is composed of two material layers: the alumina layer and the tantalum oxide layer.

In the third preferred embodiment, the second and third layer films 15 and 16, the fourth and fifth layer films 17 and 18, and the sixth and seventh layer films 19 and 20 constitute unit layer pairs each composed of the alumina layer and the tantalum oxide layer arranged in a stacked relation. The reference characters A, B and C which determine the thicknesses of the second to seventh layer films 15 to 20 of the coating film 21 designate parameters individually determined for the respective unit layer pairs and each indicating a contribution ratio of the thickness of a corresponding unit layer pair to the thickness of the entire coating film 21. The reference character O which determines the thickness of the first layer film 14 designates a parameter indicating a contribution ratio of the thickness of the first layer film 14 to the thickness of the entire coating film 21. The reference characters $d_1$ and $d_2$ according to the third preferred embodiment also designate basic thicknesses individually determined for the respective material layers.

The amounts of phase change for the first to seventh layer films 14 to 20 are designated by $O\phi_2$, $A\phi_1$, $A\phi_2$, $B\phi_1$, $B\phi_2$, $C\phi_1$ and $C\phi_2$, respectively, using Equations (5a) and (5b). Therefore, the elements $m_{11}$, $m_{12}$, $m_{21}$ and $m_{22}$ of a characteristic matrix for the coating film 21 according to the third preferred embodiment satisfy the following determinant:

$$\begin{bmatrix} m_{11} & m_{12} \\ m_{21} & m_{22} \end{bmatrix} = \begin{bmatrix} \cos O\phi_2 & -\frac{i}{n_2}\sin O\phi_2 \\ -in_2\sin O\phi_2 & \cos O\phi_2 \end{bmatrix} \times \quad (7c)$$

$$\begin{bmatrix} \cos A\phi_1 & -\frac{i}{n_1}\sin A\phi_1 \\ -in_1\sin A\phi_1 & \cos A\phi_1 \end{bmatrix} \begin{bmatrix} \cos A\phi_2 & -\frac{i}{n_2}\sin A\phi_2 \\ -in_2\sin A\phi_2 & \cos A\phi_2 \end{bmatrix} \times$$

$$\begin{bmatrix} \cos B\phi_1 & -\frac{i}{n_1}\sin B\phi_1 \\ -in_1\sin B\phi_1 & \cos B\phi_1 \end{bmatrix} \begin{bmatrix} \cos B\phi_2 & -\frac{i}{n_2}\sin B\phi_2 \\ -in_2\sin B\phi_2 & \cos B\phi_2 \end{bmatrix} \times$$

$$\begin{bmatrix} \cos C\phi_1 & -\frac{i}{n_1}\sin C\phi_1 \\ -in_1\sin C\phi_1 & \cos C\phi_1 \end{bmatrix} \begin{bmatrix} \cos C\phi_2 & -\frac{i}{n_2}\sin C\phi_2 \\ -in_2\sin C\phi_2 & \cos C\phi_2 \end{bmatrix}$$

For designing the thickness of the coating film 21 so that the value of the amplitude reflectivity r is an imaginary number, the third preferred embodiment previously determines the values of the parameters A, B, C and O, and executes Steps s1 to s5 using Equations (6) and (7c) described above to determine the values of the basic amounts of phase change $\phi_1$ and $\phi_2$. Thereafter, Step s6 is executed to determine the values of the basic thicknesses $d_1$ and $d_2$, and the thicknesses of the respective layers of the coating film 21 are determined using the previously determined values of the parameters A, B, C and O and the values of the basic thicknesses $d_1$ and $d_2$ determined in Step s6. If the designed characteristic of the coating film 21 is insufficient, the basic thicknesses $d_1$ and $d_2$ are determined again by changing the parameters A, B, C and O, and the thickness of the coating film 21 is designed again.

In the third preferred embodiment, the effective refractive index $n_1$ of the semiconductor photonic element 1 is "3.37." The refractive indices $n_1$ and $n_2$ are "2.057" and "1.620," respectively. The design wavelength $\lambda_t$ is 1310 nm.

For designing the thickness of the coating film 21 having the power reflectivity R of 4% ($R_t$=4%) when the wavelength $\lambda$ equals the design wavelength of 1310 nm under the above-mentioned conditions, a point which provides a phase angle θ of 225 degrees is selected, for example, in Step s1 so that the reflection amplitude vector rv is located in the third quadrant (or the lower left quadrant) of the complex plane. Then, the values of the real and imaginary parts $r_r$ and $r_i$ of the complex number inputted as the value of the amplitude reflectivity r are "−0.141421356" and "−0.141421356," respectively, in Step s2.

When O=0.10, A=1.80, B=2.00 and C=2.00 are set, the basic amounts of phase change $\phi_1$ and $\phi_2$ determined in Step s5 are "0.992102" and "0.536659," respectively. Accordingly, the thicknesses of the first to seventh layer films 14 to 20 determined in Step s6 are 6.91 nm, 181.00 nm, 124.32 nm, 201.12 nm, 138.14 nm, 201.12 nm and 138.14 nm, respectively.

Figure 16:
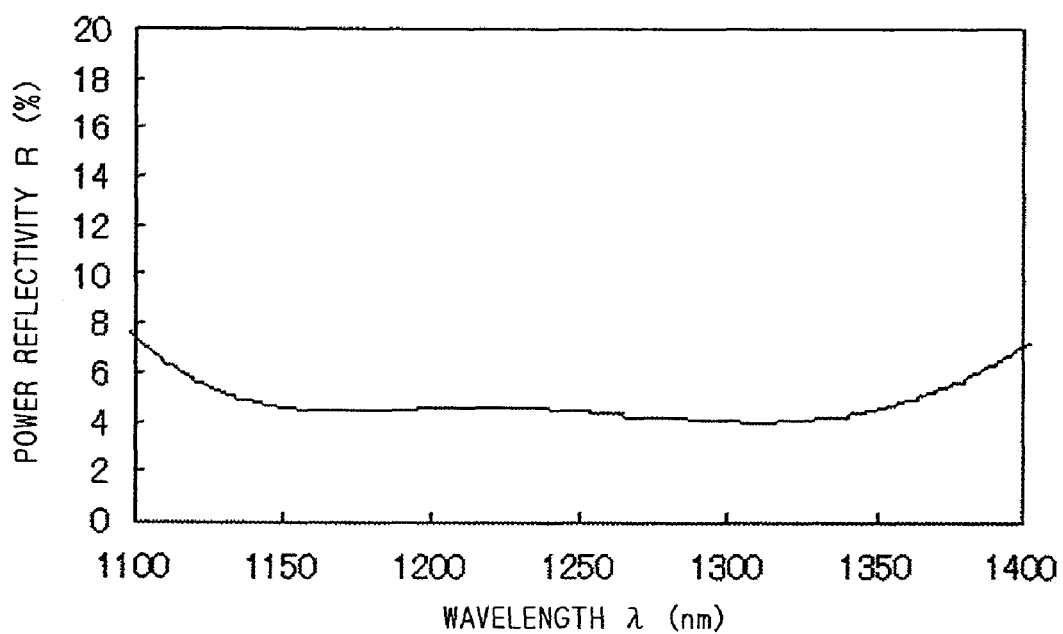
FIG. 16 is a graph showing the wavelength dependence of the power reflectivity of a coating film according to the third preferred embodiment of the present invention.

FIG. 16 shows the wavelength dependence of the power reflectivity R of the coating film 21 thus designed. As illustrated in FIG. 16, the power reflectivity R is 4% when the wavelength λ equals the design wavelength of 1310 nm. A wavelength band for which the power reflectivity R is approximately equal to the design reflectivity of 4% is wide. The power reflectivity R falls within a range from 4.0% to 6.0% for the wavelength λ ranging from 1116 nm to 1383 nm.

When the allowable reflectivity range is, for example, ±2% from the design reflectivity of 4%, the wavelength band for which the power reflectivity R falls within the allowable reflectivity range is also from 1116 nm to 1383 nm, to provide a wavelength bandwidth W of 267 nm. The center wavelength $\lambda_c$ of the wavelength band is 1250 nm. The value obtained by dividing the wavelength bandwidth W by the center wavelength $\lambda_c$ is approximately 0.216, which is greater than 0.06. It may be said that the wavelength band for which the power reflectivity R falls within the allowable reflectivity range is a wide band.

Because the thicknesses of the first to seventh layer films 14 to 20 take on the above-mentioned values, the optical thickness t of the coating film 21, i.e. the sum of the products of the refractive indices and thicknesses of the respective layers of the coating film 21, is 1859.89 nm. This value is approximately 5.94 times the value $t_r$ (313 nm) which is a quarter of the center wavelength $\lambda_c$. Thus, the coating film 21 is a very thick film. This improves heat dissipation characteristics at the end surface 1b of the semiconductor photonic element 1 to suppress the increase in temperature of the end surface 1b.

Figure 17:
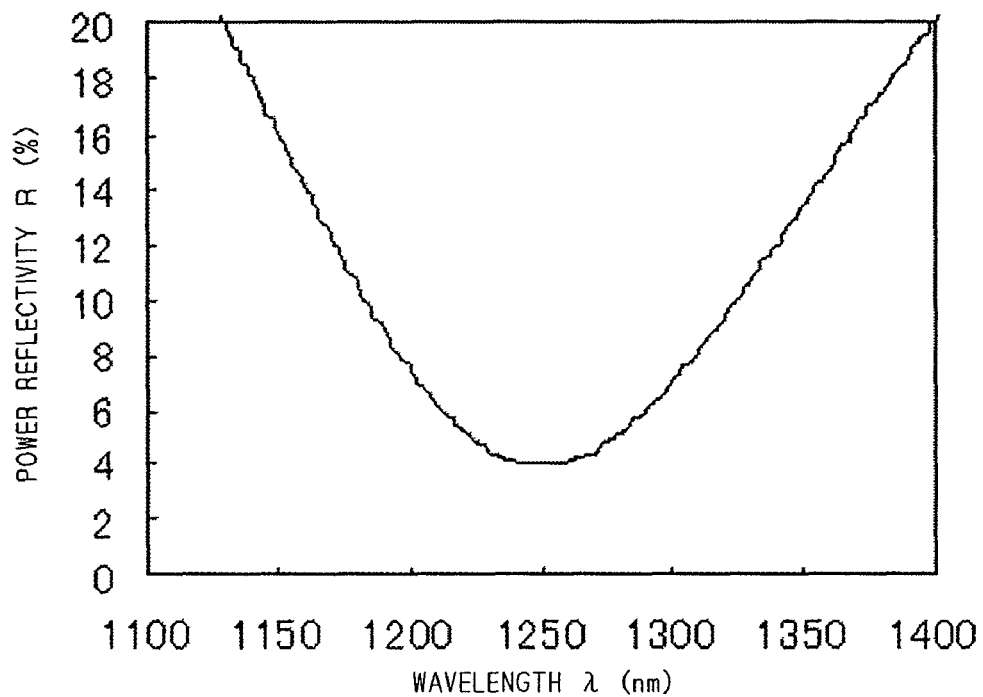
FIG. 17 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 4% for the wavelength λ equal to $\lambda_c$ (1250 nm) when the coating film 2 having the refractive index $n_f$ of "1.4989" as in the first preferred embodiment and a thickness $d_f$ of five times 208.49 nm, i.e. five times $\lambda_c/(4n_f)$, is provided on the end surface 1b of the semiconductor photonic element 1. FIG. 17 shows the wavelength dependence of the power reflectivity R in this case. As illustrated in FIG. 17, the wavelength band for which the power reflectivity R falls within ±2% from the design reflectivity of 4% is from 1213 nm to 1290 nm, to provide a wavelength bandwidth $W_r$ of 77 nm.

Thus, the wavelength bandwidth W (267 nm) for the coating film 21 of the third preferred embodiment is greater than the wavelength bandwidth $W_r$ (77 nm) for the coating film 2 shown in FIG. 2.

Figure 18:
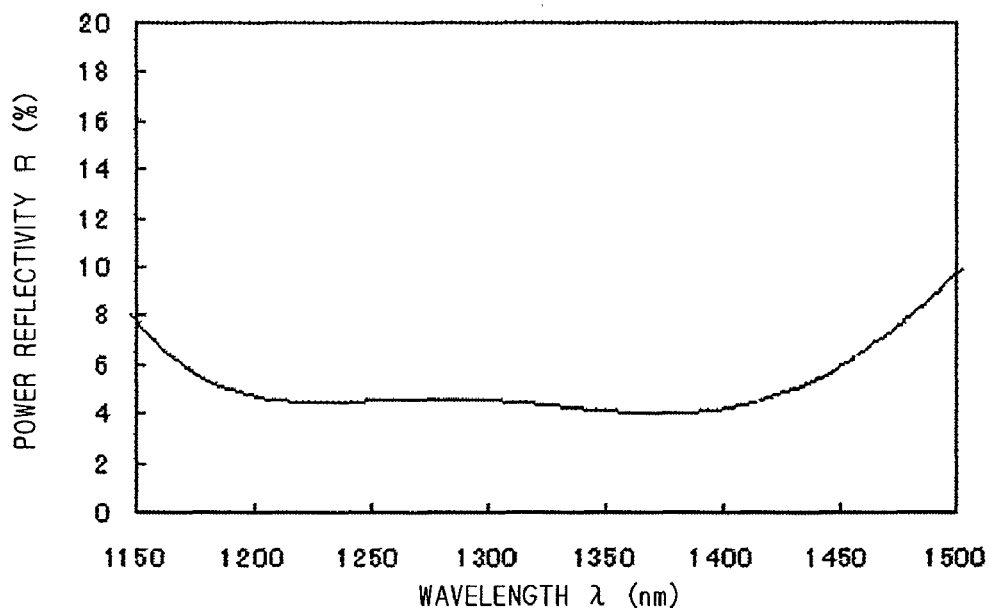
FIG. 18 is a graph showing the wavelength dependence of the power reflectivity of the coating film according to the third preferred embodiment of the present invention.

Because the wavelength λ of light propagating through the active layer 1a is sometimes varied, it is desirable that the center wavelength $\lambda_c$ of the wavelength band for which the power reflectivity R falls within the allowable reflectivity range be equal to or close to the design wavelength $\lambda_t$. For example, the center wavelength $\lambda_c$ takes on a value close to the design wavelength $\lambda_t$ of 1310 nm when the thickness of the coating film 21 is determined using the basic thicknesses $d_1$ and $d_2$ obtained by setting the basic amounts of phase change $\phi_1$ and $\phi_2$ at "0.992102" and "0.536659," respectively, in a similar manner to the above instance and substituting 1374 nm, rather than the design wavelength $\lambda_t$, for λ in Equations (5a) and (5b). FIG. 18 shows the wavelength dependence of the power reflectivity R in this case.

As illustrated in FIG. 18, the power reflectivity R falls within a range from 4.0% to 6.0% for the wavelength λ ranging from 1170 nm to 1451 nm. The wavelength band for which the power reflectivity R falls within ±2% from the design reflectivity of 4% is also from 1170 nm to 1451 nm, to provide a wavelength bandwidth W of 281 nm. The center wavelength $\lambda_c$ of the wavelength band is 1311 nm, which is very close to the design wavelength of 1310 nm. The value obtained by dividing the wavelength bandwidth W (281 nm) by the center wavelength $\lambda_c$ (1311 nm) is approximately 0.214, which is greater than 0.06 and shows that the wavelength band for which the power reflectivity R falls within the allowable reflectivity range is a wide band.

In this case, the thicknesses of the first to seventh layer films 14 to 20 of the coating film 21 are 7.24 nm, 189.85 nm, 130.40 nm, 210.94 nm, 144.88 nm, 210.94 nm and 144.88 nm, respectively. The optical thickness t of the coating film 21 is 1950.72 nm. This value is approximately 5.95 times the value $t_r$ (328 nm) which is a quarter of the center wavelength $\lambda_c$. Thus, the coating film 21 is a very thick film.

Figure 19:
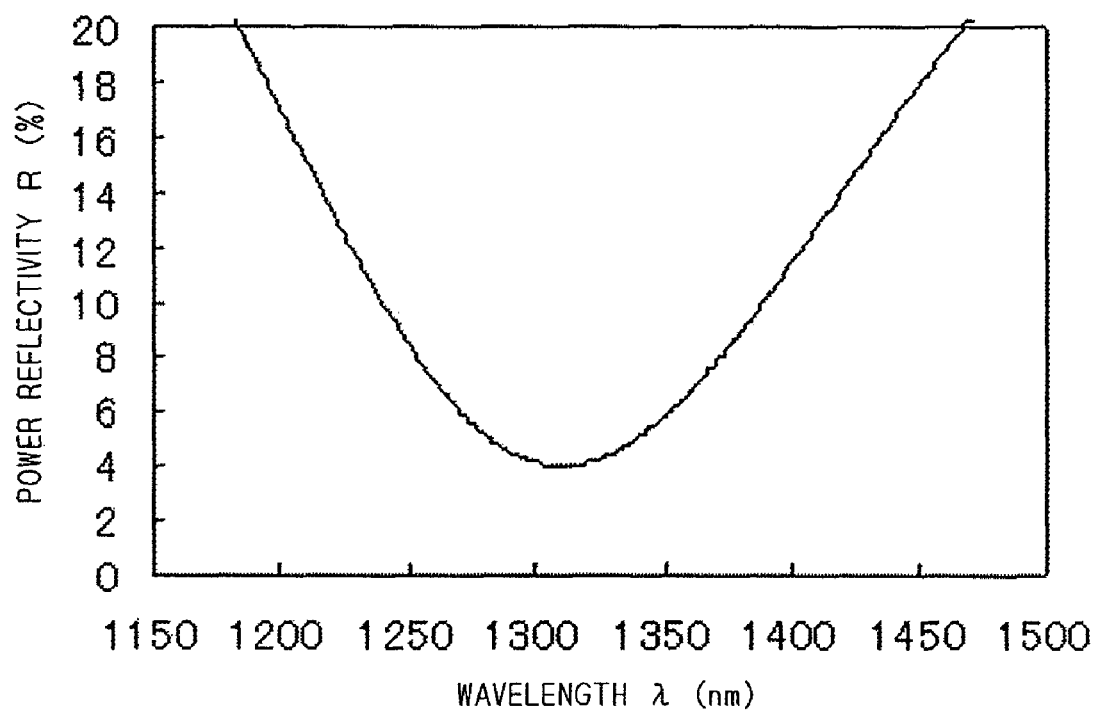
FIG. 19 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 4% for the wavelength $\lambda$ equal to $\lambda_c$ (1311 nm) when the coating film 2 having the above-mentioned refractive index $n_f$ of "1.4989" and a thickness $d_f$ of five times 218.66 nm, i.e. five times $\lambda_c/(4n_f)$, is provided on the end surface 1b of the semiconductor photonic element 1. FIG. 19 shows the wavelength dependence of the power reflectivity R in this case. As illustrated in FIG. 19, the wavelength band for which the power reflectivity R falls within ±2% from the design reflectivity of 4% is from 1271 nm to 1352 nm, to provide a wavelength bandwidth $W_r$ of 81 nm.

Thus, even when the center wavelength $\lambda_c$ is made closer to the design wavelength $\lambda_t$, the wavelength bandwidth W (281 nm) for the coating film 21 is greater than the wavelength bandwidth $W_r$ (81 nm) for the coating film 2 shown in FIG. 2.

Although the center wavelength $\lambda_c$ is close to the design wavelength $\lambda_t$ in the above instance, the center wavelength $\lambda_c$ may be made exactly equal to the design wavelength $\lambda_t$ by adjusting the values of the parameters A, B, C and O or the value substituted for $\lambda$ in Equations (5a) and (5b), as in the first and second preferred embodiments.

Fourth Preferred Embodiment

Figure 20:
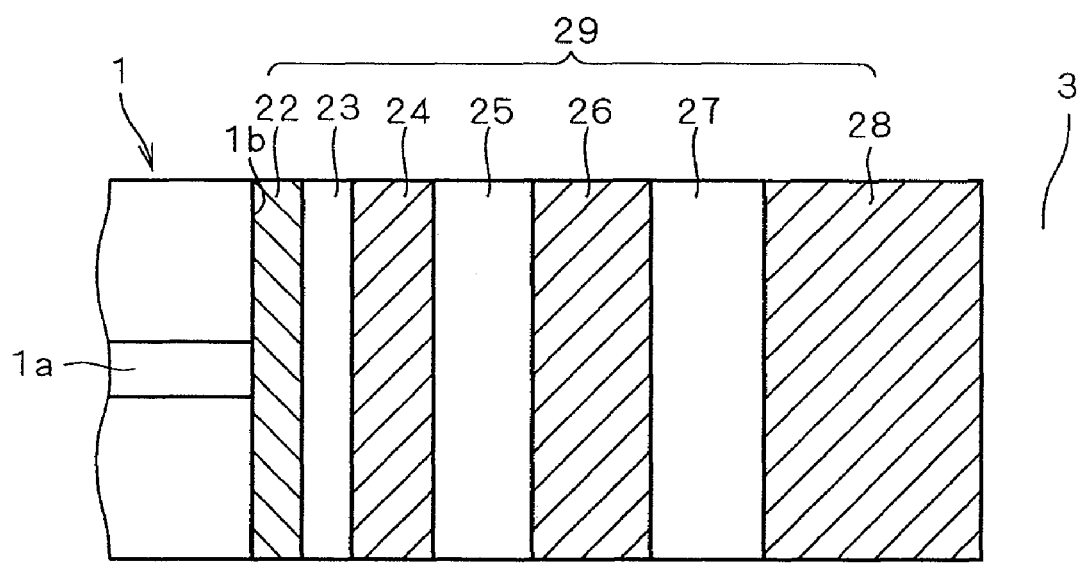
FIG. 20 is a side view showing a structure of the semiconductor photonic device according to a fourth preferred embodiment of the present invention.

FIG. 20 is a side view showing a structure of the semiconductor photonic device according to the fourth preferred embodiment of the present invention. A coating film 29 having a seven-layer structure is provided on the end surface 1b of the semiconductor photonic element 1 in the fourth preferred embodiment.

As illustrated in FIG. 20, the coating film 29 according to the fourth preferred embodiment of the present invention includes: a first layer film 22 having a refractive index $n_3$ and a thickness $d_3$; a second layer film 23 having the refractive index $n_1$ and the thickness $Ad_1$; a third layer film 24 having the refractive index $n_2$ and the thickness $Ad_2$; a fourth layer film 25 having the refractive index $n_1$ and the thickness $Bd_1$; a fifth layer film 26 having the refractive index $n_2$ and the thickness $Bd_2$; a sixth layer film 27 having the refractive index $n_1$ and the thickness $Cd_1$; and a seventh layer film 28 having the refractive index $n_2$ and the thickness $Cd_2$.

The first layer film 22 is an aluminum nitride layer. Each of the second layer film 23, the fourth layer film 25 and the sixth layer film 27 is a tantalum oxide layer. Each of the third layer film 24, the fifth layer film 26 and the seventh layer film 28 is an alumina layer. Thus, the coating film 29 according to the fourth preferred embodiment is composed of three material layers: the aluminum nitride layer, the tantalum oxide layer, and the alumina layer.

In the fourth preferred embodiment, the second and third layer films 23 and 24, the fourth and fifth layer films 25 and 26, and the sixth and seventh layer films 27 and 28 constitute unit layer pairs each composed of the tantalum oxide layer and the alumina layer arranged in a stacked relation. The reference characters A, B and C which determine the thicknesses of the second to seventh layer films 23 to 28 of the coating film 29 designate parameters individually determined for the respective unit layer pairs and each indicating a contribution ratio of the thickness of a corresponding unit layer pair to the thickness of the entire coating film 29. The reference characters $d_1$ and $d_2$ according to the fourth preferred embodiment also designate basic thicknesses individually determined for the respective material layers.

The amounts of phase change for the second to seventh layer films 23 to 28 are designated by $A\phi_1, A\phi_2, B\phi_1, B\phi_2, C\phi_1$ and $C\phi_2$, respectively, using Equations (5a) and (5b). The amount of phase change $\phi_3$ for the first layer film 22 is expressed by:

$$\phi_3 = \frac{2\pi}{\lambda} n_3 d_3 \qquad (9)$$

Therefore, the elements $m_{11}, m_{12}, m_{21}$ and $m_{22}$ of a characteristic matrix for the coating film 29 according to the fourth preferred embodiment satisfy the following determinant:

$$\begin{bmatrix} m_{11} & m_{12} \\ m_{21} & m_{22} \end{bmatrix} = \begin{bmatrix} \cos\phi_3 & -\frac{i}{n_3}\sin\phi_3 \\ -in_3\sin\phi_3 & \cos\phi_3 \end{bmatrix} \times \qquad (7d)$$

$$\begin{bmatrix} \cos A\phi_1 & -\frac{i}{n_1}\sin A\phi_1 \\ -in_1\sin A\phi_1 & \cos A\phi_1 \end{bmatrix} \begin{bmatrix} \cos A\phi_2 & -\frac{i}{n_2}\sin A\phi_2 \\ -in_2\sin A\phi_2 & \cos A\phi_2 \end{bmatrix} \times$$

$$\begin{bmatrix} \cos B\phi_1 & -\frac{i}{n_1}\sin B\phi_1 \\ -in_1\sin B\phi_1 & \cos B\phi_1 \end{bmatrix} \begin{bmatrix} \cos B\phi_2 & -\frac{i}{n_2}\sin B\phi_2 \\ -in_2\sin B\phi_2 & \cos B\phi_2 \end{bmatrix} \times$$

$$\begin{bmatrix} \cos C\phi_1 & -\frac{i}{n_1}\sin C\phi_1 \\ -in_1\sin C\phi_1 & \cos C\phi_1 \end{bmatrix} \begin{bmatrix} \cos C\phi_2 & -\frac{i}{n_2}\sin C\phi_2 \\ -in_2\sin C\phi_2 & \cos C\phi_2 \end{bmatrix}$$

For designing the thickness of the coating film 29 so that the value of the amplitude reflectivity r is an imaginary number, the fourth preferred embodiment previously determines the values of the parameters A, B and C, and previously determines the thickness $d_3$ of the first layer film 22, thereby to handle the value of the amount of phase change $\phi_3$ as a known value. Steps s1 to s5 are executed using Equations (6) and (7d) described above to determine the values of the basic amounts of phase change $\phi_1$ and $\phi_2$. Thereafter, Step s6 is executed to determine the values of the basic thicknesses $d_1$ and $d_2$, and the thicknesses of the second to seventh layer films 23 to 28 of the coating film 29 are determined using the previously determined values of the parameters A, B and C and the values of the basic thicknesses $d_1$ and $d_2$ determined in Step s6. If the designed characteristic of the coating film 29 is insufficient, the basic thicknesses $d_1$ and $d_2$ are determined again by changing the parameters A, B and C or the thickness $d_3$, and the thickness of the coating film 29 is designed again.

The method of determining the thickness when the coating film is composed of the three material layers is described above. However, if the coating film is composed of four or more material layers, this method is capable of determining the thicknesses of the respective layers of the coating film in a similar manner to the fourth preferred embodiment by handling the thicknesses of some of the plurality of layers of the coating film which are included in the first and second material layers as unknown values while handling the thicknesses of the remaining layers which are included in the third and its subsequent material layers as known values.

In the fourth preferred embodiment, the effective refractive index $n_c$ of the semiconductor photonic element 1 is "3.37." The refractive indices $n_1$ to $n_3$ are "2.057," "1.620" and "2.072," respectively. The design wavelength $\lambda_t$ is 1550 nm.

For designing the thicknesses of the respective layers of the coating film 29 having the power reflectivity R of 4% when the wavelength λ equals the design wavelength of 1550 nm under the above-mentioned conditions, a point which provides a phase angle θ of 330 degrees is selected, for example, in Step s1 so that the reflection amplitude vector rv is located in the fourth quadrant (or the lower right quadrant) of the complex plane. Then, the values of the real and imaginary parts $r_r$ and $r_i$ of the complex number inputted as the value of the amplitude reflectivity r are "+0.17320508" and "−0.1," respectively, in Step s2.

When A=1.69, B=1.65, C=2.08 and $d_3$=7.5 nm are set, the basic amounts of phase change $\phi_1$ and $\phi_2$ determined in Step s5 are "1.33612" and "0.478116," respectively. Accordingly, the thicknesses of the second to seventh layer films 23 to 28 determined in Step s6 are 270.80 nm, 123.04 nm, 264.39 nm, 120.13 nm, 333.29 nm and 151.44 nm, respectively.

FIG. 21 shows the wavelength dependence of the power reflectivity R of the coating film 29 thus designed. As illustrated in FIG. 21, the power reflectivity R is 4% when the wavelength λ equals the design wavelength of 1550 nm. A wavelength band for which the power reflectivity R is approximately equal to the design reflectivity of 4% is wide. The power reflectivity R falls within a range from 2.1% to 6.0% for the wavelength λ ranging from 1420 nm to 1898 nm.

When the allowable reflectivity range is, for example, ±2% from the design reflectivity of 4%, the wavelength band for which the power reflectivity R falls within the allowable reflectivity range is also from 1420 nm to 1898 nm, to provide a wavelength bandwidth W of 478 nm. The center wavelength $\lambda_c$ of the wavelength band is 1659 nm. The value obtained by dividing the wavelength bandwidth W by the center wavelength $\lambda_c$ is approximately 0.288, which is greater than 0.06. It may be said that the wavelength band for which the power reflectivity R falls within the allowable reflectivity range is a wide band.

Because the thicknesses of the first to seventh layer films 22 to 28 take on the above-mentioned values, the optical thickness t of the coating film 29, i.e. the sum of the products of the refractive indices and thicknesses of the respective layers of the coating film 29, is 2441.27 nm. This value is approximately 5.88 times the value $t_r$ (415 nm) which is a quarter of the center wavelength $\lambda_c$. Thus, the coating film 29 is a very thick film. This improves heat dissipation characteristics at the end surface 1b of the semiconductor photonic element 1 to suppress the increase in temperature of the end surface 1b.

The semiconductor photonic device shown in FIG. 2 will be considered for comparison. For the semiconductor photonic device shown in FIG. 2, the power reflectivity R is 4% for the wavelength λ equal to $\lambda_c$ (1659 nm) when the coating film 2 having the refractive index $n_f$ of "1.4989" as in the first preferred embodiment and a thickness $d_f$ of five times 276.70 nm, i.e. five times $\lambda_c/(4n_f)$, is provided on the end surface 1b of the semiconductor photonic element 1. FIG. 22 shows the wavelength dependence of the power reflectivity R in this case. As illustrated in FIG. 22, the wavelength band for which the power reflectivity R falls within ±2% from the design reflectivity of 4% is from 1609 nm to 1712 nm, to provide a wavelength bandwidth $W_r$ of 103 nm.

Thus, the wavelength bandwidth W (478 nm) for the coating film 29 of the fourth preferred embodiment is greater than the wavelength bandwidth $W_r$ (103 nm) for the coating film 2 shown in FIG. 2.

Because the wavelength λ of light propagating through the active layer 1a is sometimes varied, it is desirable that the center wavelength $\lambda_c$ of the wavelength band for which the power reflectivity R falls within the allowable reflectivity range be equal to or close to the design wavelength $\lambda_t$. For example, when $d_3$=7.02 nm in the above instance, the basic amounts of phase change $\phi_1$ and $\phi_2$ are "1.33612" and "0.478115," respectively. The center wavelength $\lambda_c$ takes on a value equal to the design wavelength of 1550 nm when the thickness of the coating film 29 is determined using the basic thicknesses $d_1$ and $d_2$ obtained by substituting the above-mentioned values of the basic amounts of phase change $\phi_1$ and $\phi_2$ into Equations (5a) and (5b) and substituting 1451 nm, rather than the design wavelength $\lambda_t$, for λ in Equations (5a) and (5b). FIG. 23 shows the wavelength dependence of the power reflectivity R in this case.

As illustrated in FIG. 23, the power reflectivity R falls within a range from 2.0% to 6.0% for the wavelength λ ranging from 1322 nm to 1777 nm. The wavelength band for which the power reflectivity R falls within ±2% from the design reflectivity of 4% is also from 1322 nm to 1777 nm, to provide a wavelength bandwidth W of 455 nm. The center wavelength $\lambda_c$ of the wavelength band is 1550 nm, which is equal to the design wavelength of 1550 nm. The value obtained by dividing the wavelength bandwidth W (455 nm) by the center wavelength $\lambda_c$ (1550 nm) is approximately 0.294, which is greater than 0.06 and shows that the wavelength band for which the power reflectivity R falls within the allowable reflectivity range is a wide band.

In this case, the thicknesses of the first to seventh layer films 22 to 28 of the coating film 29 are 7.02 nm, 253.50 nm, 115.18 nm, 247.50 nm, 112.46 nm, 312.01 nm and 141.77 nm, respectively. The optical thickness t of the coating film 29 is 2285.35 nm. This value is approximately 5.89 times the value $t_r$ (388 nm) which is a quarter of the center wavelength $\lambda_c$. Thus, the coating film 29 is a very thick film.

The semiconductor photonic device shown in FIG. 2 will be considered for comparison. For the semiconductor photonic device shown in FIG. 2, the power reflectivity R is 4% for the wavelength λ equal to $\lambda_c$ (1550 nm) when the coating film 2 having the above-mentioned refractive index $n_f$ of "1.4989" and a thickness $d_f$ of five times 258.52 nm, i.e. five times $\lambda_c/(4n_f)$, is provided on the end surface 1b of the semiconductor photonic element 1. FIG. 24 shows the wavelength dependence of the power reflectivity R in this case. As illustrated in FIG. 24, the wavelength band for which the power reflectivity R falls within ±2% from the design reflectivity of 4% is from 1503 nm to 1600 nm, to provide a wavelength bandwidth $W_r$ of 97 nm.

Thus, even when the center wavelength $\lambda_c$ is made equal to the design wavelength $\lambda_t$, the wavelength bandwidth W (455 nm) for the coating film 29 is greater than the wavelength bandwidth $W_r$ (97 nm) for the coating film 2 shown in FIG. 2.

Fifth Preferred Embodiment

Figure 25:
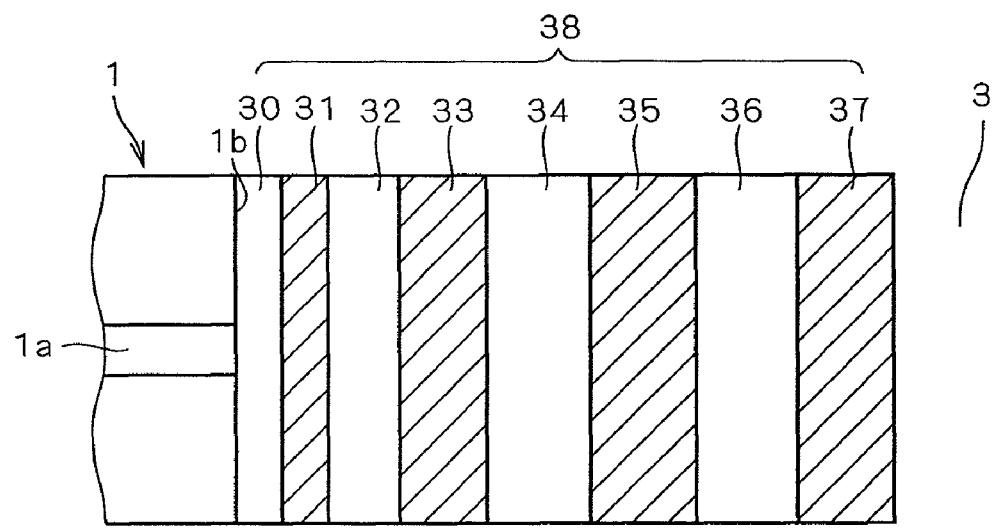
FIG. 25 is a side view showing a structure of the semiconductor photonic device according to a fifth preferred embodiment of the present invention.

FIG. 25 is a side view showing a structure of the semiconductor photonic device according to the fifth preferred embodiment of the present invention. A coating film 38 having an eight-layer structure is provided on the end surface 1b of the semiconductor photonic element 1 in the fifth preferred embodiment.

As illustrated in FIG. 25, the coating film 38 according to the fifth preferred embodiment of the present invention includes: a first layer film 30 having the refractive index $n_1$ and the thickness $Ad_1$; a second layer film 31 having the refractive index $n_2$ and the thickness $Ad_2$; a third layer film 32 having the refractive index $n_1$ and the thickness $Bd_1$; a fourth layer film 33 having the refractive index $n_2$ and the thickness $Bd_2$; a fifth layer film 34 having the refractive index $n_1$ and the thickness $Cd_1$; a sixth layer film 35 having the refractive index $n_2$ and the thickness $Cd_2$; a seventh layer film 36 having the refractive index $n_1$ and a thickness $Dd_1$; and an eighth layer film 37 having the refractive index $n_2$ and a thickness $Dd_2$.

Each of the first layer film 30, the third layer film 32, the fifth layer film 34 and the seventh layer film 36 is a tantalum oxide layer, and each of the second layer film 31, the fourth layer film 33, the sixth layer film 35 and the eighth layer film 37 is a silicon oxide layer. Thus, the coating film 38 according to the fifth preferred embodiment is composed of two material layers: the tantalum oxide layer and the silicon oxide layer.

In the fifth preferred embodiment, the first and second layer films 30 and 31, the third and fourth layer films 32 and 33, the fifth and sixth layer films 34 and 35, and the seventh and eighth layer films 36 and 37 constitute unit layer pairs each composed of the tantalum oxide layer and the silicon oxide layer arranged in a stacked relation. In other words, the coating film 38 includes four unit layer pairs each composed of the tantalum oxide layer and the silicon oxide layer arranged in a stacked relation. The reference characters A, B, C and D which determine the thicknesses of the respective layers of the coating film 38 designate parameters individually determined for the respective unit layer pairs and each indicating a contribution ratio of the thickness of a corresponding unit layer pair to the thickness of the entire coating film 38. The reference characters $d_1$ and $d_2$ according to the fifth preferred embodiment also designate basic thicknesses individually determined for the respective material layers in a similar manner to the first preferred embodiment.

The amounts of phase change for the first to eighth layer films 30 to 37 are designated by $A\phi_1$, $A\phi_2$, $B\phi_1$, $B\phi_2$, $C\phi_1$, $C\phi_2$, $D\phi_1$ and $D\phi_2$, respectively, using Equations (5a) and (5b). Therefore, the elements $m_{11}$, $m_{12}$, $m_{21}$ and $m_{22}$ of a characteristic matrix for the coating film 38 according to the fifth preferred embodiment satisfy the following determinant:

$$\begin{bmatrix} m_{11} & m_{12} \\ m_{21} & m_{22} \end{bmatrix} = \begin{bmatrix} \cos A\phi_1 & -\frac{i}{n_1}\sin A\phi_1 \\ -in_1\sin A\phi_1 & \cos A\phi_1 \end{bmatrix} \quad (7e)$$

$$\begin{bmatrix} \cos A\phi_2 & -\frac{i}{n_2}\sin A\phi_2 \\ -in_2\sin A\phi_2 & \cos A\phi_2 \end{bmatrix} \times$$

$$\begin{bmatrix} \cos B\phi_1 & -\frac{i}{n_1}\sin B\phi_1 \\ -in_1\sin B\phi_1 & \cos B\phi_1 \end{bmatrix} \begin{bmatrix} \cos B\phi_2 & -\frac{i}{n_2}\sin B\phi_2 \\ -in_2\sin B\phi_2 & \cos B\phi_2 \end{bmatrix} \times$$

$$\begin{bmatrix} \cos C\phi_1 & -\frac{i}{n_1}\sin C\phi_1 \\ -in_1\sin C\phi_1 & \cos C\phi_1 \end{bmatrix} \begin{bmatrix} \cos C\phi_2 & -\frac{i}{n_2}\sin C\phi_2 \\ -in_2\sin C\phi_2 & \cos C\phi_2 \end{bmatrix} \times$$

$$\begin{bmatrix} \cos D\phi_1 & -\frac{i}{n_1}\sin D\phi_1 \\ -in_1\sin D\phi_1 & \cos D\phi_1 \end{bmatrix}$$

$$\begin{bmatrix} \cos D\phi_2 & -\frac{i}{n_2}\sin D\phi_2 \\ -in_2\sin D\phi_2 & \cos D\phi_2 \end{bmatrix}$$

For designing the thickness of the coating film 38 so that the value of the amplitude reflectivity r is an imaginary number, the fifth preferred embodiment previously determines the values of the parameters A to D, and executes Steps s1 to s5 using Equations (6) and (7d) described above to determine the values of the basic amounts of phase change $\phi_1$ and $\phi_2$. Thereafter, Step s6 is executed to determine the values of the basic thicknesses $d_1$ and $d_2$, and the thicknesses of the respective layers of the coating film 38 are determined using the previously determined values of the parameters A to D and the values of the basic thicknesses $d_1$ and $d_2$ determined in Step s6. If the designed characteristic of the coating film 38 is insufficient, the basic thicknesses $d_1$ and $d_2$ are determined again by changing the parameters A to D, and the thickness of the coating film 38 is designed again.

Because GaN (gallium nitride) based semiconductor is employed in the semiconductor photonic element 1 of the fifth preferred embodiment, the effective refractive index $n_c$ of the semiconductor photonic element 1 is "2.50." The design wavelength $\lambda_t$ is 410 nm. The refractive index $n_1$ of the tantalum oxide layer is greater than $n_c^{1/2}$ (=1.581), and is set at "2.128" in consideration for wavelength dispersion because the design wavelength $\lambda_t$ is as short as 410 nm. The refractive index $n_2$ of the silicon oxide layer is "1.480" which is less than $n_c^{1/2}$.

For designing the thickness of the coating film 38 having the power reflectivity R of 4% when the wavelength λ equals the design wavelength of 410 nm under the above-mentioned conditions, a point which provides a phase angle θ of 45 degrees is selected, for example, in Step s1 so that the reflection amplitude vector rv is located in the first quadrant (or the upper right quadrant) of the complex plane. Then, the values of the real and imaginary parts $r_r$ and $r_i$ of the complex number inputted as the value of the amplitude reflectivity r are "+0.141421356" and "+0.141421356," respectively, in Step s2.

When A=1.38, B=2.30, C=2.00 and D=2.00 are set, the basic amounts of phase change $\phi_1$ and $\phi_2$ determined in Step s5 are "1.56840" and "0.526521," respectively. Accordingly, the thicknesses of the first to eighth layer films 30 to 37 determined in Step s6 are 66.37 nm, 32.04 nm, 110.62 nm, 53.39 nm, 96.19 nm, 46.43 nm, 96.19 nm and 46.43 nm, respectively.

Figure 26:
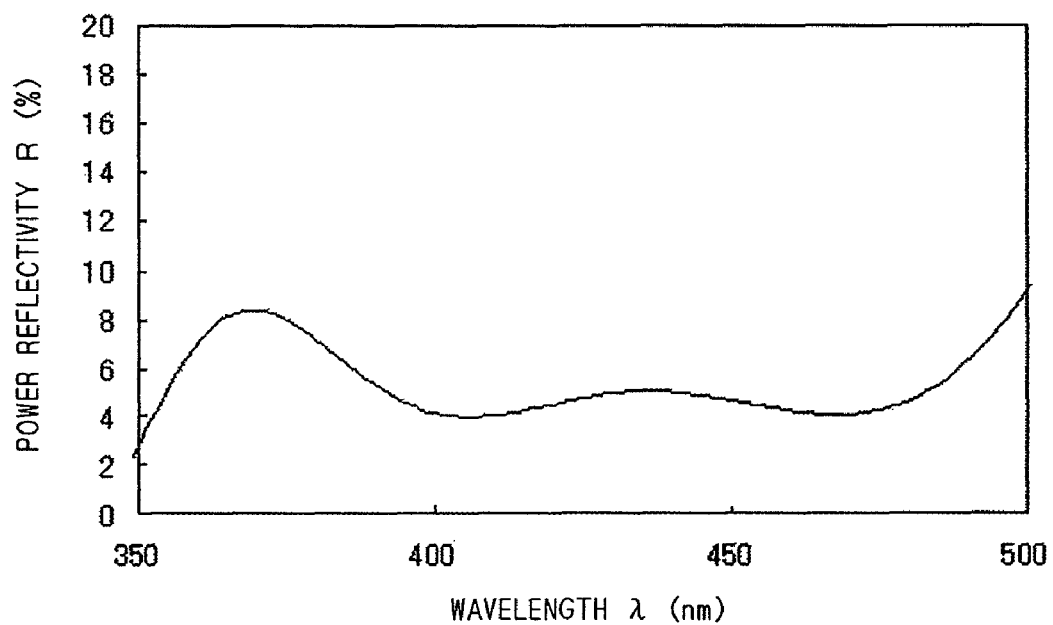
FIG. 26 is a graph showing the wavelength dependence of the power reflectivity of a coating film according to the fifth preferred embodiment of the present invention.

FIG. 26 shows the wavelength dependence of the power reflectivity R of the coating film 38 thus designed. As illustrated in FIG. 26, the power reflectivity R is 4% when the wavelength λ equals the design wavelength of 410 nm. A wavelength band for which the power reflectivity R is approximately equal to the design reflectivity of 4% is wide. The power reflectivity R falls within a range from 3.9% to 6.0% for the wavelength λ ranging from 386 nm to 488 nm.

When the allowable reflectivity range is, for example, ±2% from the design reflectivity of 4%, the wavelength band for which the power reflectivity R falls within the allowable reflectivity range is also from 386 nm to 488 nm, to provide a wavelength bandwidth W of 102 nm. The center wavelength $\lambda_c$ of the wavelength band is 437 nm. The value obtained by dividing the wavelength bandwidth W by the center wavelength $\lambda_c$ is approximately 0.233, which is greater than 0.06. It may be said that the wavelength band for which the power reflectivity R falls within the allowable reflectivity range is a wide band.

Because the thicknesses of the first to eighth layer films 30 to 37 take on the above-mentioned values, the optical thickness t of the coating film 38, i.e. the sum of the products of the refractive indices and thicknesses of the respective layers of the coating film 38, is 1049.89 nm. This value is approximately 9.63 times the value $t_r$ (109 nm) which is a quarter of the center wavelength $\lambda_c$. Thus, the coating film 38 is a very thick film. This improves heat dissipation characteristics at the end surface 1b of the semiconductor photonic element 1 to suppress the increase in temperature of the end surface 1b.

Figure 27:
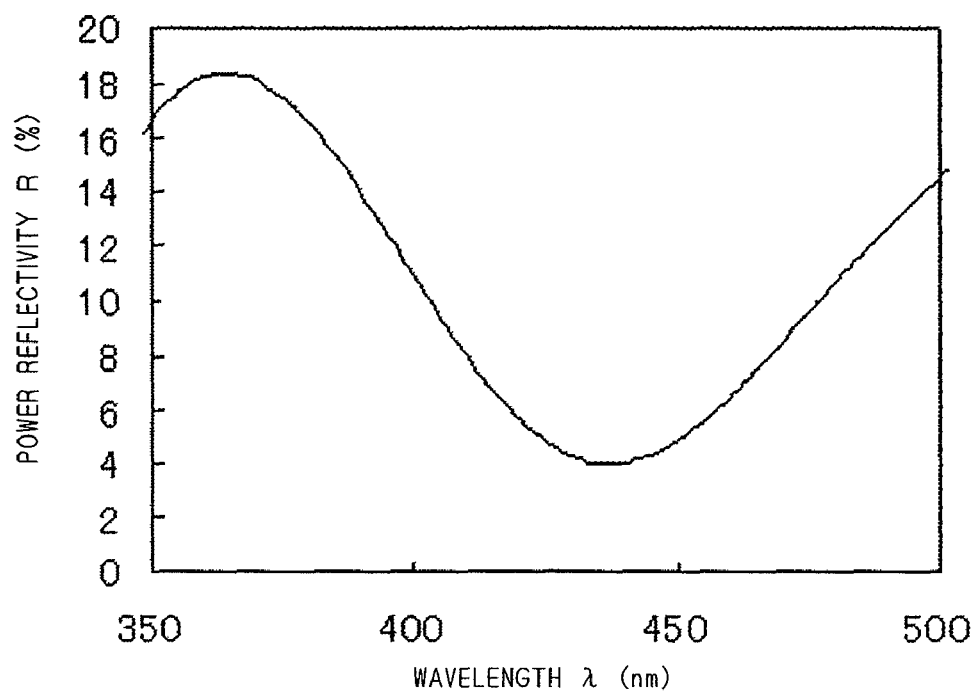
FIG. 27 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R takes on a relative minimum value of 4% for the wavelength λ equal to $\lambda_c$ (437 nm) when the coating film 2 having a refractive index $n_f$ of "1.291" and a thickness $d_f$ of five times 84.62 nm, i.e. five times $\lambda_c/(4n_f)$, is provided on the end surface 1b of the semiconductor photonic element 1. FIG. 27 shows the wavelength dependence of the power reflectivity R in this case. As illustrated in FIG. 27, the wavelength band for which the power reflectivity R falls within ±2% from the design reflectivity of 4% is from 419 nm to 457 nm, to provide a wavelength bandwidth $W_r$ of 38 nm.

The above-mentioned value "1.291" of the refractive index $n_f$ is obtained by substituting $R_t$=0.04 and $n_c$=2.50 into Equation (8).

Thus, the wavelength bandwidth W (102 nm) for the coating film 38 of the fifth preferred embodiment is greater than the wavelength bandwidth $W_r$ (38 nm) for the coating film 2 shown in FIG. 2.

Figure 28:
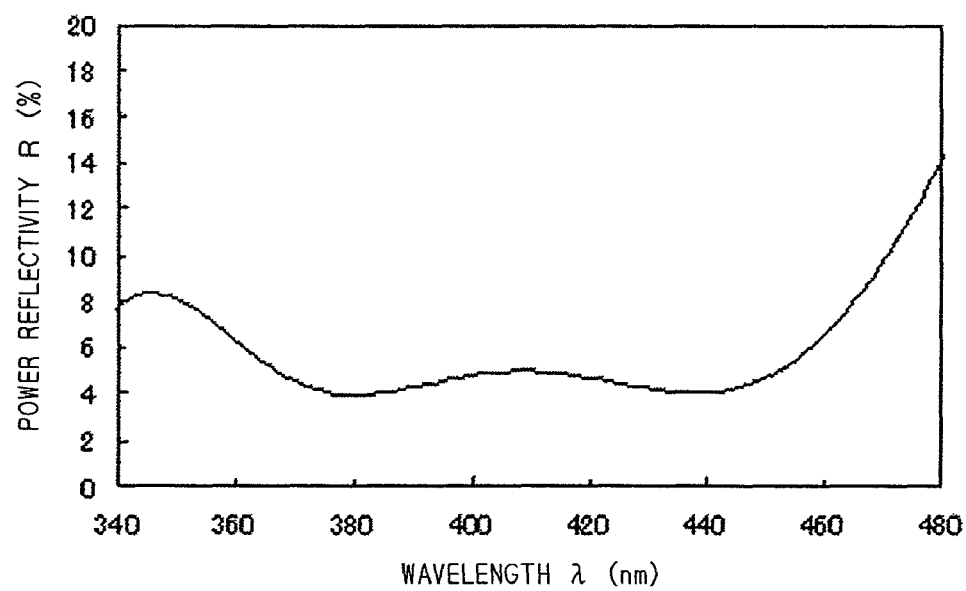
FIG. 28 is a graph showing the wavelength dependence of the power reflectivity of the coating film according to the fifth preferred embodiment of the present invention.

Because the wavelength λ of light propagating through the active layer 1a is sometimes varied, it is desirable that the center wavelength $\lambda_c$ of the wavelength band for which the power reflectivity R falls within the allowable reflectivity range be equal to or close to the design wavelength $\lambda_t$. For example, the center wavelength $\lambda_c$ takes on a value equal to the design wavelength $\lambda_t$ of 410 nm when the thickness of the coating film 38 is determined using the basic thicknesses $d_1$ and $d_2$ obtained by setting the basic amounts of phase change $\phi_1$ and $\phi_2$ at "1.56840" and "0.526521," respectively, in a similar manner to the above instance and substituting 384 nm, rather than the design wavelength $\lambda_t$, for λ in Equations (5a) and (5b). FIG. 28 shows the wavelength dependence of the power reflectivity R in this case.

As illustrated in FIG. 28, the power reflectivity R falls within a range from 3.9% to 6.0% for the wavelength λ ranging from 362 nm to 457 nm. The wavelength band for which the power reflectivity R falls within ±2% from the design reflectivity of 4% is also from 362 nm to 457 nm, to provide a wavelength bandwidth W of 95 nm. The center wavelength $\lambda_c$ of the wavelength band is 410 nm, which is equal to the design wavelength of 410 nm. The value obtained by dividing the wavelength bandwidth W (95 nm) by the center wavelength $\lambda_c$ (410 nm) is approximately 0.224, which is greater than 0.06 and shows that the wavelength band for which the power reflectivity R falls within the allowable reflectivity range is a wide band.

In this case, the thicknesses of the first to eighth layer films 30 to 37 of the coating film 38 are 62.16 nm, 30.00 nm, 103.60 nm, 50.00 nm, 90.09 nm, 43.48 nm, 90.09 nm and 43.48 nm, respectively. The optical thickness t of the coating film 38 is 983.26 nm. This value is approximately 9.55 times the value $t_r$ (103 nm) which is a quarter of the center wavelength $\lambda_c$. Thus, the coating film 38 is a very thick film.

Figure 29:
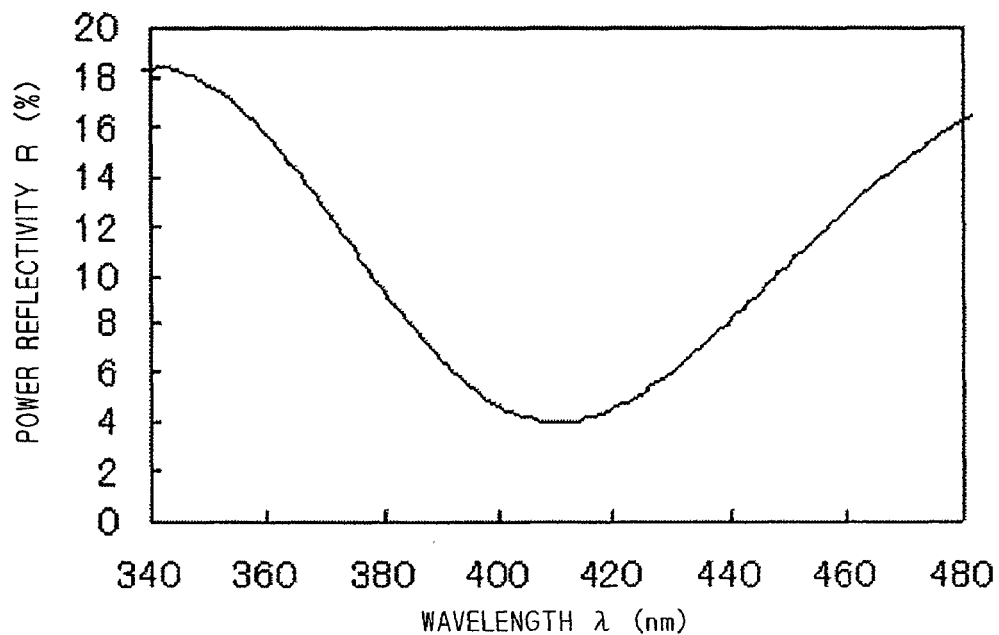
FIG. 29 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 4% for the wavelength λ equal to $\lambda_c$ (410 nm) when the coating film 2 having the above-mentioned refractive index $n_f$ of "1.291" and a thickness $d_f$ of five times 79.40 nm, i.e. five times $\lambda_c/(4n_f)$, is provided on the end surface 1b of the semiconductor photonic element 1. FIG. 29 shows the wavelength dependence of the power reflectivity R in this case. As illustrated in FIG. 29, the wavelength band for which the power reflectivity R falls within ±2% from the design reflectivity of 4% is from 393 nm to 429 nm, to provide a wavelength bandwidth $W_r$ of 36 nm.

Thus, even when the center wavelength $\lambda_c$ is made equal to the design wavelength $\lambda_t$, the wavelength bandwidth W (95 nm) for the coating film 38 is greater than the wavelength bandwidth $W_r$ (36 nm) for the coating film 2 shown in FIG. 2.

Sixth Preferred Embodiment

Figure 30:
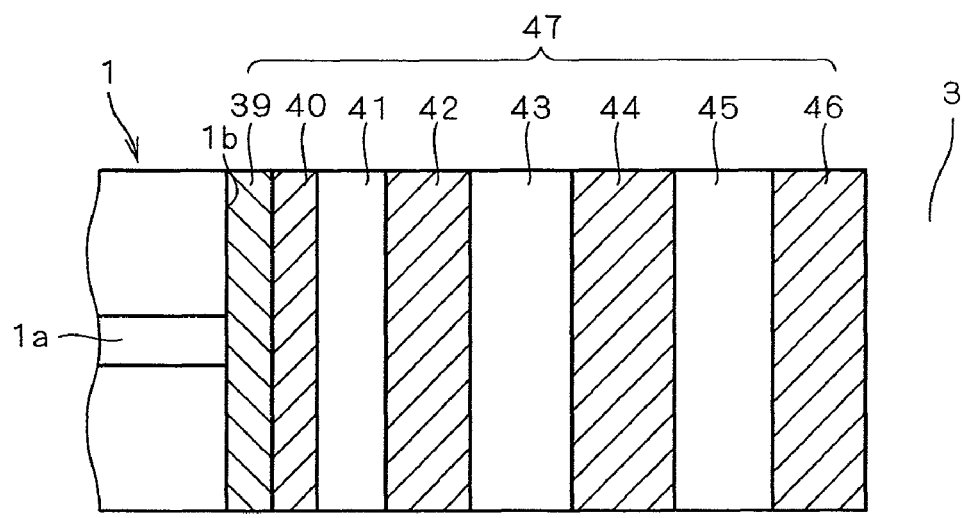
FIG. 30 is a side view showing a structure of the semiconductor photonic device according to a sixth preferred embodiment of the present invention.

FIG. 30 is a side view showing a structure of the semiconductor photonic device according to the sixth preferred embodiment of the present invention. A coating film 47 having an eight-layer structure is provided on the end surface 1b of the semiconductor photonic element 1 in the sixth preferred embodiment.

As illustrated in FIG. 30, the coating film 47 according to the sixth preferred embodiment of the present invention includes: a first layer film 39 having the refractive index $n_3$ and the thickness $d_3$; a second layer film 40 having the refractive index $n_2$ and the thickness $Ad_2$; a third layer film 41 having the refractive index $n_1$ and the thickness $Bd_1$; a fourth layer film 42 having the refractive index $n_2$ and the thickness $Bd_2$; a fifth layer film 43 having the refractive index $n_1$ and the thickness $Cd_1$; a sixth layer film 44 having the refractive index $n_2$ and the thickness $Cd_2$; a seventh layer film 45 having the refractive index $n_1$ and the thickness $Dd_1$; and an eighth layer film 46 having the refractive index $n_2$ and the thickness $Dd_2$.

The first layer film 39 is an aluminum nitride layer. Each of the second layer film 40, the fourth layer film 42, the sixth layer film 44 and the eighth layer film 46 is a silicon oxide layer. Each of the third layer film 41, the fifth layer film 43 and the seventh layer film 45 is a tantalum oxide layer. Thus, the coating film 47 according to the sixth preferred embodiment is composed of three material layers: the aluminum nitride layer, the silicon oxide layer, and the tantalum oxide layer.

In the sixth preferred embodiment, the third and fourth layer films 41 and 42, the fifth and sixth layer films 43 and 44, and the seventh and eighth layer films 45 and 46 constitute unit layer pairs each composed of the tantalum oxide layer and the silicon oxide layer arranged in a stacked relation. The reference characters B, C and D which determine the thicknesses of the third to eighth layer films 41 to 46 of the coating film 47 designate parameters individually determined for the respective unit layer pairs and each indicating a contribution ratio of the thickness of a corresponding unit layer pair to the thickness of the entire coating film 47. The reference character A which determines the thickness of the second layer film 40 designates a parameter indicating a contribution ratio of the thickness of the second layer film 40 to the thickness of the entire coating film 47. The reference characters $d_1$ and $d_2$ according to the sixth preferred embodiment also designate basic thicknesses individually determined for the respective material layers.

The amounts of phase change for the second to eighth layer films 40 to 46 are designated by $A\phi_2$, $B\phi_1$, $B\phi_2$, $C\phi_1$, $C\phi_2$, $D\phi_1$ and $D\phi_2$, respectively, using Equations (5a) and (5b). The amount of phase change $\phi_3$ for the first layer film 39 is expressed by Equation (9) described above. Therefore, the elements $m_{11}$, $m_{12}$, $m_{21}$ and $m_{22}$ of a characteristic matrix for the coating film 47 according to the sixth preferred embodiment satisfy the following determinant:

$$\begin{bmatrix} m_{11} & m_{12} \\ m_{21} & m_{22} \end{bmatrix} = \begin{bmatrix} \cos\phi_3 & -\frac{i}{n_3}\sin\phi_3 \\ -in_3\sin\phi_3 & \cos\phi_3 \end{bmatrix} \tag{7f}$$

$$\begin{bmatrix} \cos A\phi_2 & -\frac{i}{n_2}\sin A\phi_2 \\ -in_2\sin A\phi_2 & \cos A\phi_2 \end{bmatrix} \times$$

-continued $$\begin{bmatrix} \cos B\phi_1 & -\dfrac{i}{n_1}\sin B\phi_1 \\ -in_1\sin B\phi_1 & \cos B\phi_1 \end{bmatrix} \begin{bmatrix} \cos B\phi_2 & -\dfrac{i}{n_2}\sin B\phi_2 \\ -in_2\sin B\phi_2 & \cos B\phi_2 \end{bmatrix} \times$$

$$\begin{bmatrix} \cos C\phi_1 & -\dfrac{i}{n_1}\sin C\phi_1 \\ -in_1\sin C\phi_1 & \cos C\phi_1 \end{bmatrix} \begin{bmatrix} \cos C\phi_2 & -\dfrac{i}{n_2}\sin C\phi_2 \\ -in_2\sin C\phi_2 & \cos C\phi_2 \end{bmatrix} \times$$

$$\begin{bmatrix} \cos D\phi_1 & -\dfrac{i}{n_1}\sin D\phi_1 \\ -in_1\sin D\phi_1 & \cos D\phi_1 \end{bmatrix}$$

$$\begin{bmatrix} \cos D\phi_2 & -\dfrac{i}{n_2}\sin D\phi_2 \\ -in_2\sin D\phi_2 & \cos D\phi_2 \end{bmatrix}$$

For designing the thickness of the coating film 47 so that the value of the amplitude reflectivity r is an imaginary number, the sixth preferred embodiment previously determines the values of the parameters A to D, and previously determines the thickness $d_3$ of the first layer film 39, thereby to handle the value of the amount of phase change $\phi_3$ as a known value. Steps s1 to s5 are executed using Equations (6) and (7f) described above to determine the values of the basic amounts of phase change $\phi_1$ and $\phi_2$. Thereafter, Step s6 is executed to determine the values of the basic thicknesses $d_1$ and $d_2$, and the thicknesses of the second to eighth layer films 40 to 46 of the coating film 47 are determined using the previously determined values of the parameters A to D and the values of the basic thicknesses $d_1$ and $d_2$ determined in Step s6. If the designed characteristic of the coating film 47 is insufficient, the basic thicknesses $d_1$ and $d_2$ are determined again by changing the parameters A to D or the thickness $d_3$, and the thickness of the coating film 47 is designed again.

In the sixth preferred embodiment, the effective refractive index $n_c$ of the semiconductor photonic element 1 is "3.37." The refractive indices $n_1$ to $n_3$ are "2.057," "1.480" and "2.072," respectively. The design wavelength $\lambda_t$ is 650 nm.

For designing the thickness of the coating film 47 having the power reflectivity R of 4% when the wavelength $\lambda$ equals the design wavelength of 650 nm under the above-mentioned conditions, a point which provides a phase angle θ of 135 degrees is selected, for example, in Step s1 so that the reflection amplitude vector rv is located in the second quadrant (or the upper left quadrant) of the complex plane. Then, the values of the real and imaginary parts $r_r$ and $r_i$ of the complex number inputted as the value of the amplitude reflectivity r are "−0.141421356" and "+0.141421356," respectively, in Step s2.

When A=2.50, B=1.90, C=1.00, D=2.05 and $d_3$=40.0 nm are set, the basic amounts of phase change $\phi_1$ and $\phi_2$ determined in Step s5 are "0.674374" and "1.15311," respectively. Accordingly, the thicknesses of the second to eighth layer films 40 to 46 determined in Step s6 are 201.50 nm, 64.44 nm, 153.14 nm, 33.92 nm, 80.60 nm, 69.53 nm and 165.23 nm, respectively.

Figure 31:
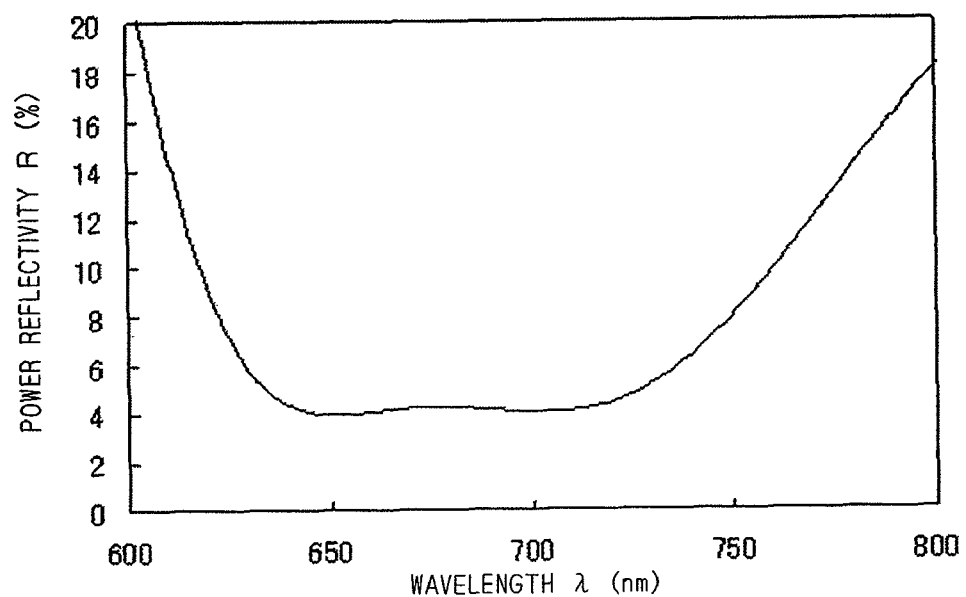
FIG. 31 is a graph showing the wavelength dependence of the power reflectivity of a coating film according to the sixth preferred embodiment of the present invention.

FIG. 31 shows the wavelength dependence of the power reflectivity R of the coating film 47 thus designed. As illustrated in FIG. 31, the power reflectivity R is 4% when the wavelength $\lambda$ equals the design wavelength of 650 nm. A wavelength band for which the power reflectivity R is approximately equal to the design reflectivity of 4% is wide. The power reflectivity R falls within a range from 4.0% to 6.0% for the wavelength $\lambda$ ranging from 630 nm to 736 nm.

When the allowable reflectivity range is, for example, ±2% from the design reflectivity of 4%, the wavelength band for which the power reflectivity R falls within the allowable reflectivity range is also from 630 nm to 736 nm, to provide a wavelength bandwidth W of 106 nm. The center wavelength $\lambda_c$ of the wavelength band is 683 nm. The value obtained by dividing the wavelength bandwidth W by the center wavelength $\lambda_c$ is approximately 0.155, which is greater than 0.06. It may be said that the wavelength band for which the power reflectivity R falls within the allowable reflectivity range is a wide band.

Because the thicknesses of the first to eighth layer films 39 to 46 take on the above-mentioned values, the optical thickness t of the coating film 47, i.e. the sum of the products of the refractive indices and thicknesses of the respective layers of the coating film 47, is 1316.93 nm. This value is approximately 7.70 times the value $t_r$ (171 nm) which is a quarter of the center wavelength $\lambda_c$. Thus, the coating film 47 is a very thick film. This improves heat dissipation characteristics at the end surface 1b of the semiconductor photonic element 1 to suppress the increase in temperature of the end surface 1b.

Figure 32:
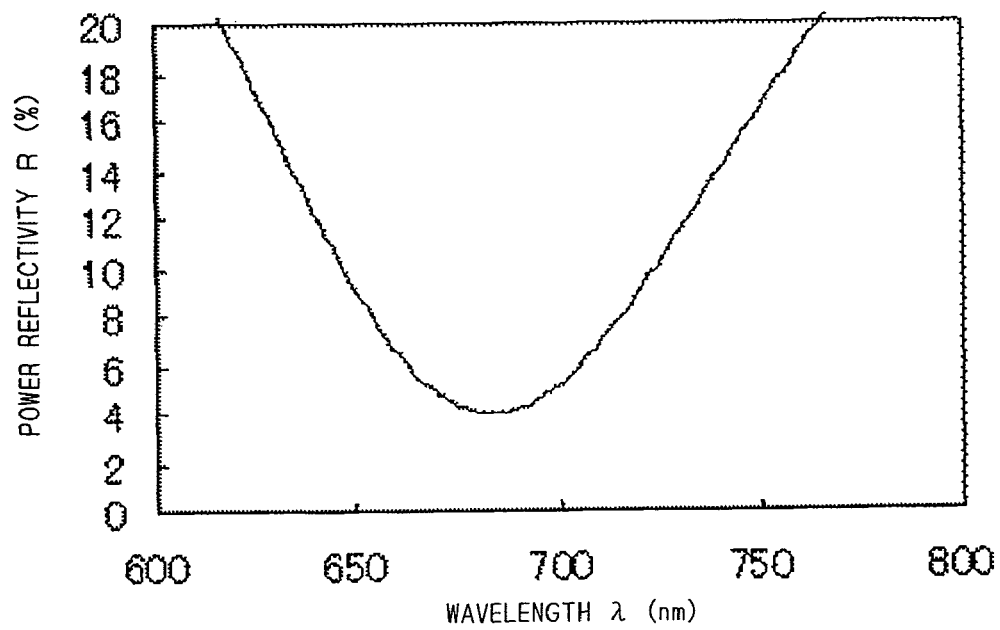
FIG. 32 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 4% for the wavelength $\lambda$ equal to $\lambda_c$ (683 nm) when the coating film 2 having the refractive index $n_f$ of "1.4989" as in the first preferred embodiment and a thickness $d_f$ of five times 113.92 nm, i.e. five times $\lambda_c/(4n_f)$, is provided on the end surface 1b of the semiconductor photonic element 1. FIG. 32 shows the wavelength dependence of the power reflectivity R in this case. As illustrated in FIG. 32, the wavelength band for which the power reflectivity R falls within ±2% from the design reflectivity of 4% is from 663 nm to 705 nm, to provide a wavelength bandwidth $W_r$ of 42 nm.

Thus, the wavelength bandwidth W (106 nm) for the coating film 47 of the sixth preferred embodiment is greater than the wavelength bandwidth $W_r$ (42 nm) for the coating film 2 shown in FIG. 2.

Figure 33:
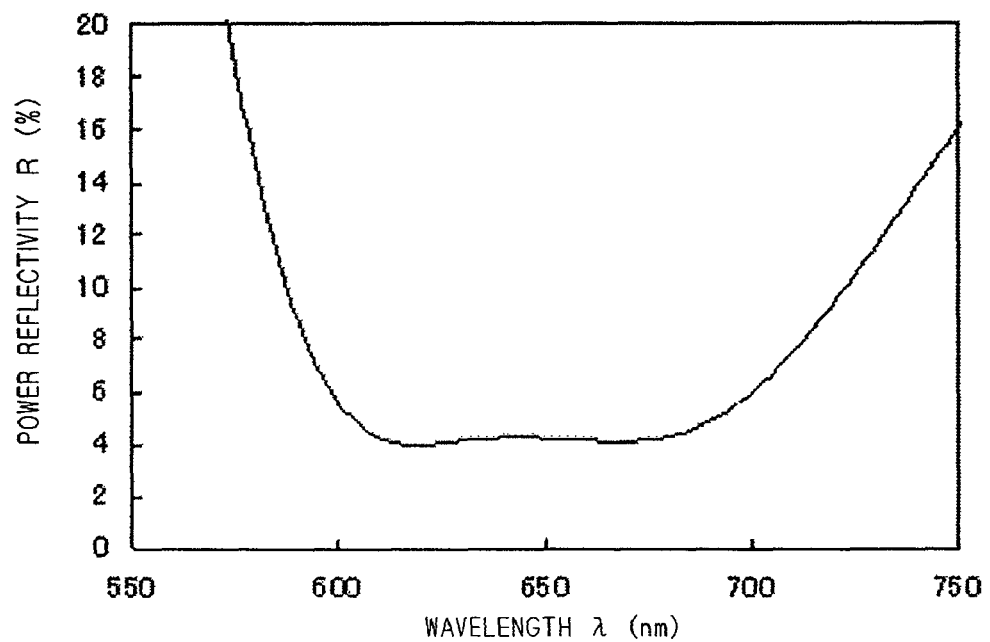
FIG. 33 is a graph showing the wavelength dependence of the power reflectivity of the coating film according to the sixth preferred embodiment of the present invention.

Because the wavelength $\lambda$ of light propagating through the active layer 1a is sometimes varied, it is desirable that the center wavelength $\lambda_c$ of the wavelength band for which the power reflectivity R falls within the allowable reflectivity range be equal to or close to the design wavelength $\lambda_t$. For example, when $d_3$=38.03 nm in the above instance, the basic amounts of phase change $\phi_1$ and $\phi_2$ are "0.674368" and "1.15312," respectively. The center wavelength $\lambda_c$ takes on a value equal to the design wavelength $\lambda_t$ of 650 nm when the thickness of the coating film 47 is determined using the basic thicknesses $d_1$ and $d_2$ obtained by substituting the above-mentioned values of the basic amounts of phase change $\phi_1$ and $\phi_2$ into Equations (5a) and (5b) and substituting 618 nm, rather than the design wavelength $\lambda_t$, for $\lambda$ in Equations (5a) and (5b). FIG. 33 shows the wavelength dependence of the power reflectivity R in this case.

As illustrated in FIG. 33, the power reflectivity R falls within a range from 4.0% to 6.0% for the wavelength $\lambda$ ranging from 599 nm to 700 nm. The wavelength band for which the power reflectivity R falls within ±2% from the design reflectivity of 4% is also from 599 nm to 700 nm, to provide a wavelength bandwidth W of 101 nm. The center wavelength $\lambda_c$ of the wavelength band is 650 nm, which is equal to the design wavelength of 650 nm. The value obtained by dividing the wavelength bandwidth W (101 nm) by the center wavelength $\lambda_c$ (650 nm) is approximately 0.155, which is greater than 0.06 and shows that the wavelength band for which the power reflectivity R falls within the allowable reflectivity range is a wide band.

In this case, the thicknesses of the first to eighth layer films 39 to 46 of the coating film 47 are 38.03 nm, 191.59 nm, 61.27 nm, 145.61 nm, 32.25 nm, 76.63 nm, 66.10 nm and 157.10 nm, respectively. The optical thickness t of the coating film 47 is 1252.11 nm. This value is approximately 7.68 times the value $t_r$ (163 nm) which is a quarter of the center wavelength $\lambda_c$. Thus, the coating film 47 is a very thick film.

Figure 34:
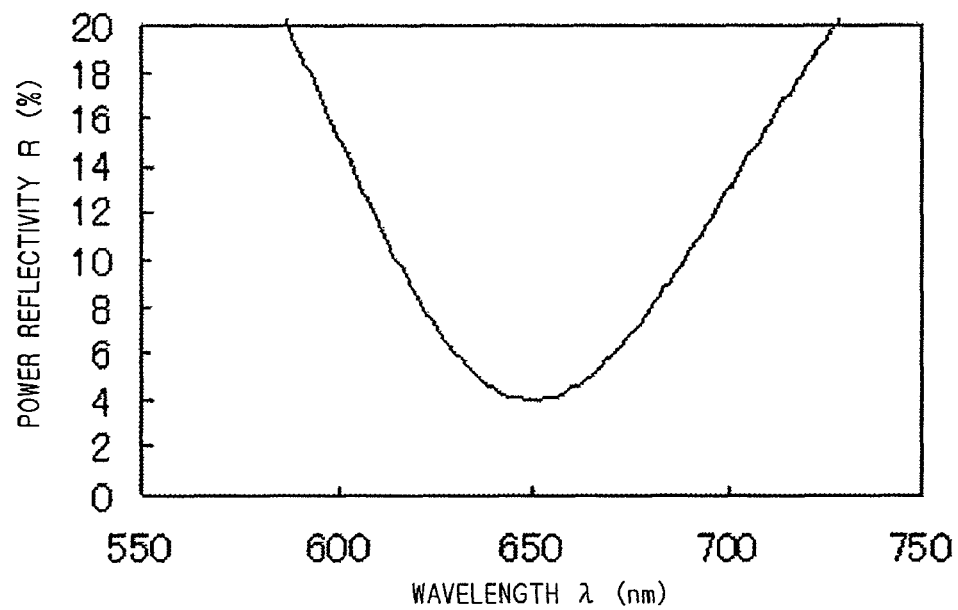
FIG. 34 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 4% for the wavelength $\lambda$ equal to $\lambda_c$ (650 nm) when the coating film 2 having the above-mentioned refractive index $n_f$ of "1.4989" and a thickness $d_f$ of five times 108.41 nm, i.e. five times $\lambda_c/(4n_f)$, is provided on the end surface 1b of the semiconductor photonic element 1. FIG. 34 shows the wavelength dependence of the power reflectivity R in this case. As illustrated in FIG. 34, the wavelength band for which the power reflectivity R falls within ±2% from the design reflectivity of 4% is from 631 nm to 670 nm, to provide a wavelength bandwidth $W_r$ of 39 nm.

Thus, even when the center wavelength $\lambda_c$ is made equal to the design wavelength $\lambda_r$, the wavelength bandwidth W (101 nm) for the coating film 47 is greater than the wavelength bandwidth $W_r$ (39 nm) for the coating film 2 shown in FIG. 2.

Seventh Preferred Embodiment

Figure 35:
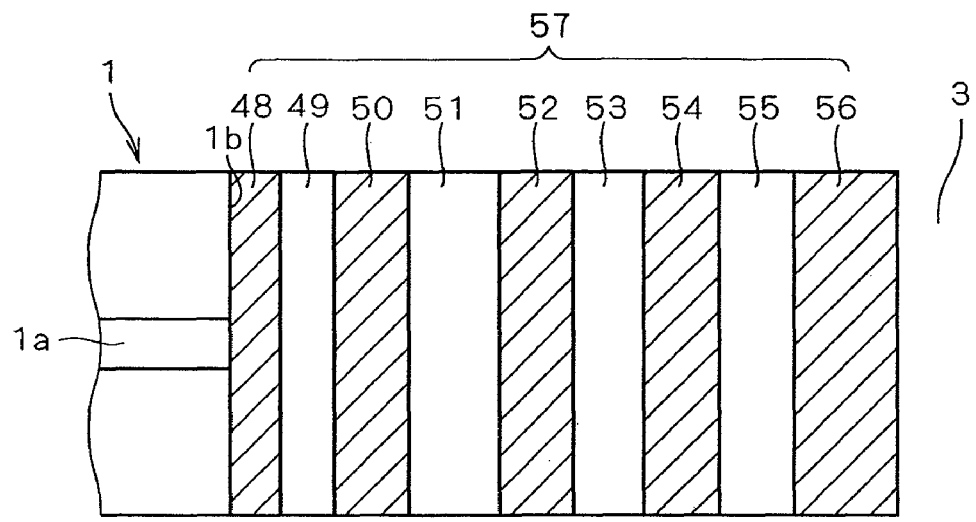
FIG. 35 is a side view showing a structure of the semiconductor photonic device according to a seventh preferred embodiment of the present invention.

FIG. 35 is a side view showing a structure of the semiconductor photonic device according to the seventh preferred embodiment of the present invention. A coating film 57 having a nine-layer structure is provided on the end surface 1b of the semiconductor photonic element 1 in the seventh preferred embodiment.

As illustrated in FIG. 35, the coating film 57 according to the seventh preferred embodiment of the present invention includes: a first layer film 48 having the refractive index $n_2$ and the thickness $Od_2$; a second layer film 49 having the refractive index $n_1$ and the thickness $Ad_1$; a third layer film 50 having the refractive index $n_2$ and the thickness $Ad_2$; a fourth layer film 51 having the refractive index $n_1$ and the thickness $Bd_1$; a fifth layer film 52 having the refractive index $n_2$ and the thickness $Bd_2$; a sixth layer film 53 having the refractive index $n_1$ and the thickness $Cd_1$; a seventh layer film 54 having the refractive index $n_2$ and the thickness $Cd_2$, an eighth layer film 55 having the refractive index $n_1$ and the thickness $Dd_1$; and a ninth layer film 56 having the refractive index $n_2$ and the thickness $Dd_2$.

Each of the first layer film 48, the third layer film 50, the fifth layer film 52, the seventh layer film 54 and the ninth layer film 56 is an alumina layer, and each of the second layer film 49, the fourth layer film 51, the sixth layer film 53 and the eighth layer film 55 is a tantalum oxide layer. Thus, the coating film 57 according to the seventh preferred embodiment is composed of two material layers: the alumina layer and the tantalum oxide layer.

In the seventh preferred embodiment, the second and third layer films 49 and 50, the fourth and fifth layer films 51 and 52, the sixth and seventh layer films 53 and 54, and the eighth and ninth layer films 55 and 56 constitute unit layer pairs each composed of the alumina layer and the tantalum oxide layer arranged in a stacked relation. The reference characters A, B, C and D which determine the thicknesses of the second to ninth layer films 49 to 56 of the coating film 57 designate parameters individually determined for the respective unit layer pairs and each indicating a contribution ratio of the thickness of a corresponding unit layer pair to the thickness of the entire coating film 57. The reference character O which determines the thickness of the first layer film 48 designates a parameter indicating a contribution ratio of the thickness of the first layer film 48 to the thickness of the entire coating film 57. The reference characters $d_1$ and $d_2$ according to the seventh preferred embodiment also designate basic thicknesses individually determined for the respective material layers.

The amounts of phase change for the first to ninth layer films 48 to 56 are designated by $O\phi_2$, $A\phi_1$, $A\phi_2$, $B\phi_1$, $B\phi_2$, $C\phi_1$, $C\phi_2$, $D\phi_1$ and $D\phi_2$, respectively, using Equations (5a) and (5b). Therefore, the elements $m_{11}$, $m_{12}$, $m_{21}$ and $m_{22}$ of a characteristic matrix for the coating film 57 according to the seventh preferred embodiment satisfy the following determinant:

$$\begin{bmatrix} m_{11} & m_{12} \\ m_{21} & m_{22} \end{bmatrix} = \begin{bmatrix} \cos O\phi_2 & -\frac{i}{n_2}\sin O\phi_2 \\ -in_2\sin O\phi_2 & \cos O\phi_2 \end{bmatrix} \times \qquad (7g)$$

$$\begin{bmatrix} \cos A\phi_1 & -\frac{i}{n_1}\sin A\phi_1 \\ -in_1\sin A\phi_1 & \cos A\phi_1 \end{bmatrix} \begin{bmatrix} \cos A\phi_2 & -\frac{i}{n_2}\sin A\phi_2 \\ -in_2\sin A\phi_2 & \cos A\phi_2 \end{bmatrix} \times$$

$$\begin{bmatrix} \cos B\phi_1 & -\frac{i}{n_1}\sin B\phi_1 \\ -in_1\sin B\phi_1 & \cos B\phi_1 \end{bmatrix} \begin{bmatrix} \cos B\phi_2 & -\frac{i}{n_2}\sin B\phi_2 \\ -in_2\sin B\phi_2 & \cos B\phi_2 \end{bmatrix} \times$$

$$\begin{bmatrix} \cos C\phi_1 & -\frac{i}{n_1}\sin C\phi_1 \\ -in_1\sin C\phi_1 & \cos C\phi_1 \end{bmatrix}$$

$$\begin{bmatrix} \cos C\phi_2 & -\frac{i}{n_2}\sin C\phi_2 \\ -in_2\sin C\phi_2 & \cos C\phi_2 \end{bmatrix} \times$$

$$\begin{bmatrix} \cos D\phi_1 & -\frac{i}{n_1}\sin D\phi_1 \\ -in_1\sin D\phi_1 & \cos D\phi_1 \end{bmatrix}$$

$$\begin{bmatrix} \cos D\phi_2 & -\frac{i}{n_2}\sin D\phi_2 \\ -in_2\sin D\phi_2 & \cos D\phi_2 \end{bmatrix}$$

For designing the thickness of the coating film 57 so that the value of the amplitude reflectivity r is an imaginary number, the seventh preferred embodiment previously determines the values of the parameters A, B, C, D and O, and executes Steps s1 to s5 using Equations (6) and (7g) described above to determine the values of the basic amounts of phase change $\phi_1$ and $\phi_2$. Thereafter, Step s6 is executed to determine the values of the basic thicknesses $d_1$ and $d_2$, and the thicknesses of the respective layers of the coating film 57 are determined using the previously determined values of the parameters A, B, C, D and O and the values of the basic thicknesses $d_1$ and $d_2$ determined in Step s6. If the designed characteristic of the coating film 57 is insufficient, the basic thicknesses $d_1$ and $d_2$ are determined again by changing the parameters A, B, C, D and O, and the thickness of the coating film 57 is designed again.

In the seventh preferred embodiment, the effective refractive index $n_c$ of the semiconductor photonic element 1 is "3.37." The refractive indices $n_1$ and $n_2$ are "2.057" and "1.620," respectively. The design wavelength $\lambda_t$ is 980 nm.

For designing the thickness of the coating film 57 having the power reflectivity R of 4% ($R_t=4\%$) when the wavelength $\lambda$ equals the design wavelength of 980 nm under the above-mentioned conditions, a point which provides a phase angle $\theta$ of 240 degrees is selected, for example, in Step s1 so that the reflection amplitude vector rv is located in the third quadrant (or the lower left quadrant) of the complex plane. Then, the values of the real and imaginary parts $r_r$ and $r_i$ of the complex number inputted as the value of the amplitude reflectivity r are "−0.1" and "−0.17320508," respectively, in Step s2.

When O=0.46, A=1.44, B=2.00, C=2.00 and D=2.00 are set, the basic amounts of phase change $\phi_1$ and $\phi_2$ determined in Step s5 are "1.15080" and "0.506897," respectively. Accordingly, the thicknesses of the first to ninth layer films 48 to 56 determined in Step s6 are 22.45 nm, 125.65 nm, 70.28 nm, 174.52 nm, 97.61 nm, 174.52 nm, 97.61 nm, 174.52 nm and 97.61 nm, respectively.

Figure 36:
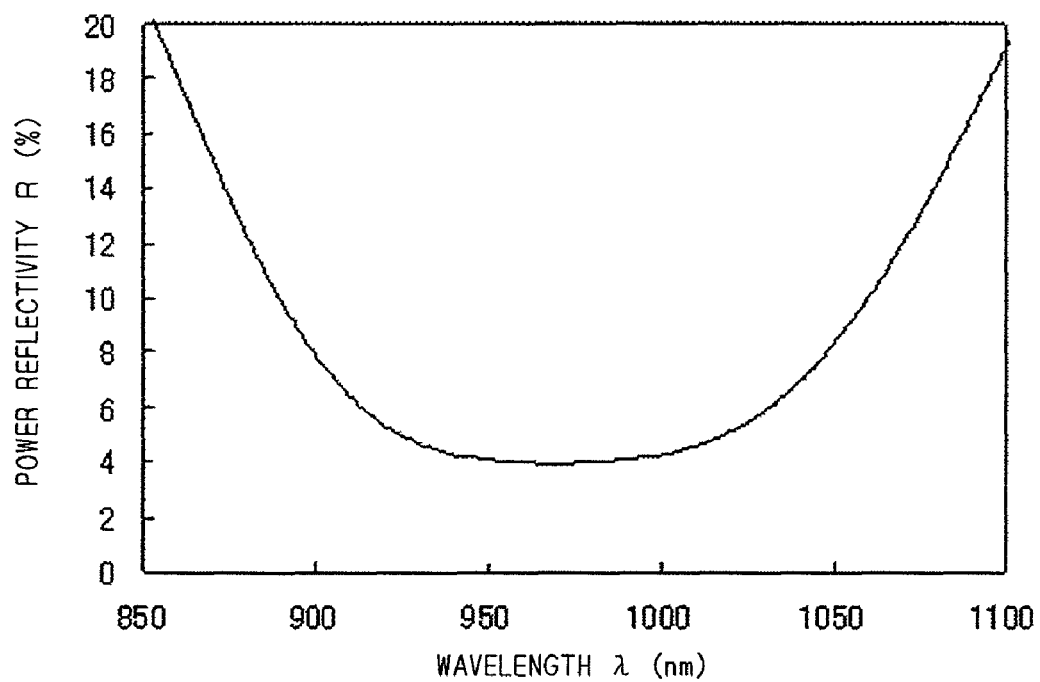
FIG. 36 is a graph showing the wavelength dependence of the power reflectivity of a coating film according to the seventh preferred embodiment of the present invention.

FIG. 36 shows the wavelength dependence of the power reflectivity R of the coating film 57 thus designed. As illustrated in FIG. 36, the power reflectivity R is 4% when the wavelength λ equals the design wavelength of 980 nm. A wavelength band for which the power reflectivity R is approximately equal to the design reflectivity of 4% is wide. The power reflectivity R falls within a range from 4.0% to 6.0% for the wavelength λ ranging from 913 nm to 1031 nm.

When the allowable reflectivity range is, for example, ±2% from the design reflectivity of 4%, the wavelength band for which the power reflectivity R falls within the allowable reflectivity range is also from 913 nm to 1031 nm, to provide a wavelength bandwidth W of 118 nm. The center wavelength $\lambda_c$ of the wavelength band is 972 nm. The value obtained by dividing the wavelength bandwidth W by the center wavelength $\lambda_c$ is approximately 0.121, which is greater than 0.06. It may be said that the wavelength band for which the power reflectivity R falls within the allowable reflectivity range is a wide band.

Because the thicknesses of the first to ninth layer films 48 to 56 take on the above-mentioned values, the optical thickness t of the coating film 57, i.e. the sum of the products of the refractive indices and thicknesses of the respective layers of the coating film 57, is 1960.03 nm. This value is approximately 8.07 times the value $t_r$ (243 nm) which is a quarter of the center wavelength $\lambda_c$. Thus, the coating film 57 is a very thick film. This improves heat dissipation characteristics at the end surface 1b of the semiconductor photonic element 1 to suppress the increase in temperature of the end surface 1b.

Figure 37:
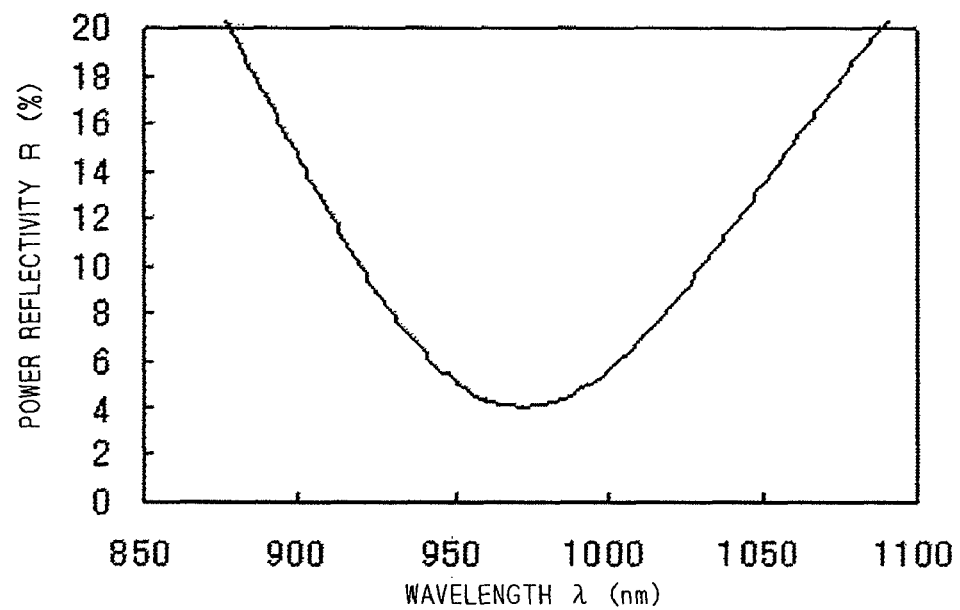
FIG. 37 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 4% for the wavelength λ equal to $\lambda_c$ (972 nm) when the coating film 2 having the refractive index $n_f$ of "1.4989" as in the first preferred embodiment and a thickness $d_f$ of five times 162.12 nm, i.e. five times $\lambda_c/(4n_f)$, is provided on the end surface 1b of the semiconductor photonic element 1. FIG. 37 shows the wavelength dependence of the power reflectivity R in this case. As illustrated in FIG. 37, the wavelength band for which the power reflectivity R falls within ±2% from the design reflectivity of 4% is from 943 nm to 1003 nm, to provide a wavelength bandwidth $W_r$ of 60 nm.

Thus, the wavelength bandwidth W (118 nm) for the coating film 57 of the seventh preferred embodiment is greater than the wavelength bandwidth $W_r$ (60 nm) for the coating film 2 shown in FIG. 2.

Figure 38:
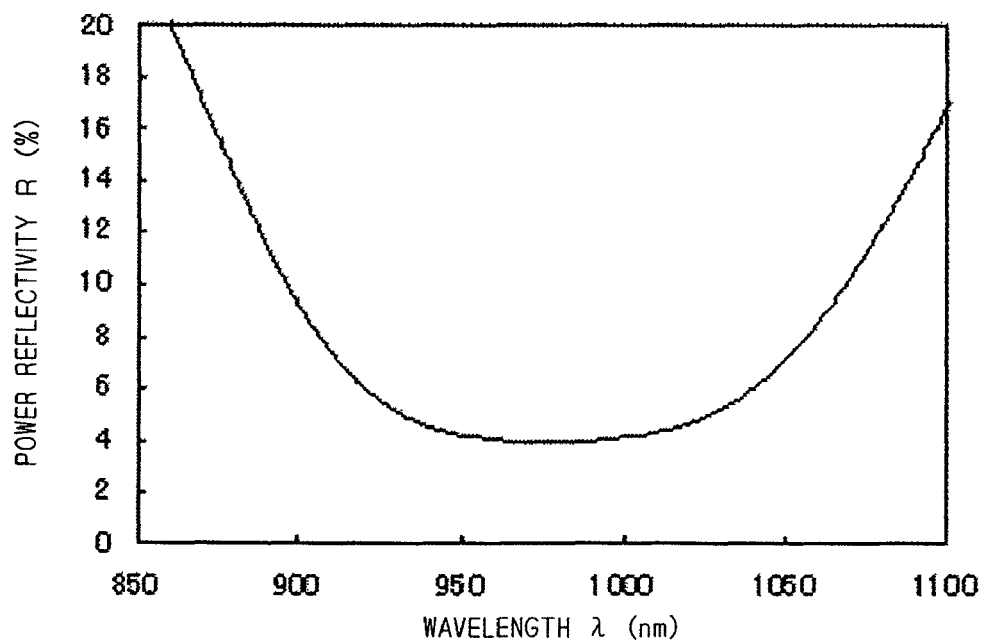
FIG. 38 is a graph showing the wavelength dependence of the power reflectivity of the coating film according to the seventh preferred embodiment of the present invention.

Because the wavelength λ of light propagating through the active layer 1a is sometimes varied, it is desirable that the center wavelength $\lambda_c$ of the wavelength band for which the power reflectivity R falls within the allowable reflectivity range be equal to or close to the design wavelength $\lambda_t$. For example, the center wavelength $\lambda_c$ takes on a value equal to the design wavelength $\lambda_t$ of 980 nm when the thickness of the coating film 57 is determined using the basic thicknesses $d_1$ and $d_2$ obtained by setting the basic amounts of phase change $\phi_1$ and $\phi_2$ at "1.15080" and "0.506897," respectively, in a similar manner to the above instance and substituting 988 nm, rather than the design wavelength $\lambda_t$, for λ in Equations (5a) and (5b). FIG. 38 shows the wavelength dependence of the power reflectivity R in this case.

As illustrated in FIG. 38, the power reflectivity R falls within a range from 4.0% to 6.0% for the wavelength λ ranging from 921 nm to 1039 nm. The wavelength band for which the power reflectivity R falls within ±2% from the design reflectivity of 4% is also from 921 nm to 1039 nm, to provide a wavelength bandwidth W of 118 nm. The center wavelength $\lambda_c$ of the wavelength band is 980 nm, which is equal to the design wavelength of 980 nm. The value obtained by dividing the wavelength bandwidth W (118 nm) by the center wavelength $\lambda_c$ (980 nm) is approximately 0.120, which is greater than 0.06 and shows that the wavelength band for which the power reflectivity R falls within the allowable reflectivity range is a wide band.

In this case, the thicknesses of the first to ninth layer films 48 to 56 of the coating film 57 are 22.63 nm, 126.68 nm, 70.85 nm, 175.94 nm, 98.40 nm, 175.94 nm, 98.40 nm, 175.94 nm and 98.40 nm, respectively. The optical thickness t of the coating film 57 is 1975.97 nm. This value is approximately 8.07 times the value $t_r$ (245 nm) which is a quarter of the center wavelength $\lambda_c$. Thus, the coating film 57 is a very thick film.

The semiconductor photonic device shown in FIG. 2 will be considered for comparison. For the semiconductor photonic device shown in FIG. 2, the power reflectivity R is 4% for the wavelength λ equal to $\lambda_c$ (980 n) when the coating film 2 having the above-mentioned refractive index $n_f$ of "1.4989" and a thickness $d_f$ of five times 163.45 nm, i.e. five times $\lambda_c/(4n_f)$, is provided on the end surface 1b of the semiconductor photonic element 1. The wavelength dependence of the power reflectivity R in this case is substantially similar to that shown in FIG. 10 described above. As illustrated in FIG. 10, the wavelength band for which the power reflectivity R falls within ±2% from the design reflectivity of 4% is from 951 nm to 1011 nm, to provide a wavelength bandwidth $W_r$ of 60 nm.

Thus, even when the center wavelength $\lambda_c$ is made equal to the design wavelength $\lambda_t$, the wavelength bandwidth W (118 nm) for the coating film 57 is greater than the wavelength bandwidth $W_r$ (60 nm) for the coating film 2 shown in FIG. 2.

Eighth Preferred Embodiment

Figure 39:
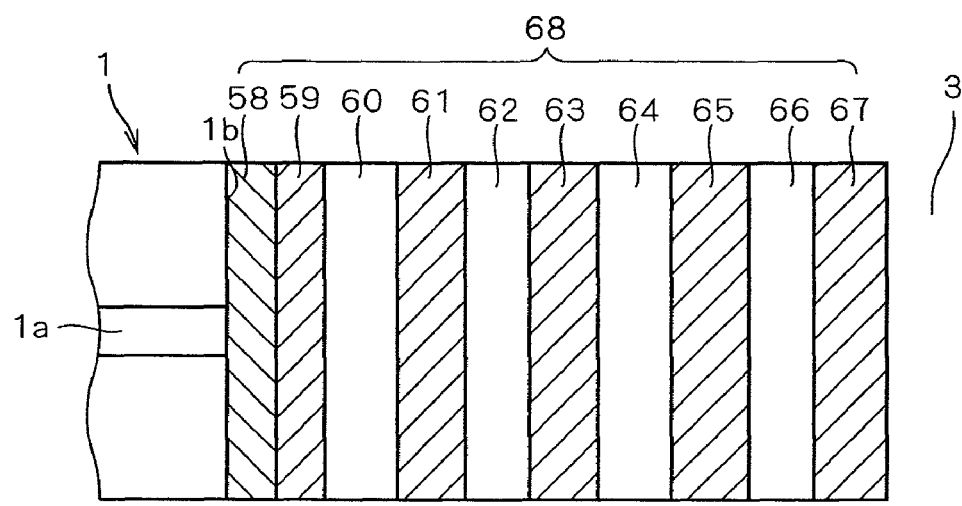
FIG. 39 is a side view showing a structure of the semiconductor photonic device according to an eighth preferred embodiment of the present invention.

FIG. 39 is a side view showing a structure of the semiconductor photonic device according to the eighth preferred embodiment of the present invention. A coating film 68 having a ten-layer structure is provided on the end surface 1b of the semiconductor photonic element 1 in the eighth preferred embodiment.

As illustrated in FIG. 39, the coating film 68 according to the eighth preferred embodiment of the present invention includes: a first layer film 58 having the refractive index $n_3$ and the thickness $d_3$; a second layer film 59 having the refractive index $n_2$ and the thickness $Ad_2$; a third layer film 60 having the refractive index $n_1$ and the thickness $Bd_1$; a fourth layer film 61 having the refractive index $n_2$ and the thickness $Bd_2$; a fifth layer film 62 having the refractive index $n_1$ and the thickness $Cd_1$; a sixth layer film 63 having the refractive index $n_2$ and the thickness $Cd_2$; a seventh layer film 64 having the refractive index $n_1$ and the thickness $Dd_1$; an eighth layer film 65 having the refractive index $n_2$ and the thickness $Dd_2$; a ninth layer film 66 having the refractive index $n_1$ and a thickness $Ed_1$; and a tenth layer film 67 having the refractive index $n_2$ and a thickness $Ed_2$.

The first layer film 58 is an alumina layer. Each of the second layer film 59, the fourth layer film 61, the sixth layer film 63, the eighth layer film 65 and the tenth layer film 67 is a silicon oxide layer. Each of the third layer film 60, the fifth layer film 62, the seventh layer film 64 and the ninth layer film 66 is an aluminum nitride layer. Thus, the coating film 68 according to the eighth preferred embodiment is composed of three material layers: the alumina layer, the silicon oxide layer, and the aluminum nitride layer.

In the eighth preferred embodiment, the third and fourth layer films 60 and 61, the fifth and sixth layer films 62 and 63, the seventh and eighth layer films 64 and 65, and the ninth and tenth layer films 66 and 67 constitute unit layer pairs each composed of the silicon oxide layer and the aluminum nitride layer arranged in a stacked relation. The reference characters B, C, D and E which determine the thicknesses of the third to tenth layer films 60 to 67 of the coating film 68 designate parameters individually determined for the respective unit layer pairs and each indicating a contribution ratio of the thickness of a corresponding unit layer pair to the thickness of the entire coating film 68. The reference character A which determines the thickness of the second layer film 59 designates a parameter indicating a contribution ratio of the thickness of the second layer film 59 to the thickness of the entire coating film 68. The reference characters $d_1$ and $d_2$ according to the eighth preferred embodiment also designate basic thicknesses individually determined for the respective material layers.

The amounts of phase change for the second to tenth layer films 59 to 67 are designated by $A\phi_2$, $B\phi_1$, $B\phi_2$, $C\phi_1$, $C\phi_2$, $D\phi_1$, $D\phi_2$, $E\phi_1$ and $E\phi_2$, respectively, using Equations (5a) and (5b). The amount of phase change $\phi_3$ for the first layer film 58 is expressed by Equation (9) described above. Therefore, the elements $m_{11}$, $m_{12}$, $m_{21}$ and $m_{22}$ of a characteristic matrix for the coating film 68 according to the eighth preferred embodiment satisfy the following determinant:

$$\begin{bmatrix} m_{11} & m_{12} \\ m_{21} & m_{22} \end{bmatrix} = \begin{bmatrix} \cos\phi_3 & -\frac{i}{n_3}\sin\phi_3 \\ -in_3\sin\phi_3 & \cos\phi_3 \end{bmatrix} \quad (7h)$$

$$\begin{bmatrix} \cos A\phi_2 & -\frac{i}{n_2}\sin A\phi_2 \\ -in_2\sin A\phi_2 & \cos A\phi_2 \end{bmatrix} \times$$

$$\begin{bmatrix} \cos B\phi_1 & -\frac{i}{n_1}\sin B\phi_1 \\ -in_1\sin B\phi_1 & \cos B\phi_1 \end{bmatrix} \begin{bmatrix} \cos B\phi_2 & -\frac{i}{n_2}\sin B\phi_2 \\ -in_2\sin B\phi_2 & \cos B\phi_2 \end{bmatrix} \times$$

$$\begin{bmatrix} \cos C\phi_1 & -\frac{i}{n_1}\sin C\phi_1 \\ -in_1\sin C\phi_1 & \cos C\phi_1 \end{bmatrix} \begin{bmatrix} \cos C\phi_2 & -\frac{i}{n_2}\sin C\phi_2 \\ -in_2\sin C\phi_2 & \cos C\phi_2 \end{bmatrix} \times$$

$$\begin{bmatrix} \cos D\phi_1 & -\frac{i}{n_1}\sin D\phi_1 \\ -in_1\sin D\phi_1 & \cos D\phi_1 \end{bmatrix}$$

$$\begin{bmatrix} \cos D\phi_2 & -\frac{i}{n_2}\sin D\phi_2 \\ -in_2\sin D\phi_2 & \cos D\phi_2 \end{bmatrix} \times$$

$$\begin{bmatrix} \cos E\phi_1 & -\frac{i}{n_1}\sin E\phi_1 \\ -in_1\sin E\phi_1 & \cos E\phi_1 \end{bmatrix}$$

$$\begin{bmatrix} \cos E\phi_2 & -\frac{i}{n_2}\sin E\phi_2 \\ -in_2\sin E\phi_2 & \cos E\phi_2 \end{bmatrix}$$

For designing the thickness of the coating film 68 so that the value of the amplitude reflectivity r is an imaginary number, the eighth preferred embodiment previously determines the values of the parameters A, B, C, D and E, and previously determines the thickness $d_3$ of the first layer film 58, thereby to handle the value of the amount of phase change $\phi_3$ as a known value. Steps s1 to s5 are executed using Equations (6) and (7h) described above to determine the values of the basic amounts of phase change $\phi_1$ and $\phi_2$. Thereafter, Step s6 is executed to determine the values of the basic thicknesses $d_1$ and $d_2$, and the thicknesses of the second to tenth layer films 59 to 67 of the coating film 68 are determined using the previously determined values of the parameters A, B, C, D and E and the values of the basic thicknesses $d_1$ and $d_2$ determined in Step s6. If the designed characteristic of the coating film 68 is insufficient, the basic thicknesses $d_1$ and $d_2$ are determined again by changing the parameters A, B, C, D and E or the thickness $d_3$, and the thickness of the coating film 68 is designed again.

In the eighth preferred embodiment, the effective refractive index $n_c$ of the semiconductor photonic element 1 is "3.37." The refractive indices $n_1$ to $n_3$ are "2.072," "1.480" and "1.620," respectively. The design wavelength $\lambda_t$ is 808 nm.

For designing the thickness of the coating film 68 having the power reflectivity R of 4% when the wavelength $\lambda$ equals the design wavelength of 808 nm under the above-mentioned conditions, a point which provides a phase angle $\theta$ of 315 degrees is selected, for example, in Step s1 so that the reflection amplitude vector rv is located in the fourth quadrant (or the lower right quadrant) of the complex plane. Then, the values of the real and imaginary parts $r_r$ and $r_i$ of the complex number inputted as the value of the amplitude reflectivity r are "+0.141421356" and "−0.141421356," respectively, in Step s2.

When A=0.63, B=1.87, C=2.01, D=2.00, E=2.00 and $d_3$=40.0 nm are set, the basic amounts of phase change $\phi_1$ and $\phi_2$ determined in Step s5 are "0.219827" and "1.23802," respectively. Accordingly, the thicknesses of the second to tenth layer films 59 to 67 determined in Step s6 are 67.77 nm, 25.51 nm, 201.16 nm, 27.42 nm, 216.22 nm, 27.29 nm, 215.14 nm, 27.29 nm and 215.14 nm, respectively.

Figure 40:
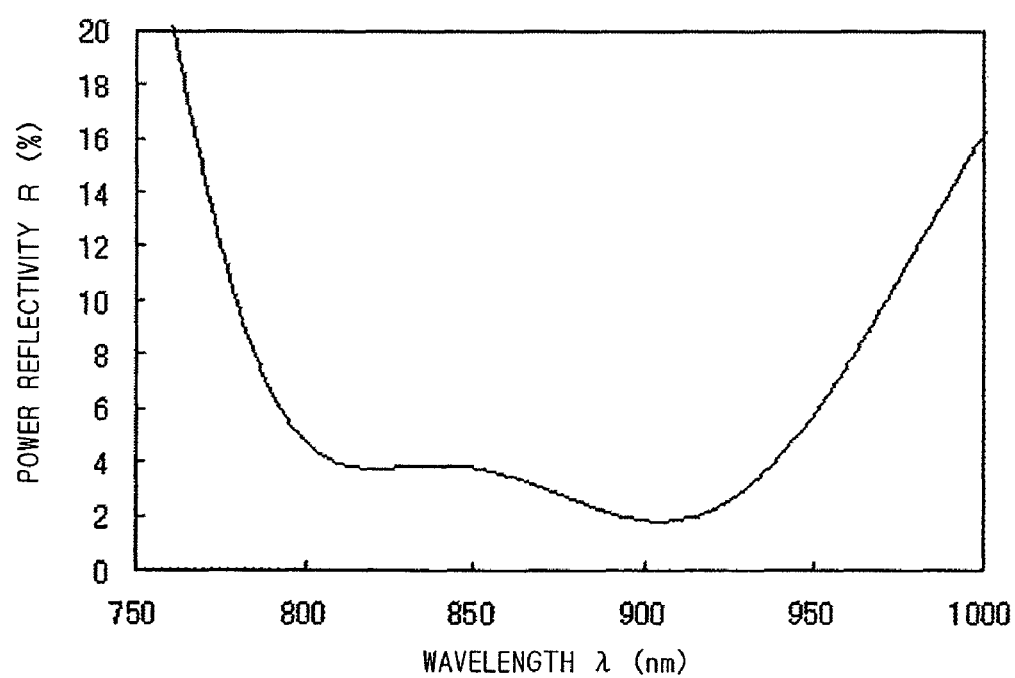
FIG. 40 is a graph showing the wavelength dependence of the power reflectivity of a coating film according to the eighth preferred embodiment of the present invention.

FIG. 40 shows the wavelength dependence of the power reflectivity R of the coating film 68 thus designed. As illustrated in FIG. 40, the power reflectivity R is 4% when the wavelength $\lambda$ equals the design wavelength of 808 nm. A wavelength band for which the power reflectivity R is approximately equal to the design reflectivity of 4% is wide. The power reflectivity R falls within a range from 4.0% to 6.0% for the wavelength $\lambda$ ranging from 793 nm to 893 nm.

When the allowable reflectivity range is, for example, ±2% from the design reflectivity of 4%, the wavelength band for which the power reflectivity R falls within the allowable reflectivity range is also from 793 nm to 893 nm, to provide a the wavelength bandwidth W of 100 nm. The center wavelength $\lambda_c$ of the wavelength band is 843 nm. The value obtained by dividing the wavelength bandwidth W by the center wavelength $\lambda_c$ is approximately 0.119, which is greater than 0.06. It may be said that the wavelength band for which the power reflectivity R falls within the allowable reflectivity range is a wide band.

Because the thicknesses of the first to tenth layer films 58 to 67 take on the above-mentioned values, the optical thickness t of the coating film 68, i.e. the sum of the products of the refractive indices and thicknesses of the respective layers of the coating film 68, is 1642.40 nm. This value is approximately 7.78 times the value $t_r$ (211 nm) which is a quarter of the center wavelength $\lambda_c$. Thus, the coating film 68 is a very thick film. This improves heat dissipation characteristics at the end surface 1b of the semiconductor photonic element 1 to suppress the increase in temperature of the end surface 1b.

Figure 41:
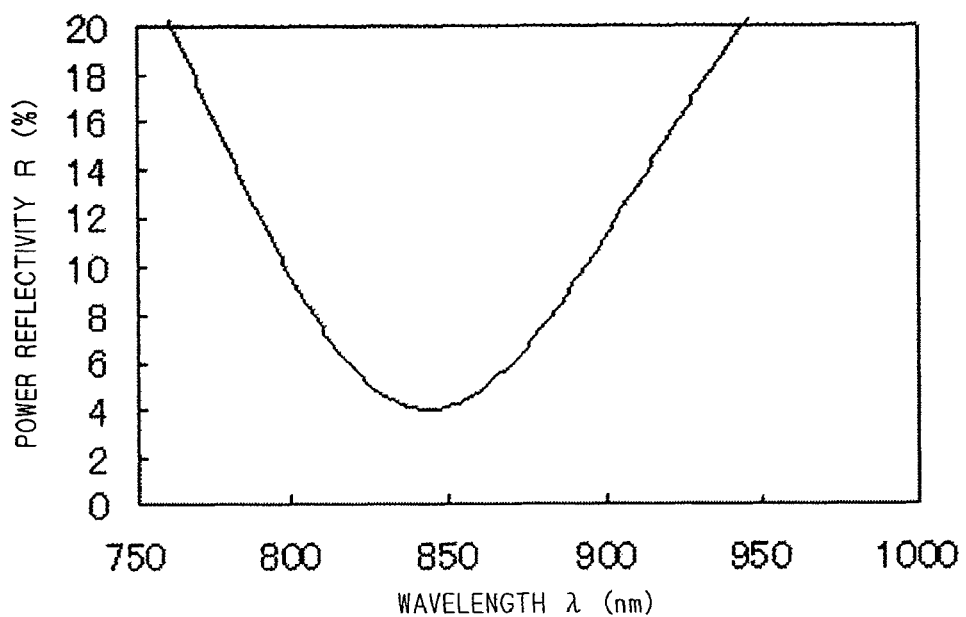
FIG. 41 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 4% for the wavelength λ equal to $\lambda_c$ (843 nm) when the coating film 2 having the refractive index $n_f$ of "1.4989" as in the first preferred embodiment and a thickness $d_f$ of five times 140.60 nm, i.e. five times $\lambda_c/(4n_f)$, is provided on the end surface 1b of the semiconductor photonic element 1. FIG. 41 shows the wavelength dependence of the power reflectivity R in this case. As illustrated in FIG. 41, the wavelength band for which the power reflectivity R falls within ±2% from the design reflectivity of 4% is from 818 nm to 870 nm, to provide a wavelength bandwidth $W_r$ of 52 nm.

Thus, the wavelength bandwidth W (100 nm) for the coating film 68 of the eighth preferred embodiment is greater than the wavelength bandwidth $W_r$ (52 nm) for the coating film 2 shown in FIG. 2.

Figure 42:
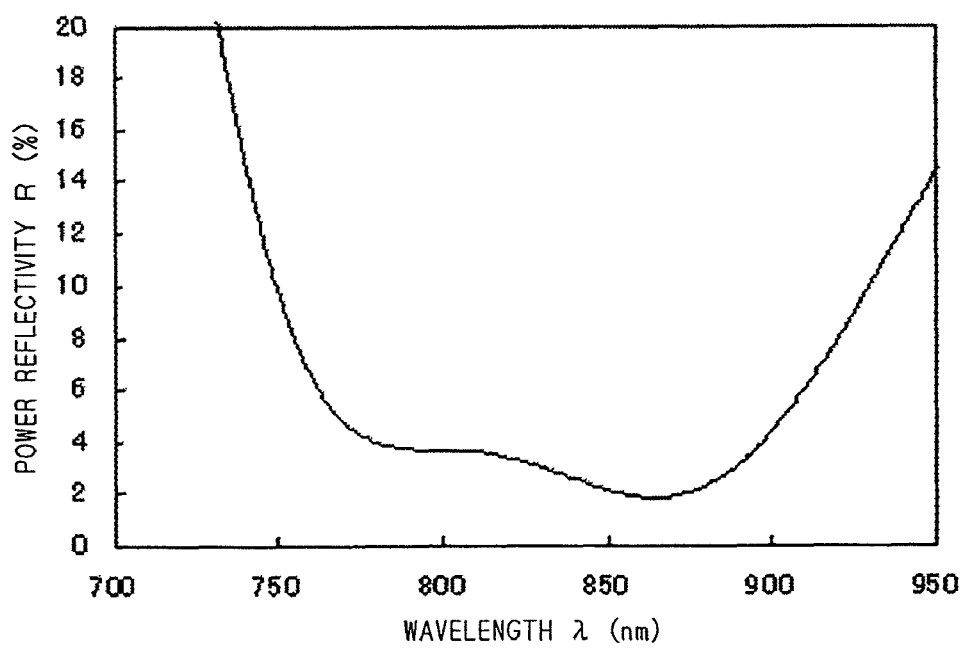
FIG. 42 is a graph showing the wavelength dependence of the power reflectivity of the coating film according to the eighth preferred embodiment of the present invention.

Because the wavelength λ of light propagating through the active layer 1a is sometimes varied, it is desirable that the center wavelength $\lambda_c$ of the wavelength band for which the power reflectivity R falls within the allowable reflectivity range be equal to or close to the design wavelength $\lambda_t$. For example, when $d_3$=40.47 nm, A=0.63, B=1.87, C=1.96, D=2.00 and E=2.00 are set, the basic amounts of phase change $\phi_1$ and $\phi_2$ are "0.235529" and "1.21623," respectively. The center wavelength $\lambda_c$ takes on a value equal to the design wavelength of 808 nm when the thickness of the coating film 68 is determined using the basic thicknesses $d_1$ and $d_2$ obtained by substituting the above-mentioned values of the basic amounts of phase change $\phi_1$ and $\phi_2$ into Equations (5a) and (5b) and substituting 779 nm, rather than the design wavelength $\lambda_t$, for λ in Equations (5a) and (5b). FIG. 42 shows the wavelength dependence of the power reflectivity R in this case.

As illustrated in FIG. 42, the power reflectivity R falls within a range from 2.0% to 6.0% for the wavelength λ ranging from 763 nm to 853 nm. The wavelength band for which the power reflectivity R falls within ±2% from the design reflectivity of 4% is also from 763 nm to 853 nm, to provide a wavelength bandwidth W of 90 nm. The center wavelength $\lambda_c$ of the wavelength band is 808 nm, which is equal to the design wavelength of 808 nm. The value obtained by dividing the wavelength bandwidth W (90 nm) by the center wavelength $\lambda_c$ (808 nm) is approximately 0.111, which is greater than 0.06 and shows that the wavelength band for which the power reflectivity R falls within the allowable reflectivity range is a wide band.

In this case, the thicknesses of the first to tenth layer films 58 to 67 of the coating film 68 are 40.47 nm, 64.19 nm, 26.35 nm, 190.53 nm, 27.62 nm, 199.70 nm, 28.19 nm, 203.77 mm, 28.19 nm and 203.77 ml, respectively. The optical thickness t of the coating film 68 is 1569.91 nm. This value is approximately 7.77 times the value $t_r$ (202 nm) which is a quarter of the center wavelength $\lambda_c$. Thus, the coating film 68 is a very thick film.

The semiconductor photonic device shown in FIG. 2 will be considered for comparison. For the semiconductor photonic device shown in FIG. 2, the power reflectivity R is 4% for the wavelength λ equal to $\lambda_c$ (808 nm) when the coating film 2 having the above-mentioned refractive index $n_f$ of "1.4989" and a thickness $d_f$ of five times 134.77 nm, i.e. five times $\lambda_c/(4n_f)$, is provided on the end surface 1b of the semiconductor photonic element 1. FIG. 43 shows the wavelength dependence of the power reflectivity R in this case. As illustrated in FIG. 43, the wavelength band for which the power reflectivity R falls within ±2% from the design reflectivity of 4% is from 774 nm to 834 nm, to provide a wavelength bandwidth $W_r$ of 60 nm.

Thus, even when the center wavelength $\lambda_c$ is made equal to the design wavelength $\lambda_t$, the wavelength bandwidth W (90 nm) for the coating film 68 is greater than the wavelength bandwidth $W_r$ (60 nm) for the coating film 2 shown in FIG. 2.

Ninth Preferred Embodiment

FIG. 44 shows the wavelength dependence of the power reflectivity R of the coating film 13 in the semiconductor photonic device according to the ninth preferred embodiment of the present invention. The semiconductor photonic device according to the ninth preferred embodiment is similar to the semiconductor photonic device according to the first preferred embodiment except that the design wavelength $\lambda_c$ is changed from 980 nm to 1310 nm.

For designing the thickness of the coating film 13 having a power reflectivity R of 8% ($R_t$=8%) when the wavelength λ equals the design wavelength of 1310 nm, a point which provides a phase angle θ of 30 degrees is selected, for example, in Step s1 so that the reflection amplitude vector rv is located in the first quadrant (or the upper right quadrant) of the complex plane according to the ninth preferred embodiment. Then, because the magnitude of the complex number at the selected point is 0.282842712, the values of the real and imaginary parts $r_r$ and $r_i$ of the complex number inputted as the value of the amplitude reflectivity r are "+0.244948974" and "+0.141421356," respectively, in Step s2.

When A=3.15, B=2.54 and C=2.05 are set, the basic amounts of phase change $\phi_1$ and $\phi_2$ determined in Step s5 are "1.23348" and "0.560095," respectively. Accordingly, the thicknesses of the first to sixth layer films 7 to 12 determined in Step s6 are 393.82 nm, 248.54 nm, 317.56 nm, 200.41 nm, 256.30 nm and 161.75 nm, respectively.

FIG. 44 described above shows the wavelength dependence of the power reflectivity R of the coating film 13 thus designed. As illustrated in FIG. 44, the power reflectivity R is 8% when the wavelength λ equals the design wavelength of 1310 nm. A wavelength band for which the power reflectivity R is approximately equal to the design reflectivity of 8% is wide. The power reflectivity R falls within a range from 6.5% to 10.0% for the wavelength λ ranging from 1059 nm to 1509 nm.

When the allowable reflectivity range is, for example, ±2% from the design reflectivity of 8%, the wavelength band for which the power reflectivity R falls within the allowable reflectivity range is also from 1059 nm to 1509 nm, to provide a wavelength bandwidth W of 450 nm. The center wavelength $\lambda_c$ of the wavelength band is 1284 nm. The value obtained by dividing the wavelength bandwidth W by the center wavelength $\lambda_c$ is approximately 0.356, which is greater than 0.06. It may be said that the wavelength band for which the power reflectivity R falls within the allowable reflectivity range is a wide band.

Because the thicknesses of the first to sixth layer films 7 to 12 take on the above-mentioned values, the optical thickness t of the coating film 13, i.e. the sum of the products of the refractive indices and thicknesses of the respective layers of the coating film 13, is 2894.35 nm. This value is approximately 9.02 times the value $t_r$ (321 nm) which is a quarter of the center wavelength $\lambda_c$. Thus, the coating film 13 is a very thick film. This improves heat dissipation characteristics at the end surface 1b of the semiconductor photonic element 1 to suppress the increase in temperature of the end surface 1b.

Figure 45:
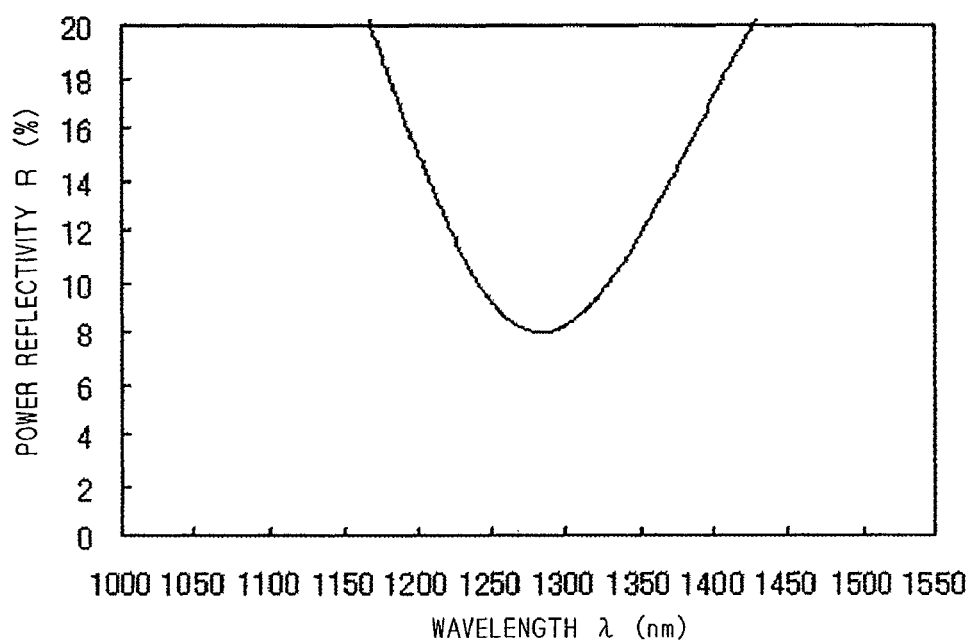
FIG. 45 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 8% for the wavelength λ equal to λ$_c$ (1284 nm) when the coating film 2 having a refractive index n$_f$ of "1.3726" and a thickness d$_f$ of five times 223.86 nm, i.e. five times λ$_c$/(4n$_f$), is provided on the end surface 1b of the semiconductor photonic element 1. FIG. 45 shows the wavelength dependence of the power reflectivity R in this case. As illustrated in FIG. 45, the wavelength band for which the power reflectivity R falls within ±2% from the design reflectivity of 8% is from 1241 nm to 1330 nm, to provide a wavelength bandwidth W$_r$ of 89 nm.

The above-mentioned value "1.3726" of the refractive index n$_f$ is obtained by substituting R$_t$=0.08 and n$_c$=3.37 into Equation (8).

Thus, the wavelength bandwidth W (450 nm) for the coating film 13 of the ninth preferred embodiment is greater than the wavelength bandwidth W$_r$ (89 nm) for the coating film 2 shown in FIG. 2.

Figure 46:
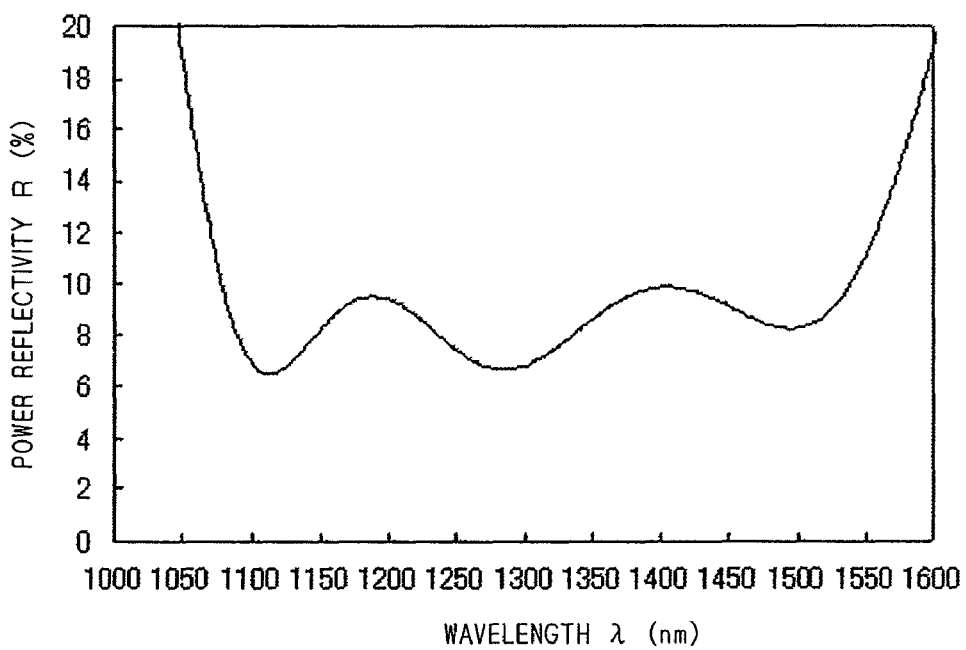
FIG. 46 is a graph showing the wavelength dependence of the power reflectivity of the coating film according to the ninth preferred embodiment of the present invention.

As mentioned above, because the wavelength λ of light propagating through the active layer 1a is sometimes varied, it is desirable that the center wavelength λ$_c$ of the wavelength band for which the power reflectivity R falls within the allowable reflectivity range be equal to or close to the design wavelength λ$_t$. For example, the center wavelength λ$_c$ takes on a value equal to the design wavelength λ$_t$ of 1310 n when the thickness of the coating film 13 is determined using the basic thicknesses d$_1$ and d$_2$ obtained by setting the basic amounts of phase change φ$_1$ and φ$_2$ at "1.23348" and "0.560095," respectively, in a similar manner to the above instance and substituting 1336 nm, rather than the design wavelength λ$_t$, for λ in Equations (5a) and (5b). FIG. 46 shows the wavelength dependence of the power reflectivity R in this case.

As illustrated in FIG. 46, the power reflectivity R falls within a range from 6.5% to 10.0% for the wavelength λ ranging from 1080 nm to 1539 nm. The wavelength band for which the power reflectivity R falls within ±2% from the design reflectivity of 8% is also from 1080 nm to 1539 nm, to provide a wavelength bandwidth W of 459 nm. The center wavelength λ$_c$ of the wavelength band is 1310 nm, which is equal to the design wavelength of 1310 nm. The value obtained by dividing the wavelength bandwidth W (459 nm) by the center wavelength λ$_c$ (1310 nm) is approximately 0.350, which is greater than 0.06 and shows that the wavelength band for which the power reflectivity R falls within the allowable reflectivity range is a wide band.

In this case, the thicknesses of the first to sixth layer films 7 to 12 of the coating film 13 are 401.64 nm, 253.48 nm, 323.86 nm, 204.39 nm, 261.38 nm and 164.96 nm, respectively. The optical thickness t of the coating film 13 is 2951.80 nm. This value is approximately 9.00 times the value t$_r$ (328 nm) which is a quarter of the center wavelength λ$_c$. Thus, the coating film 13 is a very thick film.

Figure 47:
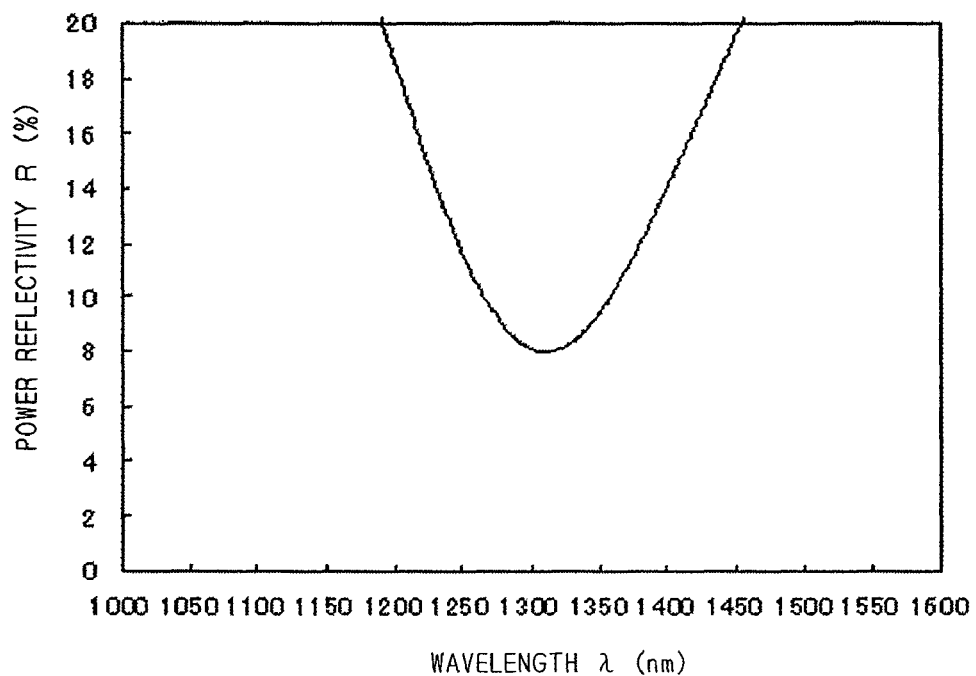
FIG. 47 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 8% for the wavelength λ equal to λ$_c$ (1310 nm) when the coating film 2 having the above-mentioned refractive index n$_f$ of "1.3726" and a thickness d$_f$ of five times 238.60 nm, i.e. five times λ$_c$/(4n$_f$), is provided on the end surface 1b of the semiconductor photonic element 1. FIG. 47 shows the wavelength dependence of the power reflectivity R in this case. As illustrated in FIG. 47, the wavelength band for which the power reflectivity R falls within ±2% from the design reflectivity of 8% is from 1266 nm to 1357 nm, to provide a wavelength bandwidth W$_r$ of 91 nm.

Thus, even when the center wavelength λ$_c$ is made equal to the design wavelength λ$_t$, the wavelength bandwidth W (459 nm) for the coating film 13 is greater than the wavelength bandwidth W$_r$ (91 nm) for the coating film 2 shown in FIG. 2.

Tenth Preferred Embodiment

Figure 48:
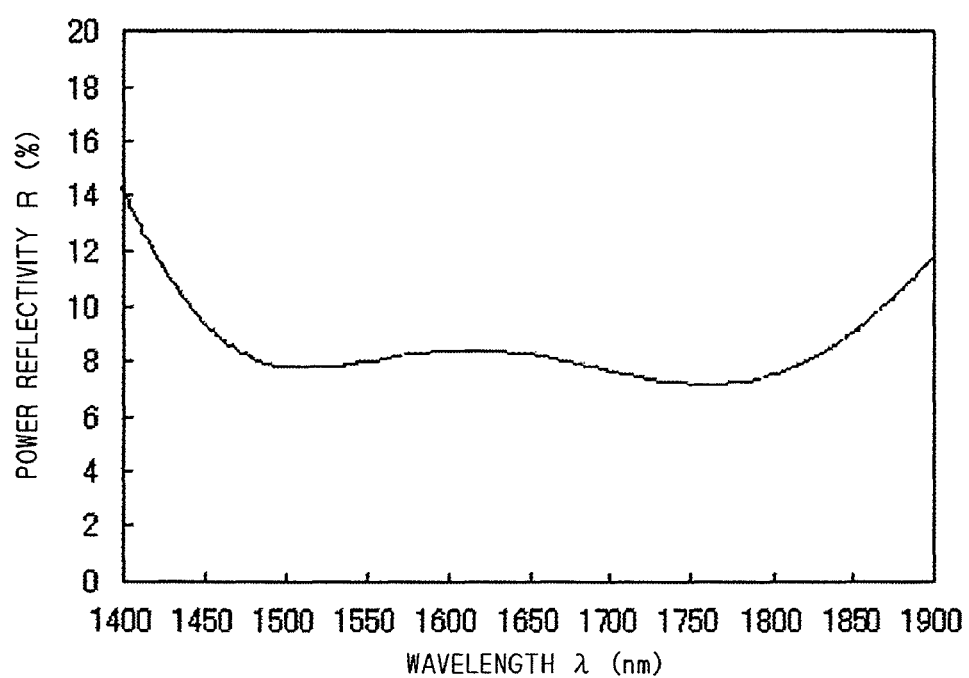
FIG. 48 is a graph showing the wavelength dependence of the power reflectivity of a coating film according to a tenth preferred embodiment of the present invention.

FIG. 48 shows the wavelength dependence of the power reflectivity R of the coating film 13 in the semiconductor photonic device according to the tenth preferred embodiment of the present invention. The semiconductor photonic device according to the tenth preferred embodiment is similar to the semiconductor photonic device according to the second preferred embodiment except that the design wavelength λ$_t$ is changed from 808 nm to 1550 nm.

For designing the thickness of the coating film 13 having the power reflectivity R of 8% (R$_t$=8%) when the wavelength λ equals the design wavelength of 1550 nm, a point which provides a phase angle θ of 120 degrees is selected, for example, in Step s1 so that the reflection amplitude vector rv is located in the second quadrant (or the upper left quadrant) of the complex plane according to the tenth preferred embodiment. Then, the values of the real and imaginary parts r$_r$ and r$_i$ of the complex number inputted as the value of the amplitude reflectivity r are "−0.141421356" and "+0.244948974," respectively, in Step s2.

When A=2.00, B=2.00 and C=2.00 are set, the basic amounts of phase change φ$_1$ and φ$_2$ determined in Step s5 are "0.591234" and "1.06568," respectively. Accordingly, the thicknesses of the first to sixth layer films 7 to 12 determined in Step s6 are 141.81 nm, 324.56 nm, 141.81 nm, 324.56 nm, 141.81 nm and 324.56 nm, respectively.

FIG. 48 described above shows the wavelength dependence of the power reflectivity R of the coating film 13 thus designed. As illustrated in FIG. 48, the power reflectivity R is 8% when the wavelength λ equals the design wavelength of 1550 nm. A wavelength band for which the power reflectivity R is approximately equal to the design reflectivity of 8% is wide. The power reflectivity R falls within a range from 7.2% to 10.0% for the wavelength λ ranging from 1441 nm to 1868 nm.

When the allowable reflectivity range is, for example, ±2% from the design reflectivity of 8%, the wavelength band for which the power reflectivity R falls within the allowable reflectivity range is also from 1441 nm to 1868 nm, to provide a wavelength bandwidth W of 427 nm. The center wavelength λ$_c$ of the wavelength band is 1655 nm. The value obtained by dividing the wavelength bandwidth W by the center wavelength λ$_c$ is approximately 0.258, which is greater than 0.06. It may be said that the wavelength band for which the power reflectivity R falls within the allowable reflectivity range is a wide band.

Because the thicknesses of the first to sixth layer films 7 to 12 take on the above-mentioned values, the optical thickness t of the coating film 13 is 2452.47 nm. This value is approximately 5.92 times the value t$_r$ (414 nm) which is a quarter of the center wavelength λ$_c$. Thus, the coating film 13 is a very thick film. This improves heat dissipation characteristics at the end surface 1b of the semiconductor photonic element 1 to suppress the increase in temperature of the end surface 1b.

Figure 49:
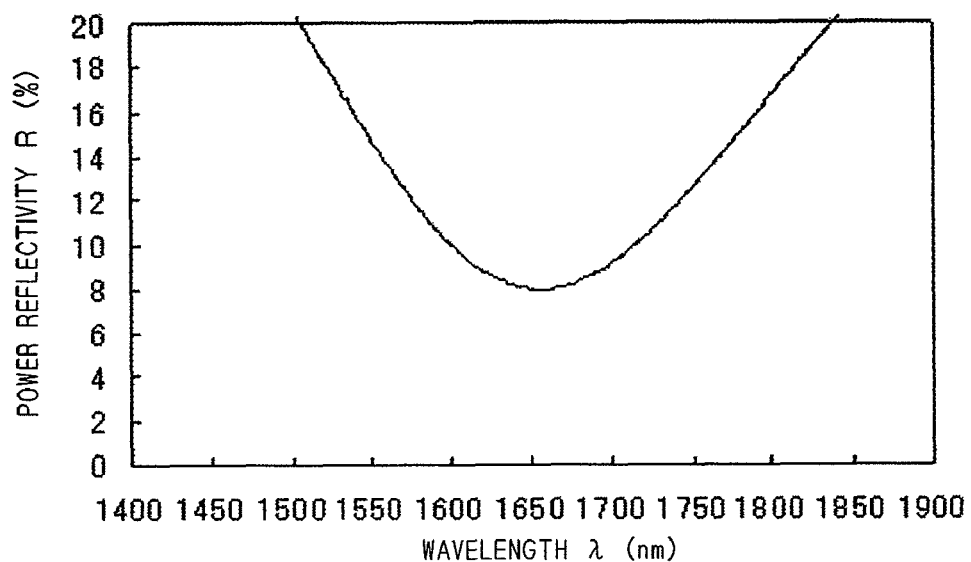
FIG. 49 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 8% for the wavelength λ equal to λ$_c$ (1655 nm) when the coating film 2 having the refractive index n$_f$ of "1.3726" as in the ninth preferred embodiment and a thickness d$_f$ of five times 301.44 nm, i.e. five times λ$_c$/(4n$_f$), is provided on the end surface 1b of the semiconductor photonic element 1. FIG. 49 shows the wavelength dependence of the power reflectivity R in this case. As illustrated in FIG. 49, the wavelength band for which the power reflectivity R falls within ±2% from the design reflectivity of 8% is from 1600 nm to 1714 nm, to provide a wavelength bandwidth $W_r$ of 114 nm.

Thus, the wavelength bandwidth W (427 nm) for the coating film 13 of the tenth preferred embodiment is wider than the wavelength bandwidth $W_r$ (114 nm) for the coating film 2 shown in FIG. 2.

Figure 50:
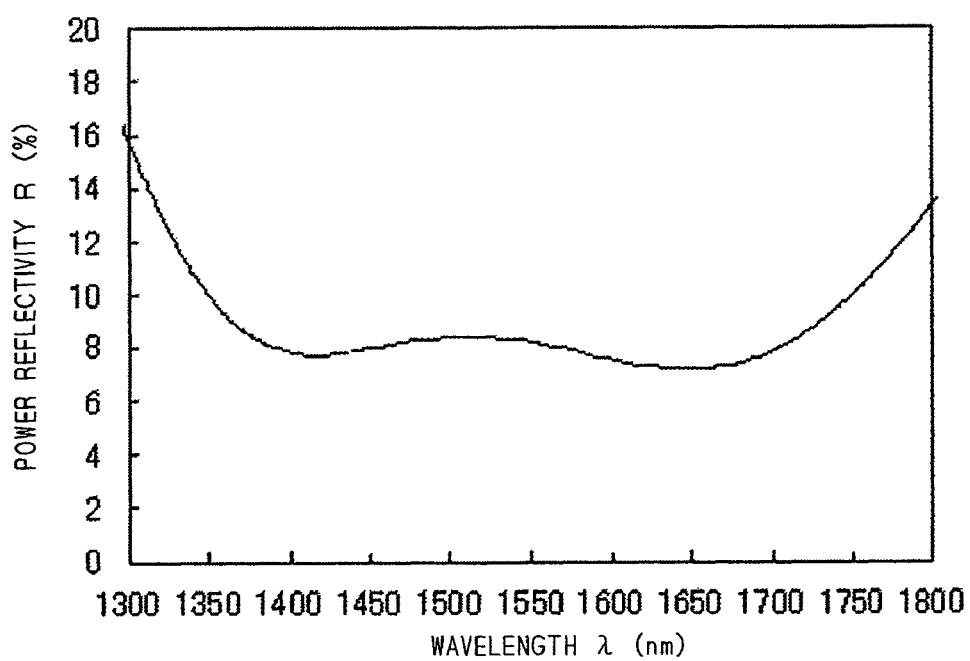
FIG. 50 is a graph showing the wavelength dependence of the power reflectivity of the coating film according to the tenth preferred embodiment of the present invention.

As mentioned above, because the wavelength λ of light propagating through the active layer 1a is sometimes varied, it is desirable that the center wavelength $λ_c$ of the wavelength band for which the power reflectivity R falls within the allowable reflectivity range be equal to or close to the design wavelength $λ_t$. For example, the center wavelength $λ_c$ takes on a value equal to the design wavelength $λ_t$ of 1510 nm when the thickness of the coating film 13 is determined using the basic thicknesses $d_1$ and $d_2$ obtained by setting the basic amounts of phase change $φ_1$ and $φ_2$ at "0.591234" and "1.06568," respectively, in a similar manner to the above instance and substituting 1452 nm, rather than the design wavelength $λ_t$, for λ in Equations (5a) and (5b). FIG. 50 shows the wavelength dependence of the power reflectivity R in this case.

As illustrated in FIG. 50, the power reflectivity R falls within a range from 7.2% to 10.0% for the wavelength λ ranging from 1350 nm to 1750 nm. The wavelength band for which the power reflectivity R falls within ±2% from the design reflectivity of 8% is also from 1350 nm to 1750 nm, to provide a wavelength bandwidth W of 400 nm. The center wavelength $λ_c$ of the wavelength band is 1550 nm, which is equal to the design wavelength of 1550 nm. The value obtained by dividing the wavelength bandwidth W (400 nm) by the center wavelength $λ_c$ (1550 nm) is approximately 0.258, which is greater than 0.06 and shows that the wavelength band for which the power reflectivity R falls within the allowable reflectivity range is a wide band.

In this case, the thicknesses of the first to sixth layer films 7 to 12 of the coating film 13 are 132.84 nm, 304.04 nm, 132.84 nm, 304.04 nm, 132.84 nm and 304.04 mm, respectively. The optical thickness t of the coating film 13 is 2297.39 nm. This value is approximately 5.92 times the value $t_r$ (388 nm) which is a quarter of the center wavelength $λ_c$. Thus, the coating film 13 is a very thick film.

The semiconductor photonic device shown in FIG. 2 will be considered for comparison. For the semiconductor photonic device shown in FIG. 2, the power reflectivity R is 8% for the wavelength λ equal to $λ_c$ (1550 nm) when the coating film 2 having the above-mentioned refractive index $n_f$ of "1.3726" and a thickness $d_f$ of five times 282.31 nm, i.e. five times $λ_c/(4n_f)$, is provided on the end surface 1b of the semiconductor photonic element 1. FIG. 51 shows the wavelength dependence of the power reflectivity R in this case. As illustrated in FIG. 51, the wavelength band for which the power reflectivity R falls within ±2% from the design reflectivity of 8% is from 1498 nm to 1606 nm, to provide a wavelength bandwidth $W_r$ of 108 nm.

Thus, even when the center wavelength $λ_c$ is made equal to the design wavelength $λ_t$, the wavelength bandwidth W (400 nm) for the coating film 13 is greater than the wavelength bandwidth $W_r$ (108 nm) for the coating film 2 shown in FIG. 2.

Eleventh Preferred Embodiment

FIG. 52 shows the wavelength dependence of the power reflectivity R of the coating film 21 in the semiconductor photonic device according to the eleventh preferred embodiment of the present invention. The semiconductor photonic device according to the eleventh preferred embodiment is similar to the semiconductor photonic device shown in FIG. 15 according to the third preferred embodiment except that the material layer for the first layer film 14, the third layer film 16, the fifth layer film 18 and the seventh layer film 20 is changed from the alumina layer to a silicon oxide layer, that the effective refractive index $n_c$ of the semiconductor photonic element 1 is changed from "3.37" to "2.50," and that the design wavelength $λ_t$ is changed from 1310 nm to 410 nm.

Thus, because the silicon oxide layer is employed in place of the alumina layer, the refractive index $n_2$ of the first layer film 14, the third layer film 16, the fifth layer film 18 and the seventh layer film 20 is 1.480 according to the eleventh preferred embodiment. Because the design wavelength $λ_t$ is 410 nm, the refractive index $n_1$ of the second layer film 15, the fourth layer film 17 and the sixth layer film 19 which are the tantalum oxide layers is set at "2.128" in consideration for wavelength dispersion.

Because GaN based semiconductor is employed in the semiconductor photonic element 1 of the eleventh preferred embodiment, the effective refractive index $n_c$ of the semiconductor photonic element 1 is "2.50," as described above.

For designing the thickness of the coating film 21 having the power reflectivity R of 8% ($R_t$=8%) when the wavelength λ equals the design wavelength of 410 nm, a point which provides a phase angle θ of 210 degrees is selected, for example, in Step s1 so that the reflection amplitude vector rv is located in the third quadrant (or the lower left quadrant) of the complex plane according to the eleventh preferred embodiment. Then, the values of the real and imaginary parts $r_r$ and $r_i$ of the complex number inputted as the value of the amplitude reflectivity r are "−0.244948974" and "−0.141421356," respectively, in Step s2.

When O=0.25, A=2.35, B=2.00 and C 2.00 are set, the basic amounts of phase change $φ_1$ and $φ_2$ determined in Step s5 are "1.98646" and "0.294825," respectively. Accordingly, the thicknesses of the first to seventh layer films 14 to 20 determined in Step s6 are 3.25 nm, 143.15 nm, 30.55 nm, 121.83 nm, 26.00 nm, 121.83 nm and 26.00 nm, respectively.

FIG. 52 described above shows the wavelength dependence of the power reflectivity R of the coating film 21 thus designed. As illustrated in FIG. 52, the power reflectivity R is 8% when the wavelength λ equals the design wavelength of 410 nm. A wavelength band for which the power reflectivity R is approximately equal to the design reflectivity of 8% is wide. The power reflectivity R falls within a range from 7.7% to 10.0% for the wavelength λ ranging from 362 nm to 424 nm.

When the allowable reflectivity range is, for example, ±2% from the design reflectivity of 8%, the wavelength band for which the power reflectivity R falls within the allowable reflectivity range is also from 362 nm to 424 nm, to provide a wavelength bandwidth W of 62 nm. The center wavelength $λ_c$ of the wavelength band is 393 nm. The value obtained by dividing the wavelength bandwidth W by the center wavelength $λ_c$ is approximately 0.158, which is greater than 0.06. It may be said that the wavelength band for which the power reflectivity R falls within the allowable reflectivity range is a wide band.

Because the thicknesses of the first to seventh layer films 14 to 20 take on the above-mentioned values, the optical thickness t of the coating film 21 is 950.12 nm. This value is approximately 9.70 times the value $t_r$ (98 nm) which is a quarter of the center wavelength $λ_c$. Thus, the coating film 21 is a very thick film. This improves heat dissipation characteristics at the end surface 1b of the semiconductor photonic element 1 to suppress the increase in temperature of the end surface 1b.

Figure 53:
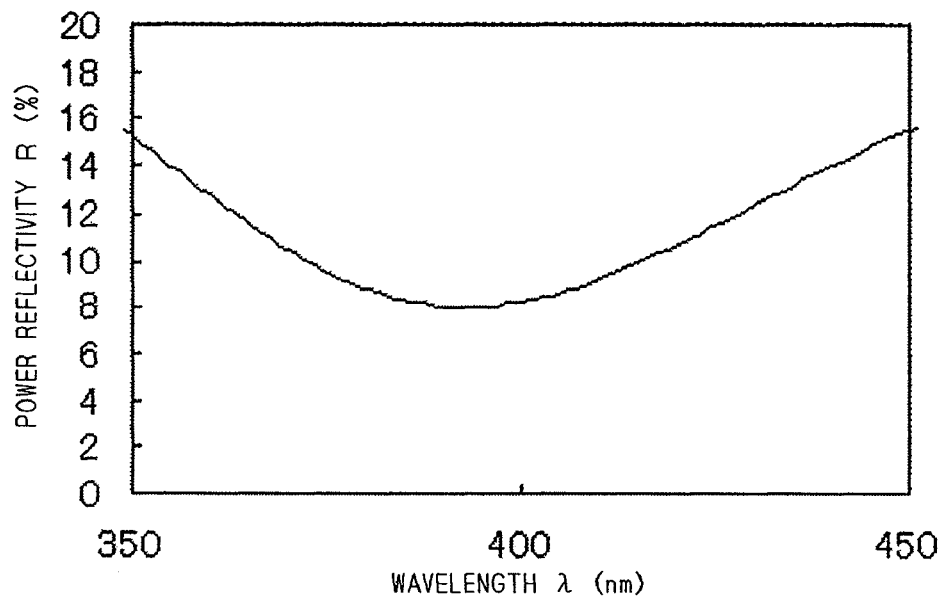
FIG. 53 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 8% for the wavelength λ equal to $λ_c$ (393 nm) when the coating film 2 having a refractive index $n_f$ of "1.1822" and a thickness $d_f$ of five times 83.11 nm, i.e. five times $λ_c/(4n_f)$, is provided on the end surface 1b of the semiconductor photonic element 1. FIG. 53 shows the wavelength dependence of the power reflectivity R in this case. As illustrated in FIG. 53, the wavelength band for which the power reflectivity R falls within ±2% from the design reflectivity of 8% is from 373 nm to 415 nm, to provide a wavelength bandwidth $W_r$ of 42 nm.

The above-mentioned value "1.1822" of the refractive index $n_f$ is obtained by substituting $R_f$=0.08 and $n_c$=2.50 into Equation (8).

Thus, the wavelength bandwidth W (62 nm) for the coating film 21 of the eleventh preferred embodiment is greater than the wavelength bandwidth $W_r$ (42 nm) for the coating film 2 shown in FIG. 2.

Figure 54:
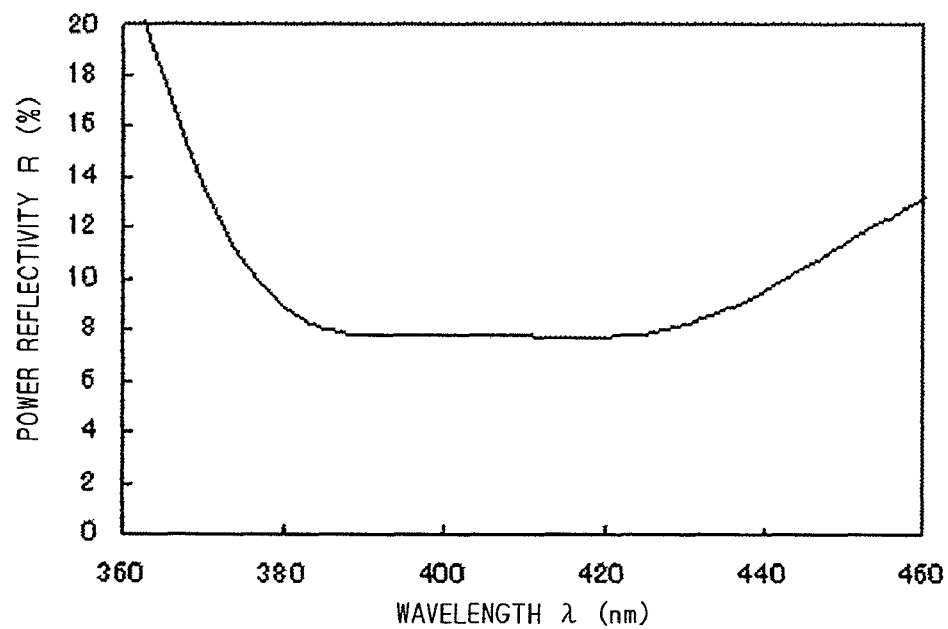
FIG. 54 is a graph showing the wavelength dependence of the power reflectivity of the coating film according to the eleventh preferred embodiment of the present invention.

As mentioned above, because the wavelength λ of light propagating through the active layer 1a is sometimes varied, it is desirable that the center wavelength $λ_c$ of the wavelength band for which the power reflectivity R falls within the allowable reflectivity range be equal to or close to the design wavelength $λ_t$. For example, the center wavelength $λ_c$ takes on a value equal to the design wavelength $λ_t$ of 410 nm when the thickness of the coating film 21 is determined using the basic thicknesses $d_1$ and $d_2$ obtained by setting the basic amounts of phase change $φ_1$ and $φ_2$ at "1.98646" and "0.294825," respectively, in a similar manner to the above instance and substituting 427 nm, rather than the design wavelength $λ_t$, for λ in Equations (5a) and (5b). FIG. 54 shows the wavelength dependence of the power reflectivity R in this case.

As illustrated in FIG. 54, the power reflectivity R falls within a range from 7.7% to 10.0% for the wavelength λ ranging from 377 nm to 442 nm. The wavelength band for which the power reflectivity R falls within ±2% from the design reflectivity of 8% is also from 377 nm to 442 nm, to provide a wavelength bandwidth W of 65 nm. The center wavelength $λ_c$ of the wavelength band is 410 nm, which is equal to the design wavelength of 410 nm. The value obtained by dividing the wavelength bandwidth W (65 nm) by the center wavelength $λ_c$ (410 nm) is approximately 0.159, which is greater than 0.06 and shows that the wavelength band for which the power reflectivity R falls within the allowable reflectivity range is a wide band.

In this case, the thicknesses of the first to seventh layer films 14 to 20 of the coating film 21 are 3.38 nm, 149.08 nm, 31.81 nm, 126.88 nm, 27.08 nm, 126.88 nm and 27.08 nm, respectively. The optical thickness t of the coating film 21 is 989.48 nm. This value is approximately 9.61 times the value $t_r$ (103 nm) which is a quarter of the center wavelength $λ_c$. Thus, the coating film 21 is a very thick film.

Figure 55:
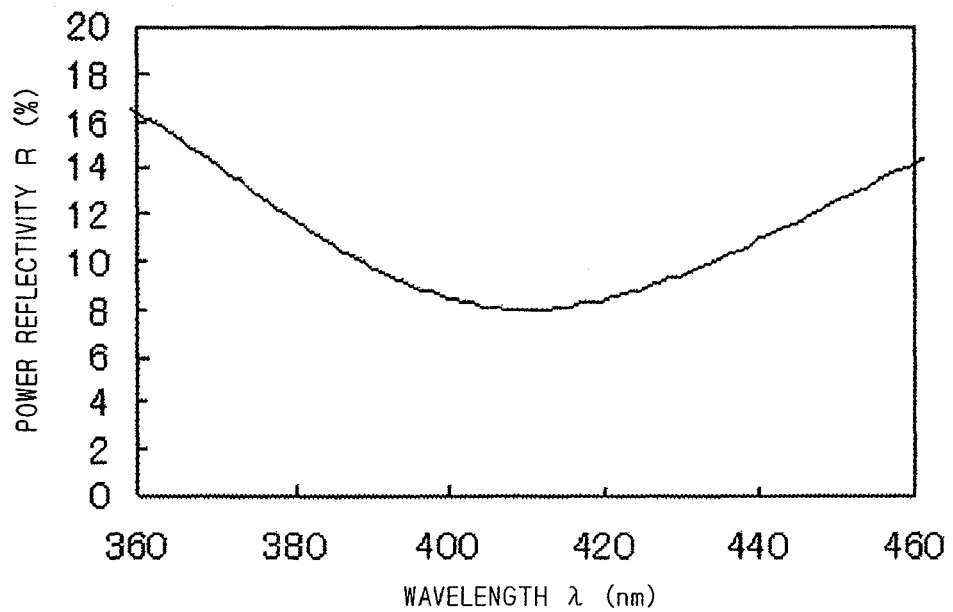
FIG. 55 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 8% for the wavelength λ equal to $λ_c$ (410 nm) when the coating film 2 having the above-mentioned refractive index $n_f$ of "1.1822" and a thickness $d_f$ of five times 86.70 nm, i.e. five times $λ_c/(4n_f)$, is provided on the end surface 1b of the semiconductor photonic element 1. FIG. 55 shows the wavelength dependence of the power reflectivity R in this case. As illustrated in FIG. 55, the wavelength band for which the power reflectivity R falls within ±2% from the design reflectivity of 8% is from 389 nm to 433 nm, to provide a wavelength bandwidth $W_r$ of 44 nm.

Thus, even when the center wavelength $λ_c$ is made equal to the design wavelength $λ_t$, the wavelength bandwidth W (65 nm) for the coating film 21 is greater than the wavelength bandwidth $W_r$ (44 nm) for the coating film 2 shown in FIG. 2.

Twelfth Preferred Embodiment

Figure 56:
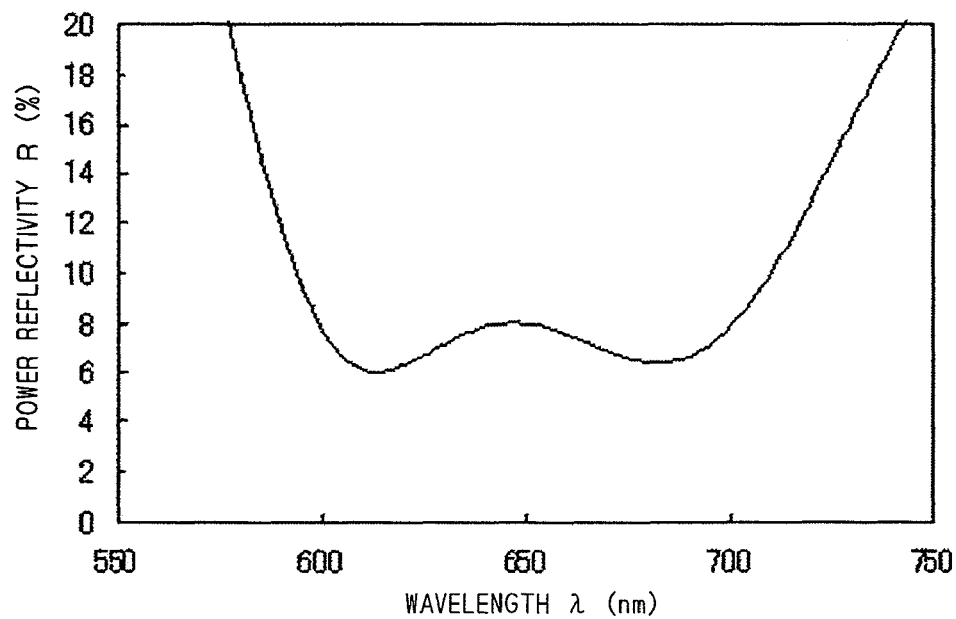
FIG. 56 is a graph showing the wavelength dependence of the power reflectivity of a coating film according to a twelfth preferred embodiment of the present invention.

FIG. 56 shows the wavelength dependence of the power reflectivity R of the coating film 29 in the semiconductor photonic device according to the twelfth preferred embodiment of the present invention. The semiconductor photonic device according to the twelfth preferred embodiment is similar to the semiconductor photonic device shown in FIG. 20 according to the fourth preferred embodiment except that the design wavelength $λ_t$ is changed from 1550 nm to 650 nm.

For designing the thickness of the coating film 29 having the power reflectivity R of 8% ($R_t$=8%) when the wavelength λ equals the design wavelength of 650 nm, a point which provides a phase angle θ of 300 degrees is selected, for example, in Step s1 so that the reflection amplitude vector rv is located in the fourth quadrant (or the lower right quadrant) of the complex plane according to the twelfth preferred embodiment. Then, the values of the real and imaginary parts $r_r$ and $r_i$ of the complex number inputted as the value of the amplitude reflectivity r are "+0.141421356" and "−0.244948974," respectively, in Step s2.

When A=1.23, B=2.00, C=2.00 and $d_3$=10.0 nm are set, the basic amounts of phase change $φ_1$ and $φ_2$ determined in Step s5 are "0.707793" and "2.25201," respectively. Accordingly, the thicknesses of the second to seventh layer films 23 to 28 determined in Step s6 are 43.78 nm, 176.89 nm, 71.19 nm, 287.62 nm, 71.19 nm and 287.62 nm, respectively.

FIG. 56 described above shows the wavelength dependence of the power reflectivity R of the coating film 29 thus designed. As illustrated in FIG. 56, the power reflectivity R is 8% when the wavelength λ equals the design wavelength of 650 nm. A wavelength band for which the power reflectivity R is approximately equal to the design reflectivity of 8% is wide. The power reflectivity R falls within a range from 6.0% to 10.0% for the wavelength λ ranging from 594 nm to 709 mm.

When the allowable reflectivity range is, for example, ±2% from the design reflectivity of 8%, the wavelength band for which the power reflectivity R falls within the allowable reflectivity range is also from 594 nm to 709 nm, to provide a wavelength bandwidth W of 115 nm. The center wavelength $λ_c$ of the wavelength band is 652 nm. The value obtained by dividing the wavelength bandwidth W by the center wavelength $λ_c$ is approximately 0.176, which is greater than 0.06. It may be said that the wavelength band for which the power reflectivity R falls within the allowable reflectivity range is a wide band.

Because the thicknesses of the first to seventh layer films 22 to 28 take on the above-mentioned values, the optical thickness t of the coating film 29 is 1622.10 nm. This value is approximately 9.95 times the value $t_r$ (163 nm) which is a quarter of the center wavelength $λ_c$. Thus, the coating film 29 is a very thick film. This improves heat dissipation characteristics at the end surface 1b of the semiconductor photonic element 1 to suppress the increase in temperature of the end surface 1b.

Figure 57:
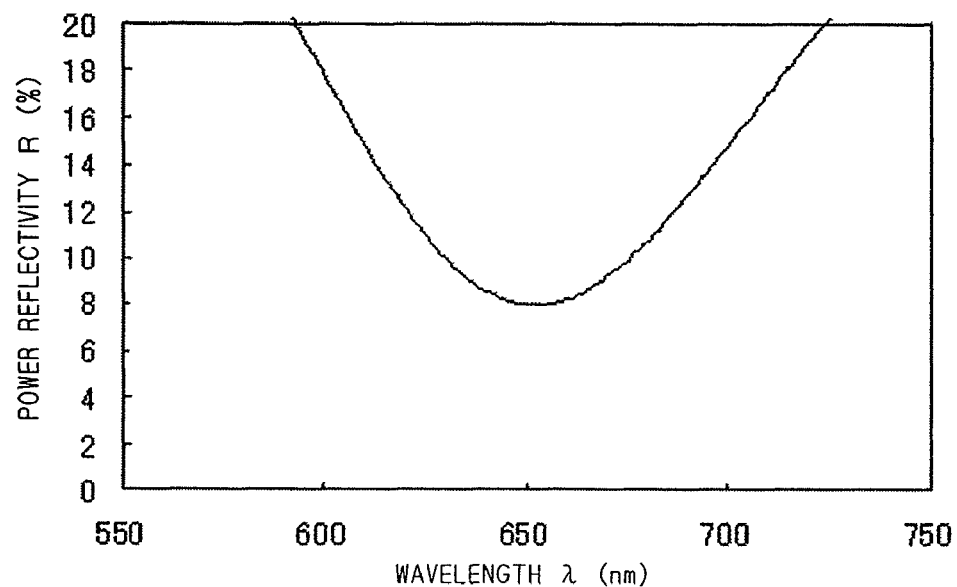
FIG. 57 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 8% for the wavelength λ equal to $\lambda_c$ (652 nm) when the coating film 2 having the refractive index $n_f$ of "1.3726" as in the ninth preferred embodiment and a thickness $d_f$ of five times 118.75 nm, i.e. five times $\lambda_t/(4n_f)$, is provided on the end surface 1b of the semiconductor photonic element 1. FIG. 57 shows the wavelength dependence of the power reflectivity R in this case. As illustrated in FIG. 57, the wavelength band for which the power reflectivity R falls within ±2% from the design reflectivity of 8% is from 630 nm to 675 nm, to provide a wavelength bandwidth $W_r$ of 45 nm.

Thus, the wavelength bandwidth W (115 nm) for the coating film 29 of the twelfth preferred embodiment is greater than the wavelength bandwidth $W_r$ (45 nm) for the coating film 2 shown in FIG. 2.

Figure 58:
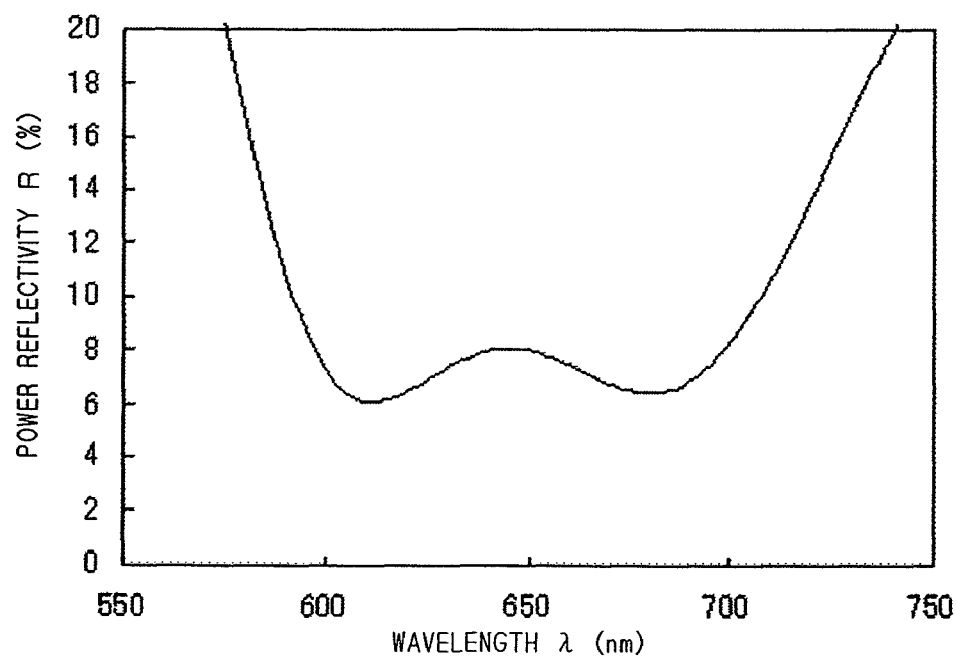
FIG. 58 is a graph showing the wavelength dependence of the power reflectivity of the coating film according to the twelfth preferred embodiment of the present invention.

As mentioned above, because the wavelength λ of light propagating through the active layer 1a is sometimes varied, it is desirable that the center wavelength $\lambda_c$ of the wavelength band for which the power reflectivity R falls within the allowable reflectivity range be equal to or close to the design wavelength $\lambda_t$. For example, the thickness $d_3$=10.0 nm is set, and the basic amounts of phase change $\phi_1$ and $\phi_2$ are set at "0.70747" and "2.25219," respectively, by adjusting the parameters A to C. The center wavelength $\lambda_c$ takes on a value equal to the design wavelength of 650 nm when the thickness of the coating film 29 is determined using the basic thicknesses $d_1$ and $d_2$ obtained by substituting the design wavelength of 650 nm for λ in Equations (5a) and (5b). FIG. 58 shows the wavelength dependence of the power reflectivity R in this case.

As illustrated in FIG. 58, the power reflectivity R falls within a range from 6.0% to 10.0% for the wavelength λ ranging from 592 nm to 707 nm. The wavelength band for which the power reflectivity R falls within ±2% from the design reflectivity of 8% is also from 592 nm to 707 nm, to provide a wavelength bandwidth W of 115 nm. The center wavelength $\lambda_c$ of the wavelength band is 650 nm, which is equal to the design wavelength of 650 nm. The value obtained by dividing the wavelength bandwidth W (115 nm) by the center wavelength $\lambda_c$ (650 nm) is approximately 0.177, which is greater than 0.06 and shows that the wavelength band for which the power reflectivity R falls within the allowable reflectivity range is a wide band.

In this case, the thicknesses of the first to seventh layer films 22 to 28 of the coating film 29 are 10.00 nm, 43.63 nm, 176.36 nm, 70.94 nm, 286.76 nm, 70.94 nm and 286.76 nm, respectively. The optical thickness t of the coating film 29 is 1617.12 nm. This value is approximately 9.92 times the value $t_r$ (163 nm) which is a quarter of the center wavelength $\lambda_c$. Thus, the coating film 29 is a very thick film.

Figure 59:
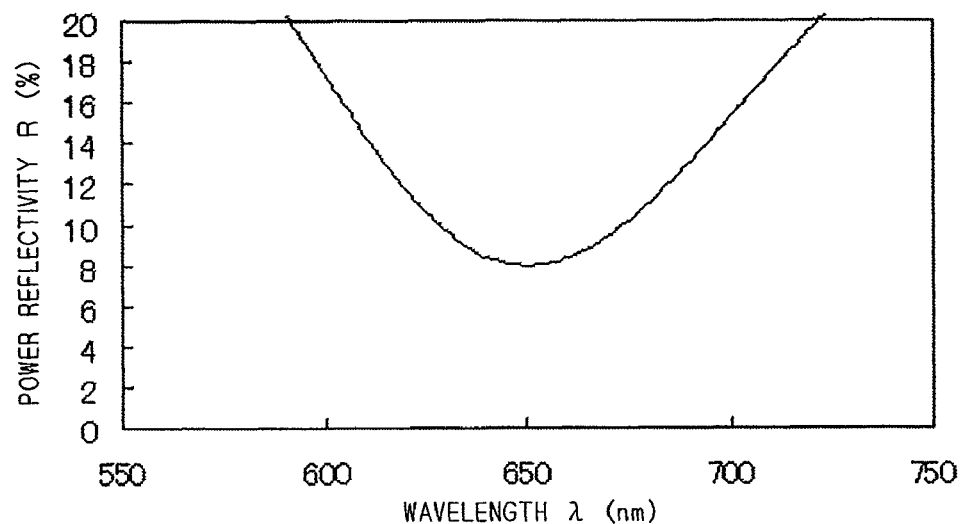
FIG. 59 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 8% for the wavelength λ equal to $\lambda_c$ (650 nm) when the coating film 2 having the above-mentioned refractive index $n_f$ of "1.3726" and a thickness $d_f$ of five times 118.39 nm, i.e. five times $\lambda_c/(4n_f)$, is provided on the end surface 1b of the semiconductor photonic element 1. FIG. 59 shows the wavelength dependence of the power reflectivity R in this case. As illustrated in FIG. 59, the wavelength band for which the power reflectivity R falls within ±2% from the design reflectivity of 8% is from 629 nm to 673 nm, to provide a wavelength bandwidth $W_r$ of 44 nm.

Thus, even when the center wavelength $\lambda_c$ is made equal to the design wavelength $\lambda_t$, the wavelength bandwidth W (115 nm) for the coating film 29 is greater than the wavelength bandwidth $W_r$ (44 nm) for the coating film 2 shown in FIG. 2.

Thirteenth Preferred Embodiment

Figure 60:
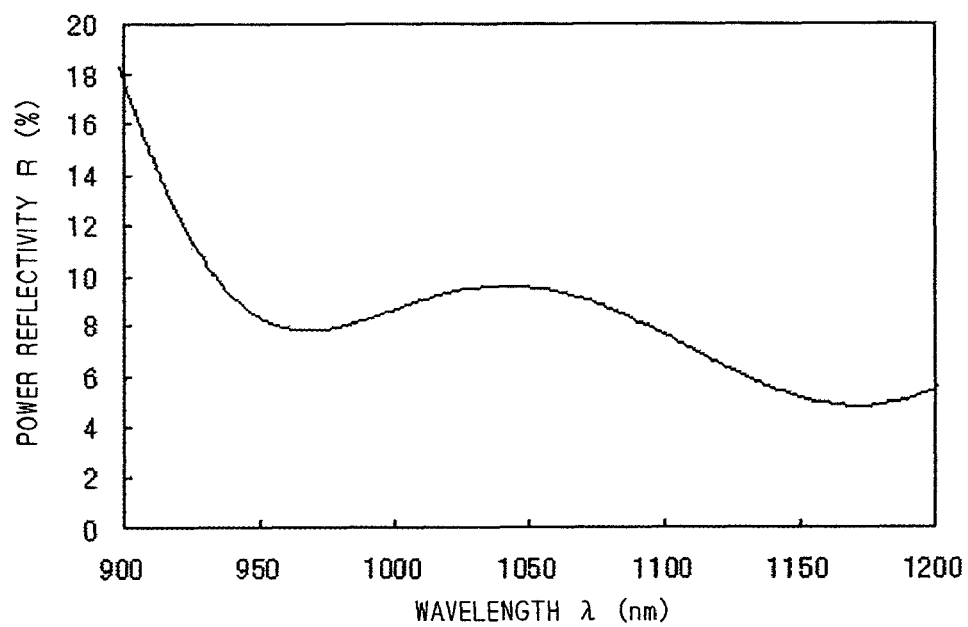
FIG. 60 is a graph showing the wavelength dependence of the power reflectivity of a coating film according to a thirteenth preferred embodiment of the present invention.

FIG. 60 shows the wavelength dependence of the power reflectivity R of the coating film 38 in the semiconductor photonic device according to the thirteenth preferred embodiment of the present invention. The semiconductor photonic device according to the thirteenth preferred embodiment is similar to the semiconductor photonic device shown in FIG. 25 according to the fifth preferred embodiment except that the design wavelength $\lambda_t$ is changed from 410 nm to 980 nm.

For designing the thickness of the coating film 38 having the power reflectivity R of 8% ($R_t$=8%) when the wavelength λ equals the design wavelength of 980 nm, a point which provides a phase angle θ of 15 degrees is selected, for example, in Step s1 so that the reflection amplitude vector rv is located in the first quadrant (or the upper right quadrant) of the complex plane according to the thirteenth preferred embodiment. Then, the values of the real and imaginary parts $r_r$ and $r_i$ of the complex number inputted as the value of the amplitude reflectivity r are "+0.27320508" and "+0.07320508," respectively, in Step s2.

When A=1.96, B=1.31, C=2.02 and D=2.00 are set, the basic amounts of phase change $\phi_1$ and $\phi_2$ determined in Step s5 are "0.30917" and "1.12523," respectively. Accordingly, the thicknesses of the first to eighth layer films 30 to 37 determined in Step s6 are 45.95 nm, 232.49 nm, 26.49 nm, 134.00 nm, 47.35 nm, 239.54 nm, 46.89 nm and 237.17 nm, respectively.

FIG. 60 described above shows the wavelength dependence of the power reflectivity R of the coating film 38 thus designed. As illustrated in FIG. 60, the power reflectivity R is 8% when the wavelength λ equals the design wavelength of 980 nm. A wavelength band for which the power reflectivity R is approximately equal to the design reflectivity of 8% is wide. The power reflectivity R falls within a range from 6.0% to 10.0% for the wavelength λ ranging from 934 nm to 1129 nm.

When the allowable reflectivity range is, for example, ±2% from the design reflectivity of 8%, the wavelength band for which the power reflectivity R falls within the allowable reflectivity range is also from 934 nm to 1129 nm, to provide a wavelength bandwidth W of 195 nm. The center wavelength $\lambda_c$ of the wavelength band is 1032 nm. The value obtained by dividing the wavelength bandwidth W by the center wavelength $\lambda_c$ is approximately 0.189, which is greater than 0.06. It may be said that the wavelength band for which the power reflectivity R falls within the allowable reflectivity range is a wide band.

Because the thicknesses of the first to eighth layer films 30 to 37 take on the above-mentioned values, the optical thickness t of the coating film 38 is 1590.80 nm. This value is approximately 6.17 times the value $t_r$ (258 nm) which is a quarter of the center wavelength $\lambda_c$. Thus, the coating film 38 is a very thick film. This improves heat dissipation characteristics at the end surface 1b of the semiconductor photonic element 1 to suppress the increase in temperature of the end surface 1b.

Figure 61:
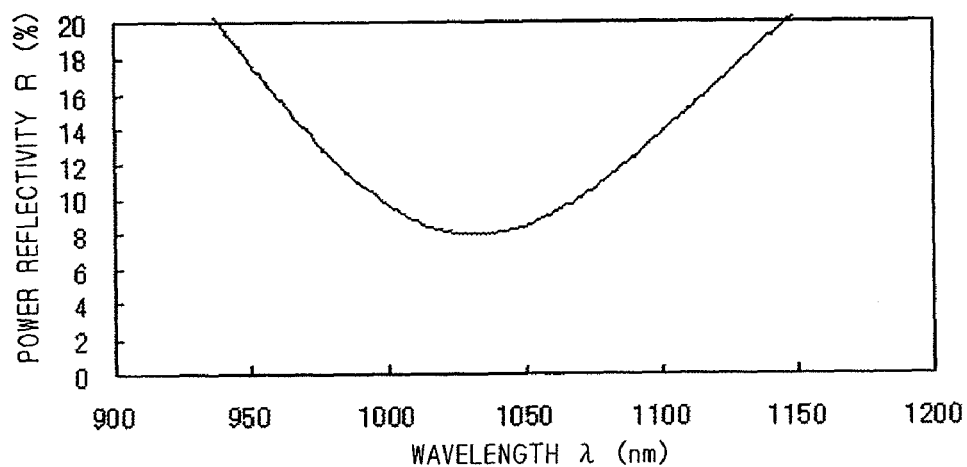
FIG. 61 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 8% for the wavelength λ equal to $\lambda_c$ (1032 nm) when the coating film 2 having the refractive index $n_f$ of "1.3726" as in the ninth preferred embodiment and a thickness $d_f$ of five times 187.96 nm, i.e. five times $\lambda_c/(4n_f)$, is provided on the end surface 1b of the semiconductor photonic element 1. FIG. 61 shows the wavelength dependence of the power reflectivity R in this case. As illustrated in FIG. 61, the wavelength band for which the power reflectivity R falls within ±2% from the design reflectivity of 8% is from 998 nm to 1069 nm, to provide a wavelength bandwidth $W_r$ of 71 nm.

Thus, the wavelength bandwidth W (195 nm) for the coating film 38 of the thirteenth preferred embodiment is greater than the wavelength bandwidth $W_r$ (71 nm) for the coating film 2 shown in FIG. 2.

Figure 62:
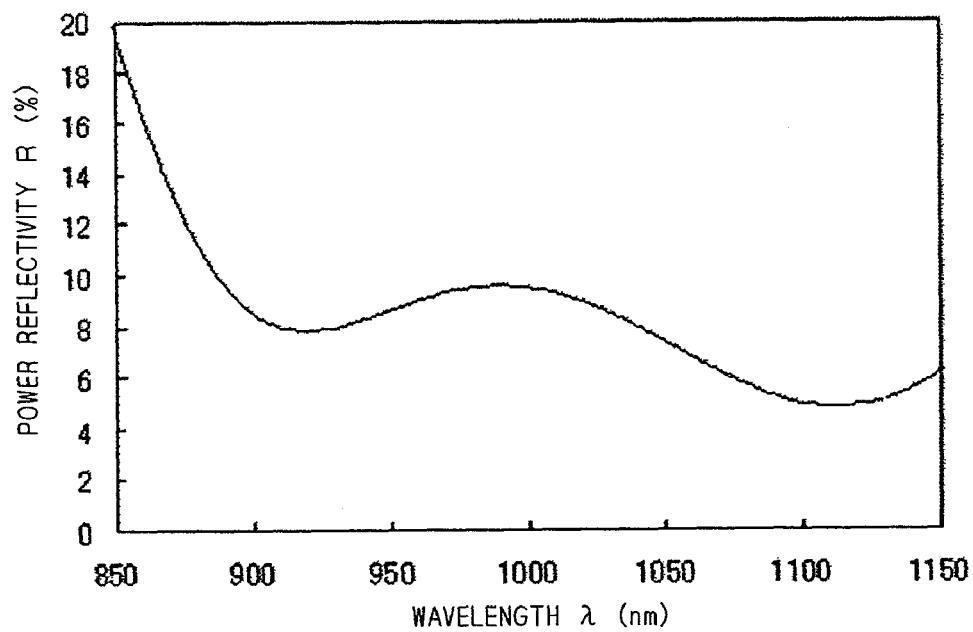
FIG. 62 is a graph showing the wavelength dependence of the power reflectivity of the coating film according to the thirteenth preferred embodiment of the present invention.

As mentioned above, because the wavelength λ of light propagating through the active layer 1a is sometimes varied, it is desirable that the center wavelength $λ_c$ of the wavelength band for which the power reflectivity R falls within the allowable reflectivity range be equal to or close to the design wavelength $λ_t$. For example, the center wavelength $λ_c$ takes on a value equal to the design wavelength $λ_t$ of 980 nm when the thickness of the coating film 38 is determined using the basic thicknesses $d_1$ and $d_2$ obtained by setting the basic amounts of phase change $φ_1$ and $φ_2$ at "0.30917" and "1.12523," respectively, in a similar manner to the above instance and substituting 931 nm, rather than the design wavelength $λ_t$, for λ in Equations (5a) and (5b). FIG. 62 shows the wavelength dependence of the power reflectivity R in this case.

As illustrated in FIG. 62, the power reflectivity R falls within a range from 6.0% to 10.0% for the wavelength λ ranging from 887 nm to 1073 nm. The wavelength band for which the power reflectivity R falls within ±2% from the design reflectivity of 8% is also from 887 nm to 1073 nm, to provide a wavelength bandwidth W of 186 nm. The center wavelength $λ_c$ of the wavelength band is 980 nm, which is equal to the design wavelength of 980 nm. The value obtained by dividing the wavelength bandwidth W (186 nm) by the center wavelength $λ_c$ (980 nm) is approximately 0.190, which is greater than 0.06 and shows that the wavelength band for which the power reflectivity R falls within the allowable reflectivity range is a wide band.

In this case, the thicknesses of the first to eighth layer films 30 to 37 of the coating film 38 are 43.65 nm, 220.80 nm, 25.17 nm, 127.30 nm, 44.99 nm, 227.56 nm, 44.54 nm and 225.31 nm, respectively. The optical thickness t of the coating film 38 is 1511.16 nm. This value is approximately 6.17 times the value $t_r$ (245 nm) which is a quarter of the center wavelength $λ_c$. Thus, the coating film 38 is a very thick film.

Figure 63:
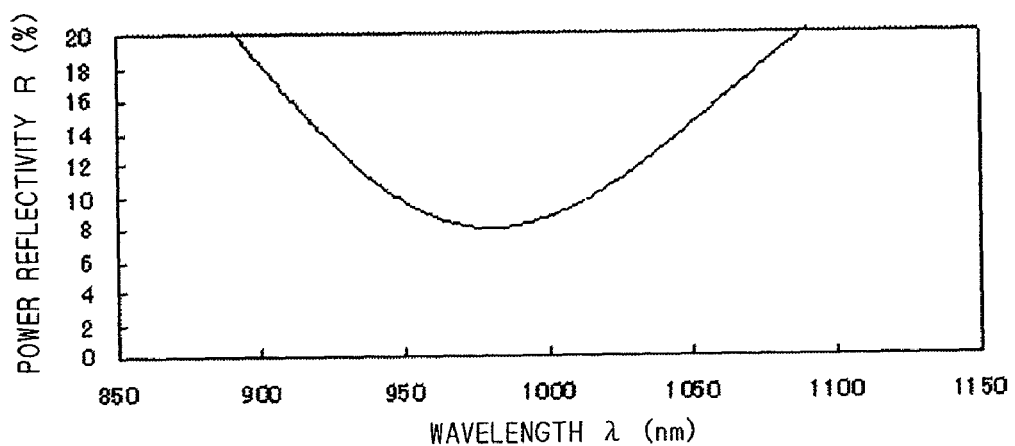
FIG. 63 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 8% for the wavelength λ equal to $λ_c$ (980 nm) when the coating film 2 having the above-mentioned refractive index $n_f$ of "1.3726" and a thickness $d_f$ of five times 178.49 nm, i.e. five times $λ_c/(4n_f)$, is provided on the end surface 1b of the semiconductor photonic element 1. FIG. 63 shows the wavelength dependence of the power reflectivity R in this case. As illustrated in FIG. 63, the wavelength band for which the power reflectivity R falls within ±2% from the design reflectivity of 8% is from 947 nm to 1015 nm, to provide a wavelength bandwidth $W_r$ of 68 nm.

Thus, even when the center wavelength $λ_c$ is made equal to the design wavelength $λ_t$, the wavelength bandwidth W (186 nm) for the coating film 38 is greater than the wavelength bandwidth $W_r$ (68 nm) for the coating film 2 shown in FIG. 2.

Fourteenth Preferred Embodiment

Figure 64:
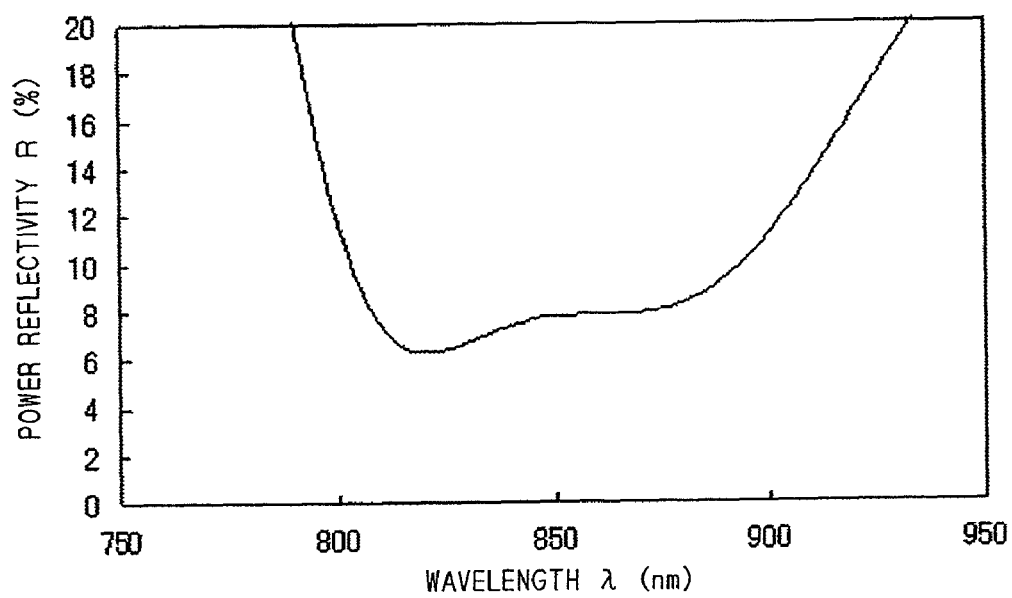
FIG. 64 is a graph showing the wavelength dependence of the power reflectivity of a coating film according to a fourteenth preferred embodiment of the present invention.

FIG. 64 shows the wavelength dependence of the power reflectivity R of the coating film 47 in the semiconductor photonic device according to the fourteenth preferred embodiment of the present invention. The semiconductor photonic device according to the fourteenth preferred embodiment is similar to the semiconductor photonic device shown in FIG. 30 according to the sixth preferred embodiment except that the material layer for the second layer film 40, the fourth layer film 42, the sixth layer film 44 and the eighth layer film 46 is changed from the silicon oxide layer to a tantalum oxide layer, that the material layer for the third layer film 41, the fifth layer film 43 and the seventh layer film 45 is changed from the tantalum oxide layer to a silicon oxide layer, and that the design wavelength $λ_t$ is changed from 650 nm to 808 nm. Accordingly, the values of the refractive indices $n_1$ and $n_2$ are "1.480" and "2.057," respectively, according to the fourteenth preferred embodiment.

For designing the thickness of the coating film 47 having the power reflectivity R of 8% ($R_t$=8%) when the wavelength λ equals the design wavelength of 808 nm, a point which provides a phase angle θ of 105 degrees is selected, for example, in Step s1 so that the reflection amplitude vector rv is located in the second quadrant (or the upper left quadrant) of the complex plane according to the fourteenth preferred embodiment. Then, the values of the real and imaginary parts $r_r$ and $r_i$ of the complex number inputted as the value of the amplitude reflectivity r are "−0.07320508" and "+0.27320508," respectively, in Step s2.

When A=2.13, B=2.33, C=2.00, D=2.00 and the thickness $d_3$=20.0 nm are set, the basic amounts of phase change $φ_1$ and $φ_2$ determined in Step s5 are "1.94893" and "0.761851," respectively. Accordingly, the thicknesses of the second to eighth layer films 40 to 46 determined in Step s6 are 101.45 nm, 394.57 nm, 110.98 nm, 338.69 nm, 95.26 nm, 338.69 nm and 95.26 nm, respectively.

FIG. 64 described above shows the wavelength dependence of the power reflectivity R of the coating film 47 thus designed. As illustrated in FIG. 64, the power reflectivity R is 8% when the wavelength λ equals the design wavelength of 808 nm. A wavelength band for which the power reflectivity R is approximately equal to the design reflectivity of 8% is wide. The power reflectivity R falls within a range from 6.3% to 10.0% for the wavelength λ ranging from 804 nm to 893 nm.

When the allowable reflectivity range is, for example, ±2% from the design reflectivity of 8%, the wavelength band for which the power reflectivity R falls within the allowable reflectivity range is also from 804 nm to 893 nm, to provide a wavelength bandwidth W of 89 nm. The center wavelength $λ_c$ of the wavelength band is 849 nm. The value obtained by dividing the wavelength bandwidth W by the center wavelength $λ_c$ is approximately 0.105, which is greater than 0.06. It may be said that the wavelength band for which the power reflectivity R falls within the allowable reflectivity range is a wide band.

Because the thicknesses of the first to eighth layer films 39 to 46 take on the above-mentioned values, the optical thickness t of the coating film 47 is 2456.79 nm. This value is approximately 11.59 times the value $t_r$ (212 nm) which is a quarter of the center wavelength $λ_c$. Thus, the coating film 47 is a very thick film. This improves heat dissipation characteristics at the end surface 1b of the semiconductor photonic element 1 to suppress the increase in temperature of the end surface 1b.

Figure 65:
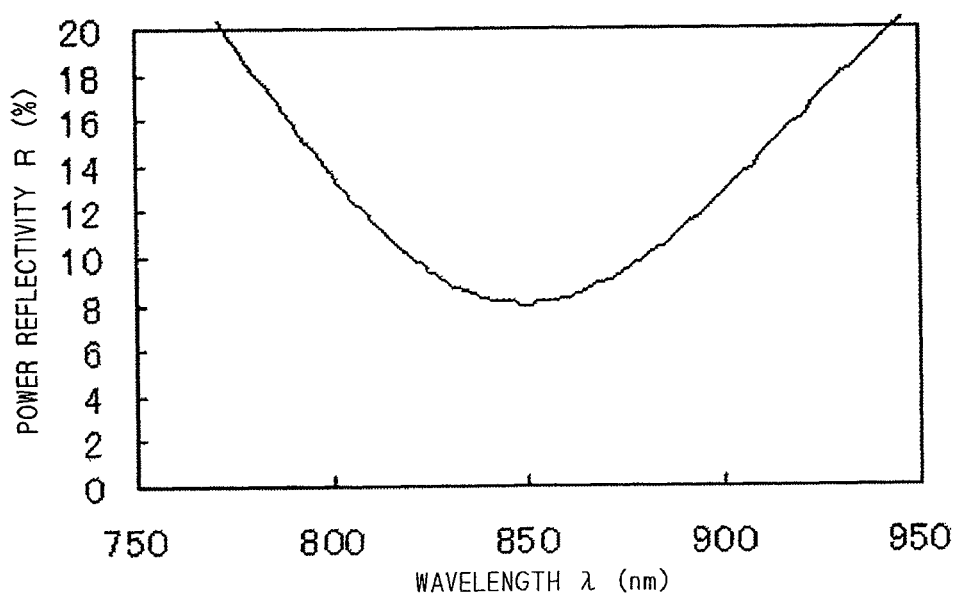
FIG. 65 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 8% for the wavelength λ equal to $λ_c$ (849 nm) when the coating film 2 having the refractive index $n_f$ of "1.3726" as in the ninth preferred embodiment and a thickness $d_f$ of five times 154.63 nm, i.e. five times $\lambda_c/(4n_f)$, is provided on the end surface 1b of the semiconductor photonic element 1. FIG. 65 shows the wavelength dependence of the power reflectivity R in this case. As illustrated in FIG. 65, the wavelength band for which the power reflectivity R falls within ±2% from the design reflectivity of 8% is from 821 nm to 879 nm, to provide a wavelength bandwidth $W_r$ of 58 nm.

Thus, the wavelength bandwidth W (89 nm) for the coating film 47 of the fourteenth preferred embodiment is greater than the wavelength bandwidth $W_r$ (58 nm) for the coating film 2 shown in FIG. 2.

Figure 66:
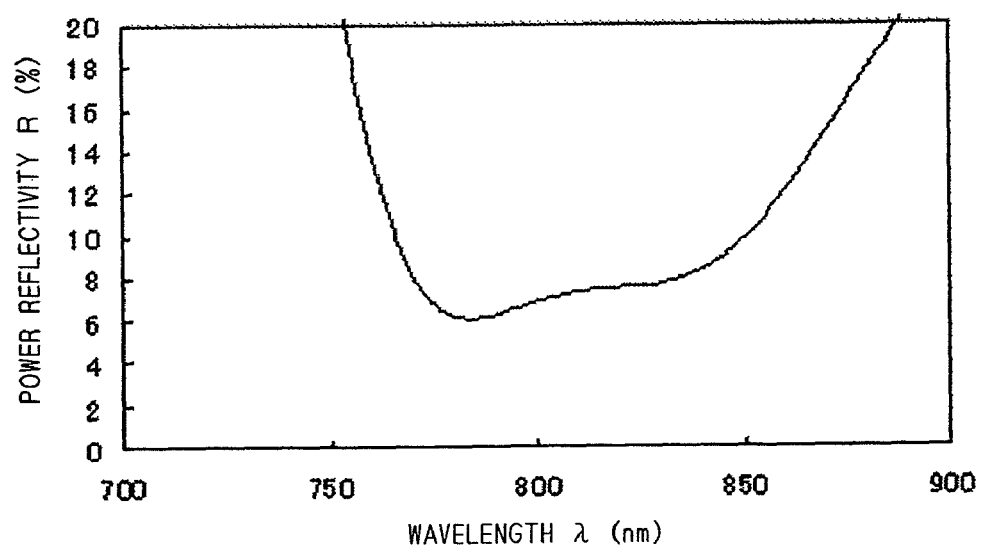
FIG. 66 is a graph showing the wavelength dependence of the power reflectivity of the coating film according to the fourteenth preferred embodiment of the present invention.

As mentioned above, because the wavelength λ of light propagating through the active layer 1a is sometimes varied, it is desirable that the center wavelength $\lambda_c$ of the wavelength band for which the power reflectivity R falls within the allowable reflectivity range be equal to or close to the design wavelength $\lambda_t$. For example, the thickness $d_3$=20.0 nm is set in the above-mentioned instance, and the basic amounts of phase change $\phi_1$ and $\phi_2$ are set at "1.96555" and "0.745004," respectively, by adjusting the parameters A to D. The center wavelength $\lambda_c$ takes on a value equal to the design wavelength $\lambda_t$ of 808 nm when the thickness of the coating film 47 is determined using the basic thicknesses $d_1$ and $d_2$ obtained by substituting 770 nm, rather than the design wavelength $\lambda_t$, for λ in Equations (5a) and (5b). FIG. 66 shows the wavelength dependence of the power reflectivity R in this case.

As illustrated in FIG. 66, the power reflectivity R falls within a range from 6.1% to 10.0% for the wavelength λ ranging from 766 nm to 850 nm. The wavelength band for which the power reflectivity R falls within ±2% from the design reflectivity of 8% is also from 766 nm to 850 nm, to provide a wavelength bandwidth W of 84 nm. The center wavelength $\lambda_c$ of the wavelength band is 808 nm, which is equal to the design wavelength of 808 nm. The value obtained by dividing the wavelength bandwidth W (84 nm) by the center wavelength $\lambda_c$ (808 nm) is approximately 0.104, which is greater than 0.06 and shows that the wavelength band for which the power reflectivity R falls within the allowable reflectivity range is a wide band.

In this case, the thicknesses of the first to eighth layer films 39 to 46 of the coating film 47 are 20.00 nm, 94.54 nm, 379.22 nm, 103.42 nm, 325.51 nm, 88.77 nm, 325.51 nm and 88.77 nm, respectively. The optical thickness t of the coating film 47 is 2338.60 nm. This value is approximately 11.58 times the value $t_r$ (202 nm) which is a quarter of the center wavelength $\lambda_c$. Thus, the coating film 47 is a very thick film.

The semiconductor photonic device shown in FIG. 2 will be considered for comparison. For the semiconductor photonic device shown in FIG. 2, the power reflectivity R is 8% for the wavelength λ equal to $\lambda_c$ (808 nm) when the coating film 2 having the above-mentioned refractive index $n_f$ of "1.3726" and a thickness $d_f$ of five times 147.17 nm, i.e. five times $\lambda_c/(4n_f)$, is provided on the end surface 1b of the semiconductor photonic element 1. FIG. 67 shows the wavelength dependence of the power reflectivity R in this case. As illustrated in FIG. 67, the wavelength band for which the power reflectivity R falls within ±2% from the design reflectivity of 8% is from 781 nm to 837 nm, to provide a wavelength bandwidth $W_r$ of 56 nm.

Thus, even when the center wavelength $\lambda_c$ is made equal to the design wavelength $\lambda_t$, the wavelength bandwidth W (84 nm) for the coating film 47 is greater than the wavelength bandwidth $W_r$ (56 nm) for the coating film 2 shown in FIG. 2.

Fifteenth Preferred Embodiment

FIG. 68 shows the wavelength dependence of the power reflectivity R of the coating film 57 in the semiconductor photonic device according to the fifteenth preferred embodiment of the present invention. The semiconductor photonic device according to the fifteenth preferred embodiment is similar to the semiconductor photonic device shown in FIG. 35 according to the seventh preferred embodiment except that the material layer for the first layer film 48, the third layer film 50, the fifth layer film 52, the seventh layer film 54 and the ninth layer film 56 is changed from the alumina layer to a tantalum oxide layer, that the material layer for the second layer film 49, the fourth layer film 51, the sixth layer film 53 and the eighth layer film 55 is changed from the tantalum oxide layer to an alumina layer, and that the design wavelength $\lambda_t$ is changed from 980 nm to 1310 nm. Accordingly, the values of the refractive indices $n_1$ and $n_2$ are "1.620" and "2.057," respectively.

For designing the thickness of the coating film 57 having the power reflectivity R of 8% ($R_t$=8%) when the wavelength λ equals the design wavelength of 1310 nm, a point which provides a phase angle θ of 195 degrees is selected, for example, in Step s1 so that the reflection amplitude vector rv is located in the third quadrant (or the lower left quadrant) of the complex plane according to the fifteenth preferred embodiment. Then, the values of the real and imaginary parts $r_r$ and $r_i$ of the complex number inputted as the value of the amplitude reflectivity r are "−0.27320508" and "−0.07320508," respectively, in Step s2.

When O=2.05, A=4.20, B=2.00, C=2.00 and D=2.00 are set, the basic amounts of phase change $\phi_1$ and $\phi_2$ determined in Step s5 are "0.410749" and "0.777027," respectively. Accordingly, the thicknesses of the first to ninth layer films 48 to 56 determined in Step s6 are 161.45 nm, 222.03 nm, 330.78 nm, 105.73 nm, 157.52 nm, 105.73 nm, 157.52 nm, 105.73 nm and 157.52 nm, respectively.

FIG. 68 described above shows the wavelength dependence of the power reflectivity R of the coating film 57 thus designed. As illustrated in FIG. 68, the power reflectivity R is 8% when the wavelength λ equals the design wavelength of 1310 nm. A wavelength band for which the power reflectivity R is approximately equal to the design reflectivity of 8% is wide. The power reflectivity R falls within a range from 6.0% to 10.0% for the wavelength λ ranging from 1358 nm to 1626 nm.

When the allowable reflectivity range is, for example, ±2% from the design reflectivity of 8%, the wavelength band for which the power reflectivity R falls within the allowable reflectivity range is also from 1358 nm to 1626 nm, to provide a wavelength bandwidth W of 268 nm. The center wavelength $\lambda_c$ of the wavelength band is 1492 nm. The value obtained by dividing the wavelength bandwidth W by the center wavelength $\lambda_c$ is approximately 0.180, which is greater than 0.06. It may be said that the wavelength band for which the power reflectivity R falls within the allowable reflectivity range is a wide band.

Because the thicknesses of the first to ninth layer films 48 to 56 take on the above-mentioned values, the optical thickness t of the coating film 57 is 2858.11 nm. This value is approximately 7.66 times the value $t_r$ (373 nm) which is a quarter of the center wavelength $\lambda_c$. Thus, the coating film 57 is a very thick film. This improves heat dissipation characteristics at the end surface 1b of the semiconductor photonic element 1 to suppress the increase in temperature of the end surface 1b.

Figure 69:
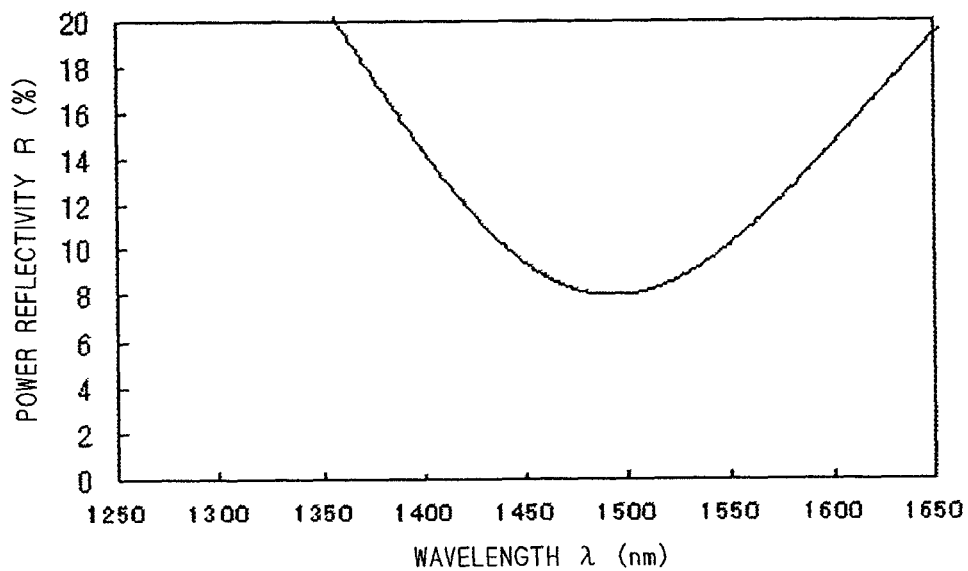
FIG. 69 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 8% for the wavelength λ equal to $\lambda_c$ (1492 nm) when the coating film 2 having the refractive index $n_f$ of "1.3726" as in the ninth preferred embodiment and a thickness $d_f$ of five times 271.75 nm, i.e. five times $\lambda_c/(4n_f)$, is provided on the end surface 1b of the semiconductor photonic element 1. FIG. 69 shows the wavelength dependence of the power reflectivity R in this case. As illustrated in FIG. 69, the wavelength band for which the power reflectivity R falls within ±2% from the design reflectivity of 8% is from 1442 nm to 1545 nm, to provide a wavelength bandwidth $W_r$ of 103 nm.

Thus, the wavelength bandwidth W (268 nm) for the coating film 57 of the fifteenth preferred embodiment is greater than the wavelength bandwidth $W_r$ (103 nm) for the coating film 2 shown in FIG. 2.

Figure 70:
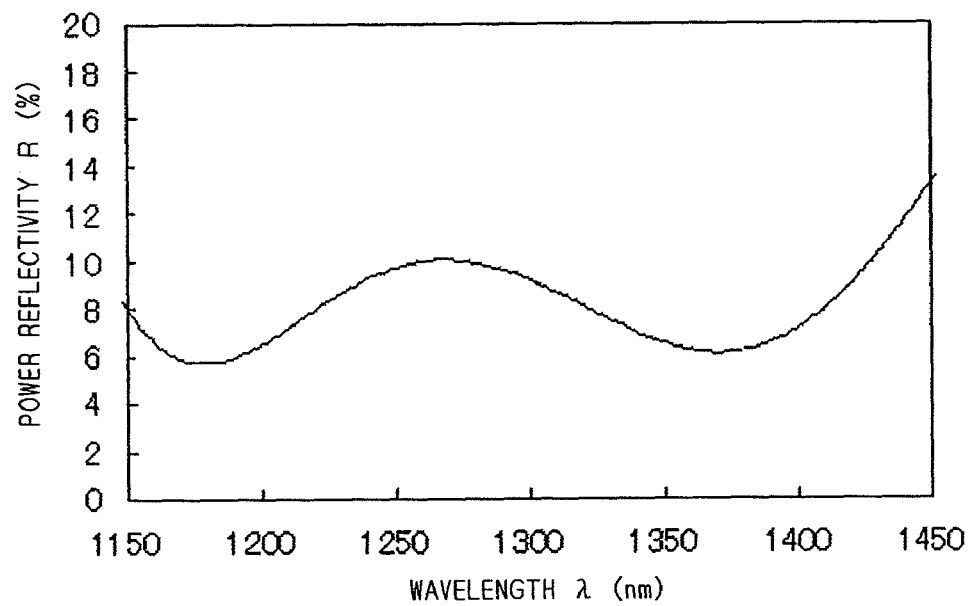
FIG. 70 is a graph showing the wavelength dependence of the power reflectivity of the coating film according to the fifteenth preferred embodiment of the present invention.

As mentioned above, because the wavelength λ of light propagating through the active layer 1a is sometimes varied, it is desirable that the center wavelength $\lambda_c$ of the wavelength band for which the power reflectivity R falls within the allowable reflectivity range be equal to or close to the design wavelength $\lambda_t$. For example, the center wavelength $\lambda_c$ takes on a value equal to the design wavelength $\lambda_t$ of 1310 nm when the thickness of the coating film 57 is determined using the basic thicknesses $d_1$ and $d_2$ obtained by setting the basic amounts of phase change $\phi_1$ and $\phi_2$ at "0.410749" and "0.777027," respectively, in a similar manner to the above instance and substituting 1150 nm, rather than the design wavelength $\lambda_t$, for λ in Equations (5a) and (5b). FIG. 70 shows the wavelength dependence of the power reflectivity R in this case.

As illustrated in FIG. 70, the power reflectivity R falls within a range from 6.0% to 10.0% for the wavelength λ ranging from 1192 nm to 1427 nm. The wavelength band for which the power reflectivity R falls within ±2% from the design reflectivity of 8% is also from 1192 nm to 1427 nm, to provide a wavelength bandwidth W of 235 nm. The center wavelength $\lambda_c$ of the wavelength band is 1310 nm, which is equal to the design wavelength of 1310 nm. The value obtained by dividing the wavelength bandwidth W (235 nm) by the center wavelength $\lambda_c$ (1310 nm) is approximately 0.179, which is greater than 0.06 and shows that the wavelength band for which the power reflectivity R falls within the allowable reflectivity range is a wide band.

In this case, the thicknesses of the first to ninth layer films 48 to 56 of the coating film 57 are 141.73 nm, 194.91 nm, 290.38 nm, 92.81 nm, 138.28 nm, 92.81 nm, 138.28 nm, 92.81 nm and 138.28 nm, respectively. The optical thickness t of the coating film 57 is 2508.99 nm. This value is approximately 7.65 times the value $t_r$ (328 nm) which is a quarter of the center wavelength $\lambda_c$. Thus, the coating film 57 is a very thick film.

Figure 71:
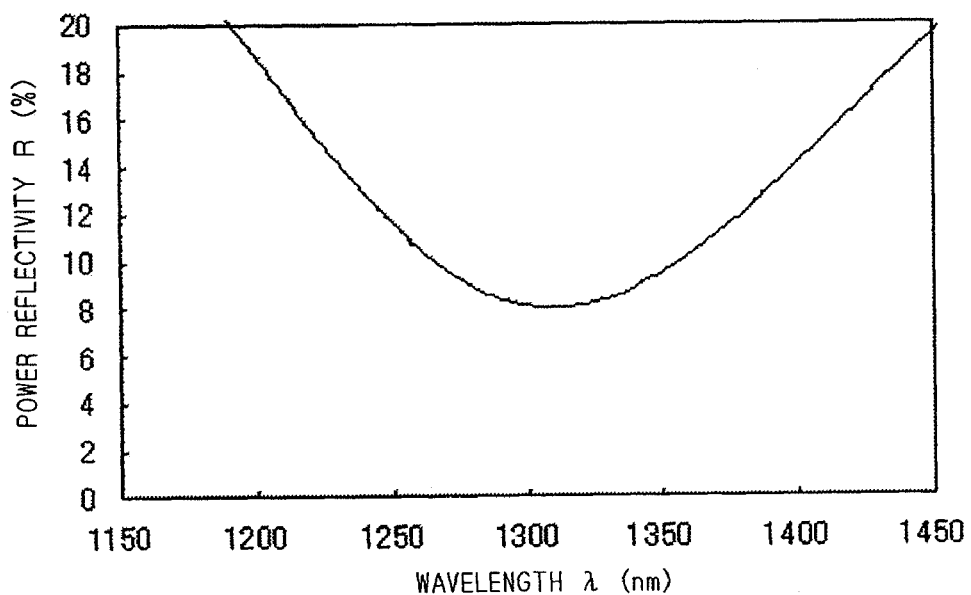
FIG. 71 is a graph showing the wavelength dependence of the power reflectivity of the single-layer coating film.

For the semiconductor photonic device shown in FIG. 2, the power reflectivity R is 8% for the wavelength λ equal to $\lambda_c$ (1310 nm) when the coating film 2 having the above-mentioned refractive index $n_f$ of "1.3726" and a thickness $d_f$ of five times 238.60 nm, i.e. five times $\lambda_c/(4n_f)$, is provided on the end surface 1b of the semiconductor photonic element 1. FIG. 71 shows the wavelength dependence of the power reflectivity R in this case. As illustrated in FIG. 71, the wavelength band for which the power reflectivity R falls within ±2% from the design reflectivity of 8% is from 1266 nm to 1357 nm, to provide a wavelength bandwidth $W_r$ of 91 nm.

Thus, even when the center wavelength $\lambda_c$ is made equal to the design wavelength $\lambda_t$, the wavelength bandwidth W (235 nm) for the coating film 57 is greater than the wavelength bandwidth $W_r$ (91 nm) for the coating film 2 shown in FIG. 2.

Sixteenth Preferred Embodiment

Figure 72:
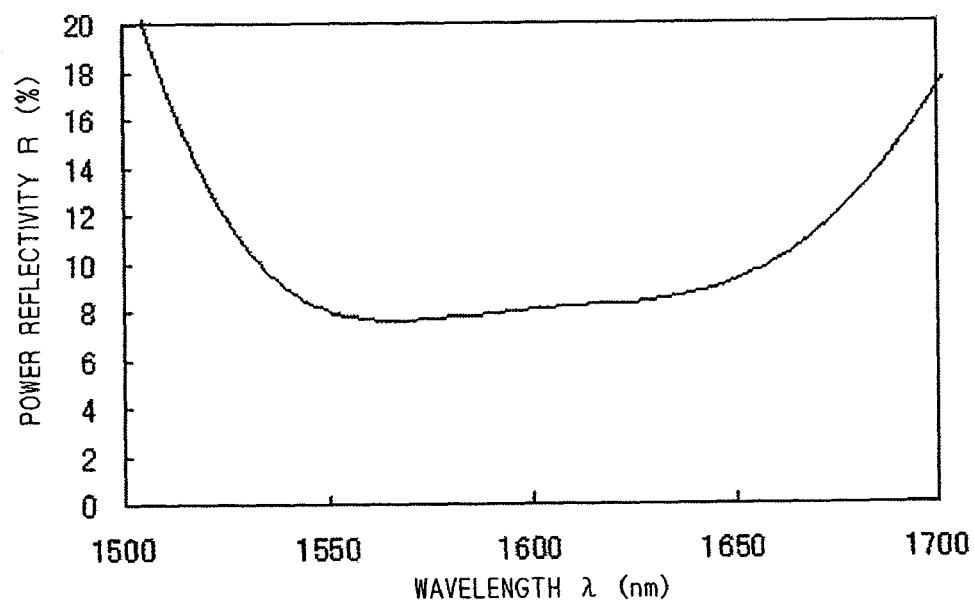
FIG. 72 is a graph showing the wavelength dependence of the power reflectivity of a coating film according to a sixteenth preferred embodiment of the present invention.

FIG. 72 shows the wavelength dependence of the power reflectivity R of the coating film 68 in the semiconductor photonic device according to the sixteenth preferred embodiment of the present invention. The semiconductor photonic device according to the sixteenth preferred embodiment is similar to the semiconductor photonic device shown in FIG. 39 according to the eighth preferred embodiment except that the material layer for the first layer film 58 is changed from the alumina layer to an aluminum nitride layer, that the material layer for the third layer film 60, the fifth layer film 62, the seventh layer film 64 and the ninth layer film 66 is changed from the aluminum nitride layer to a tantalum oxide layer, and that the design wavelength $\lambda_t$ is changed from 808 nm to 1550 nm. Accordingly, the values of the refractive indices $n_1$ and $n_2$ are "2.057" and "2.072," respectively, according to the sixteenth preferred embodiment.

For designing the thickness of the coating film 68 having the power reflectivity R of 8% ($R_t$=8%) when the wavelength λ equals the design wavelength of 1550 nm, a point which provides a phase angle θ of 285 degrees is selected, for example, in Step s1 so that the reflection amplitude vector rv is located in the fourth quadrant (or the lower right quadrant) of the complex plane according to the sixteenth preferred embodiment. Then, the values of the real and imaginary parts $r_r$ and $r_i$ of the complex number inputted as the value of the amplitude reflectivity r are "+0.07320508" and "−0.27320508," respectively, in Step s2.

When A=2.10, B=1.30, C=2.00, D=2.00, E=1.65 and the thickness $d_3$=20.0 nm are set, the basic amounts of phase change $\phi_1$ and $\phi_2$ determined in Step s5 are "0.722395" and "1.59546," respectively. Accordingly, the thicknesses of the second to tenth layer films 59 to 67 determined in Step s6 are 558.47 nm, 112.63 nm, 345.72 nm, 173.27 nm, 531.87 nm, 173.27 nm, 531.87 nm, 142.95 nm and 438.79 nm, respectively.

FIG. 72 described above shows the wavelength dependence of the power reflectivity R of the coating film 68 thus designed. As illustrated in FIG. 72, the power reflectivity R is 8% when the wavelength λ equals the design wavelength of 1550 n. A wavelength band for which the power reflectivity R is approximately equal to the design reflectivity of 8% is wide. The power reflectivity R falls within a range from 7.6% to 10.0% for the wavelength λ ranging from 1534 nm to 1659 nm.

When the allowable reflectivity range is, for example, ±2% from the design reflectivity of 8%, the wavelength band for which the power reflectivity R falls within the allowable reflectivity range is also from 1534 mm to 1659 nm, to provide a wavelength bandwidth W of 125 nm. The center wavelength $\lambda_c$ of the wavelength band is 1597 nm. The value obtained by dividing the wavelength bandwidth W by the center wavelength $\lambda_c$ is approximately 0.078, which is greater than 0.06. It may be said that the wavelength band for which the power reflectivity R falls within the allowable reflectivity range is a wide band.

Because the thicknesses of the first to tenth layer films 58 to 67 take on the above-mentioned values, the optical thickness t of the coating film 68 is 4841.95 nm. This value is approximately 12.14 times the value $t_r$ (399 nm) which is a quarter of the center wavelength $\lambda_c$. Thus, the coating film 68 is a very thick film. This improves heat dissipation characteristics at the end surface 1b of the semiconductor photonic element 1 to suppress the increase in temperature of the end surface 1b.

Figure 73:
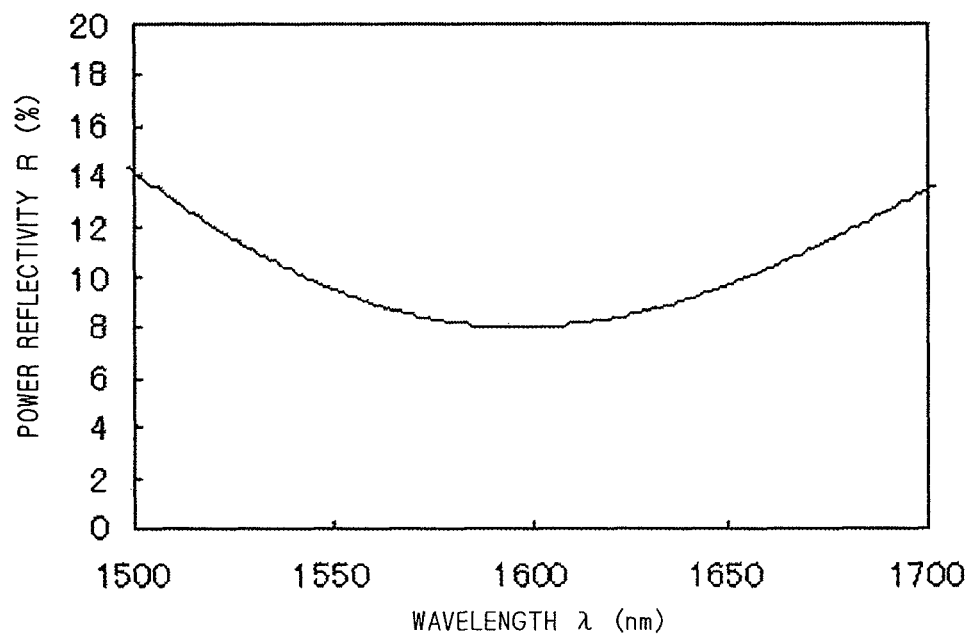
FIG. 73 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 8% for the wavelength λ equal to $\lambda_c$ (1597 nm) when the coating film 2 having the refractive index $n_f$ of "1.3726" as in the ninth preferred embodiment and a thickness $d_f$ of five times 290.87 nm, i.e. five times $\lambda_c/(4n_f)$, is provided on the end surface 1b of the semiconductor photonic element 1. FIG. 73 shows the wavelength dependence of the power reflectivity R in this case. As illustrated in FIG. 73, the wavelength band for which the power reflectivity R falls within ±2% from the design reflectivity of 8% is from 1544 nm to 1654 nm, to provide a wavelength bandwidth $W_r$ of 110 nm.

Thus, the wavelength bandwidth W (125 nm) for the coating film 68 of the sixteenth preferred embodiment is greater than the wavelength bandwidth $W_r$ (110 nm) for the coating film 2 shown in FIG. 2.

Figure 74:
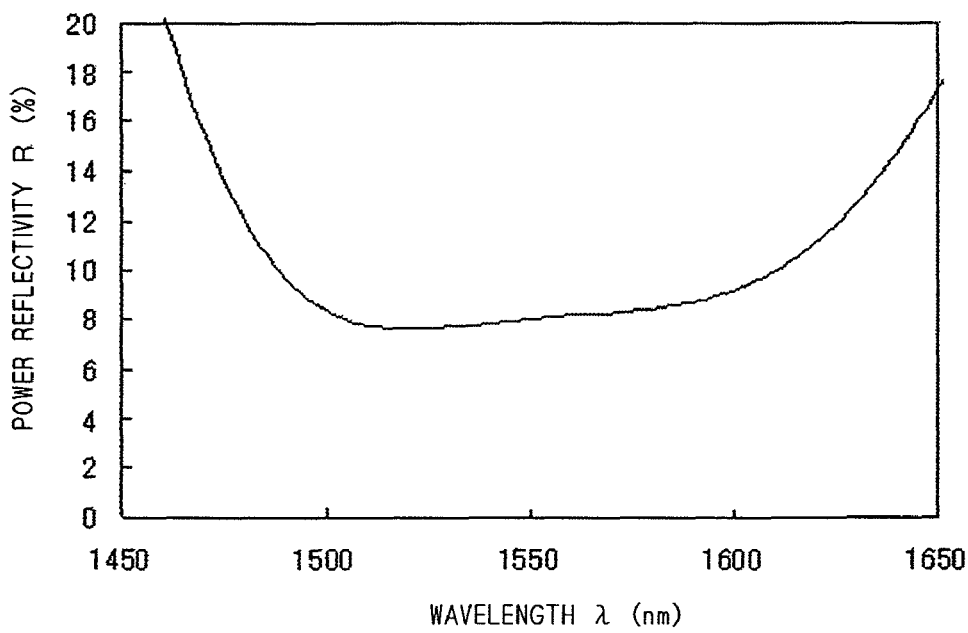
FIG. 74 is a graph showing the wavelength dependence of the power reflectivity of the coating film according to the sixteenth preferred embodiment of the present invention.

As mentioned above, because the wavelength λ of light propagating through the active layer 1a is sometimes varied, it is desirable that the center wavelength $\lambda_c$ of the wavelength band for which the power reflectivity R falls within the allowable reflectivity range be equal to or close to the design wavelength $\lambda_r$. For example, when the thickness $d_3$=20.0 nm, A=2.10, B=1.30, C=2.00, D=2.00 and E=1.65 are set, the basic amounts of phase change $\phi_1$ and $\phi_2$ are "0.723268" and "1.59370," respectively. The center wavelength $\lambda_c$ takes on a value equal to the design wavelength of 1550 nm when the thickness of the coating film 68 is determined using the basic thicknesses $d_1$ and $d_2$ obtained by substituting the above-mentioned values of the basic amounts of phase change $\phi_1$ and $\phi_2$ into Equations (5a) and (5b) and substituting 1505 nm, rather than the design wavelength $\lambda_r$, for λ in Equations (5a) and (5b). FIG. 74 shows the wavelength dependence of the power reflectivity R in this case.

As illustrated in FIG. 74, the power reflectivity R falls within a range from 7.6% to 10.0% for the wavelength λ ranging from 1489 nm to 1610 nm. The wavelength band for which the power reflectivity R falls within ±2% from the design reflectivity of 8% is also from 1489 mm to 1610 nm, to provide a wavelength bandwidth W of 121 nm. The center wavelength $\lambda_c$ of the wavelength band is 1550 nm, which is equal to the design wavelength of 1550 nm. The value obtained by dividing the wavelength bandwidth W (121 nm) by the center wavelength $\lambda_c$ (1550 nm) is approximately 0.078, which is greater than 0.06 and shows that the wavelength band for which the power reflectivity R falls within the allowable reflectivity range is a wide band.

In this case, the thicknesses of the first to tenth layer films 58 to 67 of the coating film 68 are 20.00 nm, 541.65 nm, 109.49 nm, 335.31 nm, 168.44 nm, 515.86 nm, 168.44 nm, 515.86 nm, 138.97 nm and 425.59 nm, respectively. The optical thickness t of the coating film 68 is 4700.20 nm. This value is approximately 12.11 times the value $t_r$ (388 nm) which is a quarter of the center wavelength $\lambda_c$. Thus, the coating film 68 is a very thick film.

Figure 75:
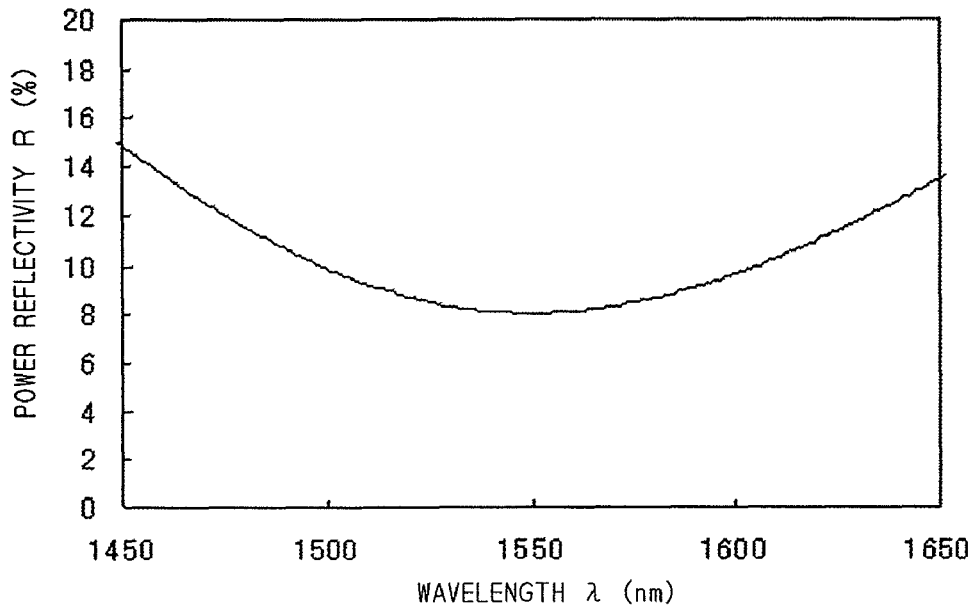
FIG. 75 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 8% for the wavelength λ equal to $\lambda_c$ (1550 nm) when the coating film 2 having the above-mentioned refractive index $n_f$ of "1.3726" and a thickness $d_f$ of five times 282.31 nm, i.e. five times $\lambda_c/(4n_f)$, is provided on the end surface 1b of the semiconductor photonic element 1. FIG. 75 shows the wavelength dependence of the power reflectivity R in this case. As illustrated in FIG. 75, the wavelength band for which the power reflectivity R falls within ±2% from the design reflectivity of 8% is from 1498 nm to 1606 nm, to provide a wavelength bandwidth $W_r$ of 108 nm.

Thus, even when the center wavelength $\lambda_c$ is made equal to the design wavelength $\lambda_r$, the wavelength bandwidth W (121 nm) for the coating film 68 is greater than the wavelength bandwidth $W_r$ (108 nm) for the coating film 2 shown in FIG. 2.

Seventeenth Preferred Embodiment

Figure 76:
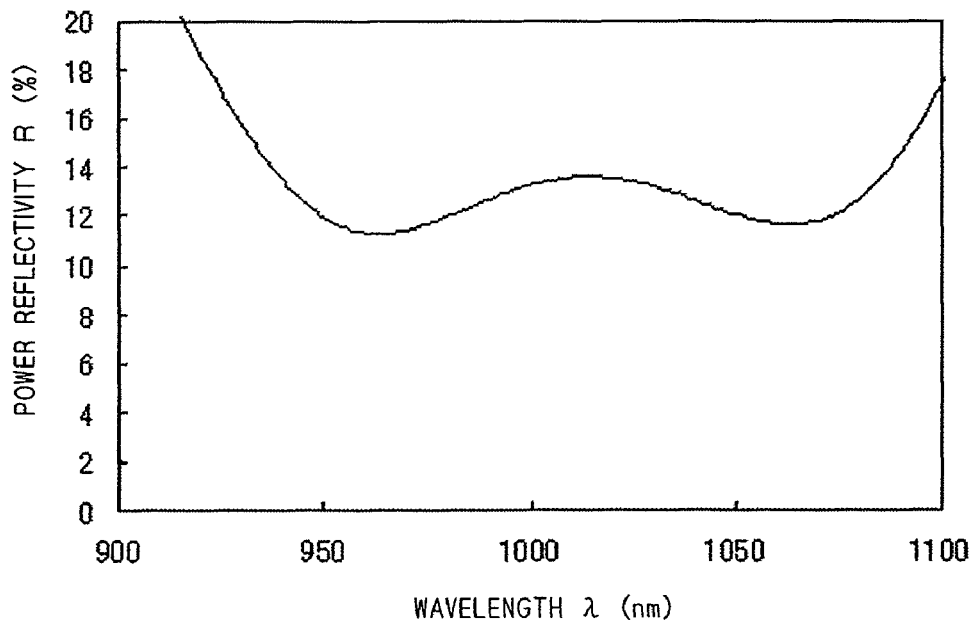
FIG. 76 is a graph showing the wavelength dependence of the power reflectivity of a coating film according to a seventeenth preferred embodiment of the present invention.

FIG. 76 shows the wavelength dependence of the power reflectivity R of the coating film 21 in the semiconductor photonic device according to the seventeenth preferred embodiment of the present invention. The semiconductor photonic device according to the seventeenth preferred embodiment is similar to the semiconductor photonic device shown in FIG. 15 according to the third preferred embodiment except that the material layer for the first layer film 14, the third layer film 16, the fifth layer film 18 and the seventh layer film 20 is changed from the alumina layer to a tantalum oxide layer, that the material layer for the second layer film 15, the fourth layer film 17 and the sixth layer film 19 is changed from the tantalum oxide layer to a silicon oxide layer, and that the design wavelength $\lambda_r$ is changed from 1310 nm to 980 nm. Accordingly, the values of the refractive indices $n_1$ and $n_2$ are "1.480" and "2.057," respectively.

For designing the thickness of the coating film 21 having a power reflectivity R of 12% ($R_r$=12%) when the wavelength λ equals the design wavelength of 980 nm, a point which provides a phase angle θ of 75 degrees is selected, for example, in Step s1 so that the reflection amplitude vector rv is located in the first quadrant (or the upper right quadrant) of the complex plane according to the seventeenth preferred embodiment. Then, because the magnitude of the complex number at the selected point is 0.346410161, the values of the real and imaginary parts $r_r$ and $r_i$ of the complex number inputted as the value of the amplitude reflectivity r are "+0.089657547" and "+0.334606521," respectively, in Step s2.

When O=2.56, A=2.95, B=2.00 and C=2.00 are set, the basic amounts of phase change $\phi_1$ and $\phi_2$ determined in Step s5 are "1.43423" and "0.68016," respectively. Accordingly, the thicknesses of the first to seventh layer films 14 to 20 determined in Step s6 are 132.03 nm, 445.89 nm, 152.14 nm, 302.30 nm, 103.15 nm, 302.30 nm and 103.15 nm, respectively.

FIG. 76 described above shows the wavelength dependence of the power reflectivity R of the coating film 21 thus designed. As illustrated in FIG. 76, the power reflectivity R is 12% when the wavelength λ equals the design wavelength of 980 nm. A wavelength band for which the power reflectivity R is approximately equal to the design reflectivity of 12% is wide. The power reflectivity R falls within a range from 11.3% to 14.0% for the wavelength λ ranging from 938 nm to 1087 nm.

When the allowable reflectivity range is, for example, ±2% from the design reflectivity of 12%, the wavelength band for which the power reflectivity R falls within the allowable reflectivity range is also from 938 nm to 1087 nm, to provide a wavelength bandwidth W of 149 nm. The center wavelength $\lambda_c$ of the wavelength band is 1013 nm. The value obtained by dividing the wavelength bandwidth W by the center wavelength $\lambda_c$ is approximately 0.147, which is greater than 0.06. It may be said that the wavelength band for which the power reflectivity R falls within the allowable reflectivity range is a wide band.

Because the thicknesses of the first to seventh layer films 14 to 20 take on the above-mentioned values, the optical thickness t of the coating film 21 is 2563.62 nm. This value is approximately 10.13 times the value $t_r$ (253 nm) which is a quarter of the center wavelength $\lambda_c$. Thus, the coating film 21 is a very thick film. This improves heat dissipation characteristics at the end surface 1b of the semiconductor photonic element 1 to suppress the increase in temperature of the end surface 1b.

Figure 77:
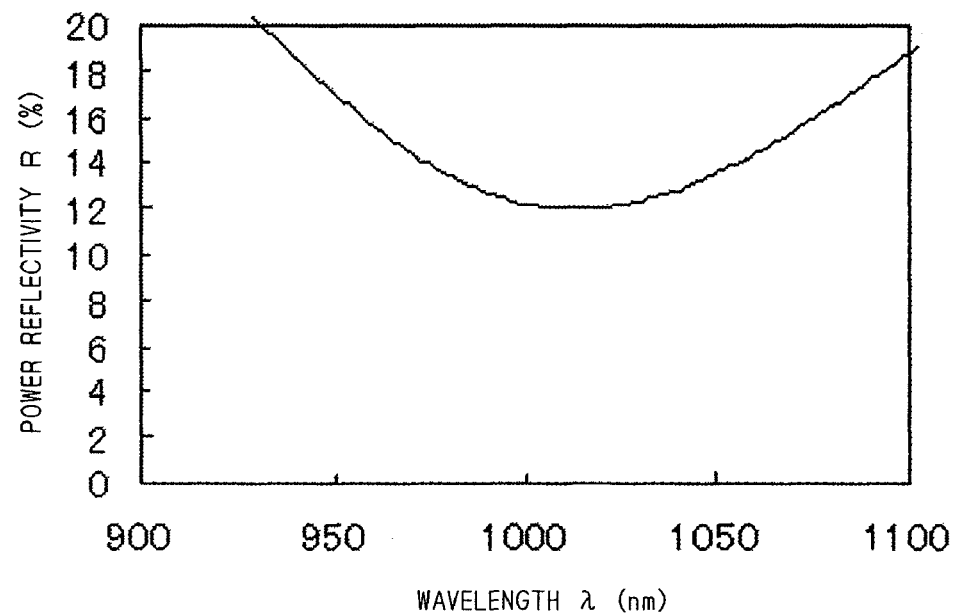
FIG. 77 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 12% for the wavelength λ equal to $\lambda_c$ (1013 nm) when the coating film 2 having a refractive index $n_f$ of "1.27902" and a thickness $d_f$ of five times 199.00 nm, i.e. five times $\lambda_c/(4n_f)$, is provided on the end surface 1b of the semiconductor photonic element 1. FIG. 77 shows the wavelength dependence of the power reflectivity R in this case. As illustrated in FIG. 77, the wavelength band for which the power reflectivity R falls within ±2% from the design reflectivity of 12% is from 975 nm to 1054 nm, to provide a wavelength bandwidth $W_r$ of 79 nm.

The above-mentioned value "1.27902" of the refractive index $n_f$ is obtained by substituting $R_t=0.12$ and $n_c=3.37$ into Equation (8).

Thus, the wavelength bandwidth W (149 nm) for the coating film 21 of the seventeenth preferred embodiment is greater than the wavelength bandwidth $W_r$ (79 nm) for the coating film 2 shown in FIG. 2.

Figure 78:
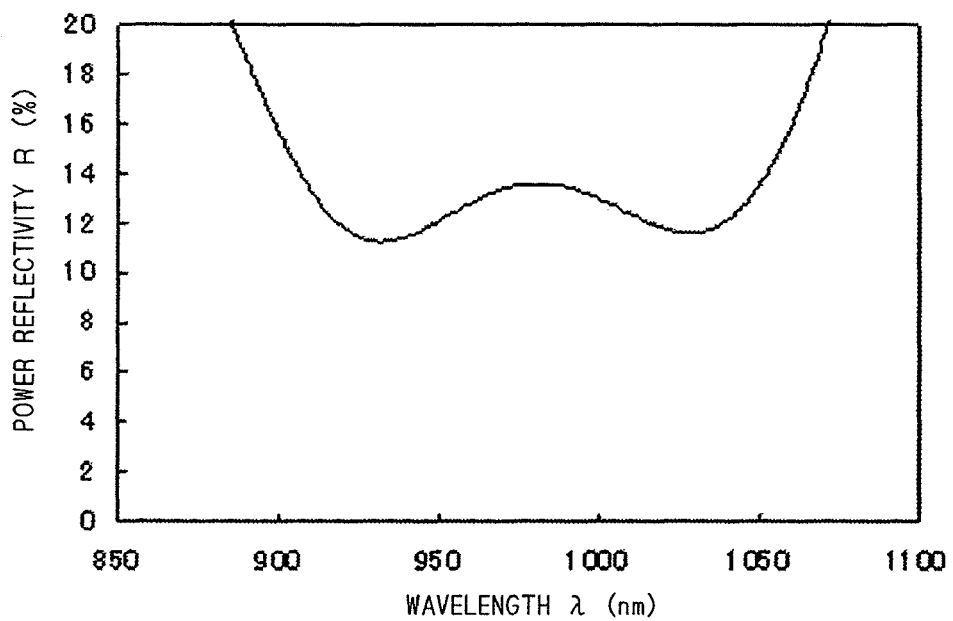
FIG. 78 is a graph showing the wavelength dependence of the power reflectivity of the coating film according to the seventeenth preferred embodiment of the present invention.

As mentioned above, because the wavelength λ of light propagating through the active layer 1a is sometimes varied, it is desirable that the center wavelength $\lambda_c$ of the wavelength band for which the power reflectivity R falls within the allowable reflectivity range be equal to or close to the design wavelength $\lambda_t$. For example, the center wavelength $\lambda_c$ takes on a value equal to the design wavelength $\lambda_t$ of 980 nm when the thickness of the coating film 21 is determined using the basic thicknesses $d_1$ and $d_2$ obtained by setting the basic amounts of phase change $\phi_1$ and $\phi_2$ at "1.43423" and "0.68016," respectively, in a similar manner to the above instance and substituting 948 nm, rather than the design wavelength $\lambda_t$, for λ in Equations (5a) and (5b). FIG. 78 shows the wavelength dependence of the power reflectivity R in this case.

As illustrated in FIG. 78, the power reflectivity R falls within a range from 11.3% to 14.0% for the wavelength λ ranging from 907 nm to 1052 nm. The wavelength band for which the power reflectivity R falls within ±2% from the design reflectivity of 12% is also from 907 nm to 1052 nm, to provide a wavelength bandwidth W of 145 nm. The center wavelength $\lambda_c$ of the wavelength band is 980 nm, which is equal to the design wavelength of 980 nm. The value obtained by dividing the wavelength bandwidth W (145 nm) by the center wavelength $\lambda_c$ (980 nm) is approximately 0.148, which is greater than 0.06 and shows that the wavelength band for which the power reflectivity R falls within the allowable reflectivity range is a wide band.

In this case, the thicknesses of the first to seventh layer films 14 to 20 of the coating film 21 are 127.72 nm, 431.33 nm, 147.17 nm, 292.43 nm, 99.78 nm, 292.43 nm and 99.78 nm, respectively. The optical thickness t of the coating film 21 is 2479.91 nm. This value is approximately 10.12 times the value $t_r$ (245 nm) which is a quarter of the center wavelength $\lambda_c$. Thus, the coating film 21 is a very thick film.

Figure 79:
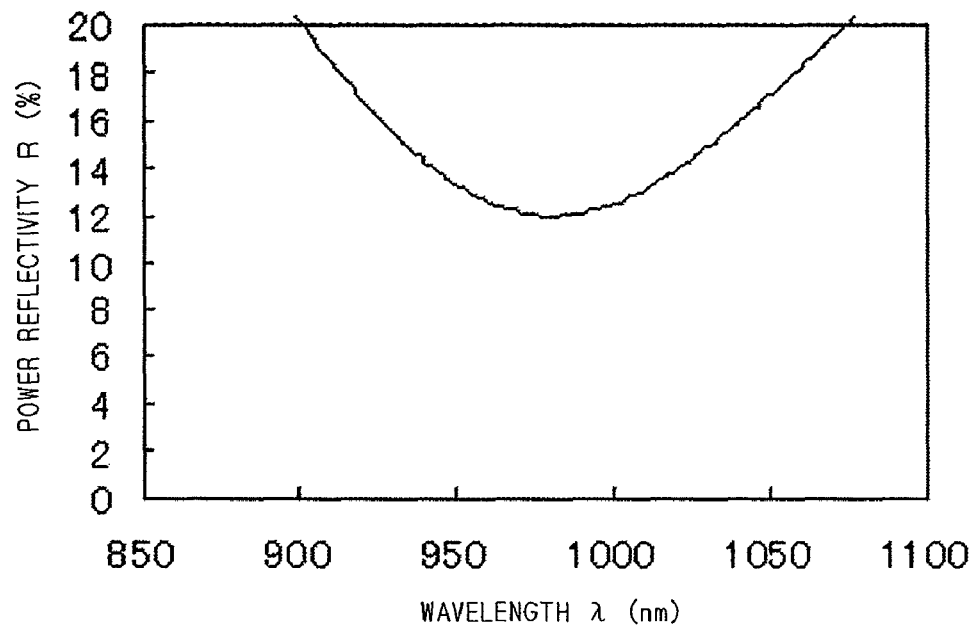
FIG. 79 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 12% for the wavelength λ equal to $\lambda_c$ (980 nm) when the coating film 2 having the above-mentioned refractive index $n_f$ of "1.27902" and a thickness $d_f$ of five times 191.55 nm, i.e. five times $\lambda_c/(4n_f)$, is provided on the end surface 1b of the semiconductor photonic element 1. FIG. 79 shows the wavelength dependence of the power reflectivity R in this case. As illustrated in FIG. 79, the wavelength band for which the power reflectivity R falls within ±2% from the design reflectivity of 12% is from 943 nm to 1020 nm, to provide a wavelength bandwidth $W_r$ of 77 nm.

Thus, even when the center wavelength $\lambda_c$ is made equal to the design wavelength $\lambda_t$, the wavelength bandwidth W (145 nm) for the coating film 21 is greater than the wavelength bandwidth $W_r$ (77 nm) for the coating film 2 shown in FIG. 2.

Eighteenth Preferred Embodiment

Figure 80:
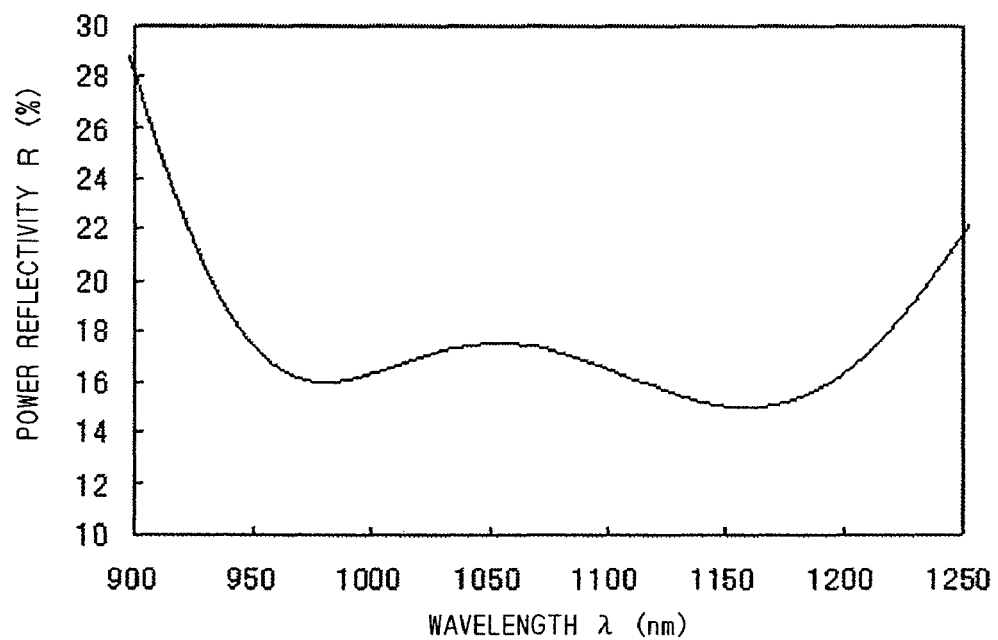
FIG. 80 is a graph showing the wavelength dependence of the power reflectivity of a coating film according to an eighteenth preferred embodiment of the present invention.

FIG. 80 shows the wavelength dependence of the power reflectivity R of the coating film 21 such that the power reflectivity R is 16% when the wavelength λ equals the design wavelength of 980 nm in the semiconductor photonic device of the above-mentioned seventeenth preferred embodiment of the present invention.

For designing the thickness of the coating film 21 having the power reflectivity R of 16% when the wavelength λ equals the design wavelength of 980 nm, a point which provides a phase angle θ of 165 degrees is selected, for example, in Step s1 so that the reflection amplitude vector rv is located in the second quadrant (or the upper left quadrant) of the complex plane according to the above-mentioned seventeenth preferred embodiment. Then, because the magnitude of the complex number at the selected point is 0.4, the values of the real and imaginary parts $r_r$ and $r_i$ of the complex number inputted as the value of the amplitude reflectivity r are "−0.38637033" and "+0.103527618," respectively, in Step s2.

When O=2.50, A=3.75, B=3.37 and C=1.80 are set, the basic amounts of phase change $\phi_1$ and $\phi_2$ determined in Step s5 are "0.651305" and "0.381901," respectively. Accordingly, the thicknesses of the first to seventh layer films 14 to 20 determined in Step s6 are 72.39 nm, 257.40 nm, 108.59 nm, 231.31 nm, 97.59 nm, 123.55 nm and 52.12 nm, respectively.

FIG. 80 described above shows the wavelength dependence of the power reflectivity R of the coating film 21 thus designed. As illustrated in FIG. 80, the power reflectivity R is 16% when the wavelength λ equals the design wavelength of 980 nm. A wavelength band for which the power reflectivity R is approximately equal to the design reflectivity of 16% is wide. The power reflectivity R falls within a range from 15.0% to 18.0% for the wavelength λ ranging from 945 nm to 1219 nm.

When the allowable reflectivity range is, for example, ±2% from the design reflectivity of 16%, the wavelength band for which the power reflectivity R falls within the allowable reflectivity range is also from 945 nm to 1219 nm, to provide a wavelength bandwidth W of 274 nm. The center wavelength $\lambda_c$ of the wavelength band is 1082 nm. The value obtained by dividing the wavelength bandwidth W by the center wavelength $\lambda_c$ is approximately 0.253, which is greater than 0.06. It may be said that the wavelength band for which the power reflectivity R falls within the allowable reflectivity range is a wide band.

Because the thicknesses of the first to seventh layer films 14 to 20 take on the above-mentioned values, the optical thickness t of the coating film 21 is 1586.37 nm. This value is approximately 5.85 times the value $t_r$ (271 nm) which is a quarter of the center wavelength $\lambda_c$. Thus, the coating film 21 is a very thick film. This improves heat dissipation characteristics at the end surface 1b of the semiconductor photonic element 1 to suppress the increase in temperature of the end surface 1b.

The semiconductor photonic device shown in FIG. 2 will be considered for comparison. For the semiconductor photonic device shown in FIG. 2, the power reflectivity R is 16% for the wavelength λ equal to $\lambda_c$ (1082 nm) when the coating film 2 having a refractive index $n_f$ of "1.20178" and a thickness $d_f$ of five times 225.08 nm, i.e. five times $\lambda_c/(4n_f)$, is provided on the end surface 1b of the semiconductor photonic element 1.

Figure 81:
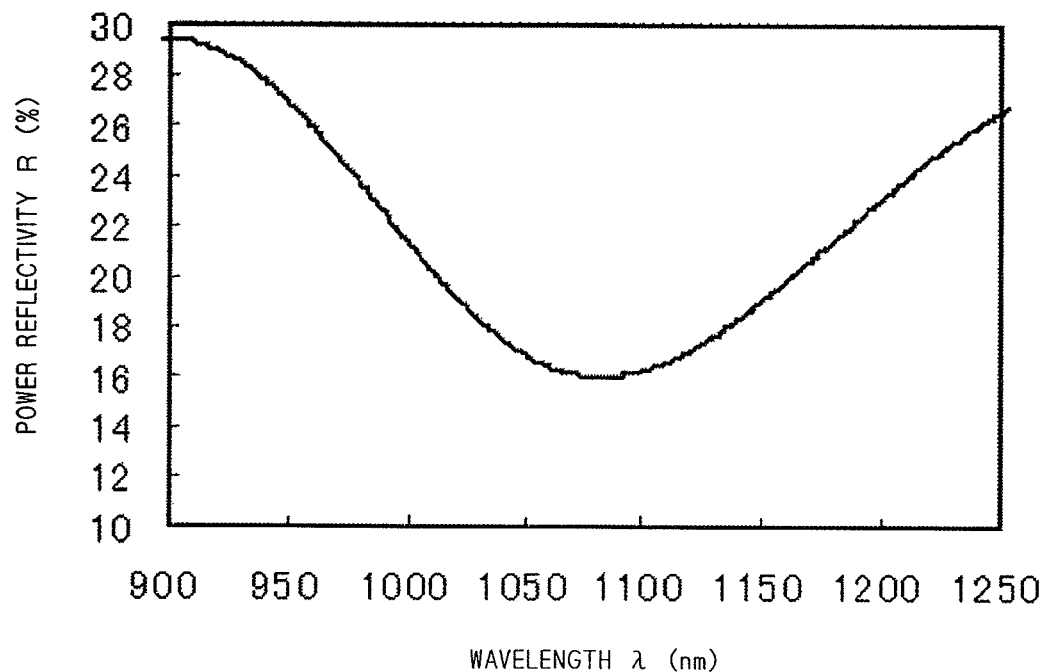
FIG. 81 is a graph showing the wavelength dependence of the power reflectivity of the single-layer coating film.

FIG. 81 shows the wavelength dependence of the power reflectivity R in this case. As illustrated in FIG. 81, the wavelength band for which the power reflectivity R falls within ±2% from the design reflectivity of 16% is from 1034 nm to 1134 nm, to provide a wavelength bandwidth $W_r$ of 100 nm.

The above-mentioned value "1.20178" of the refractive index $n_f$ is obtained by substituting $R_t=0.16$ and $n_c=3.37$ into Equation (8).

Thus, the wavelength bandwidth W (274 nm) for the coating film 21 of the eighteenth preferred embodiment of the present invention is greater than the wavelength bandwidth $W_r$ (100 nm) for the coating film 2 shown in FIG. 2.

Figure 82:
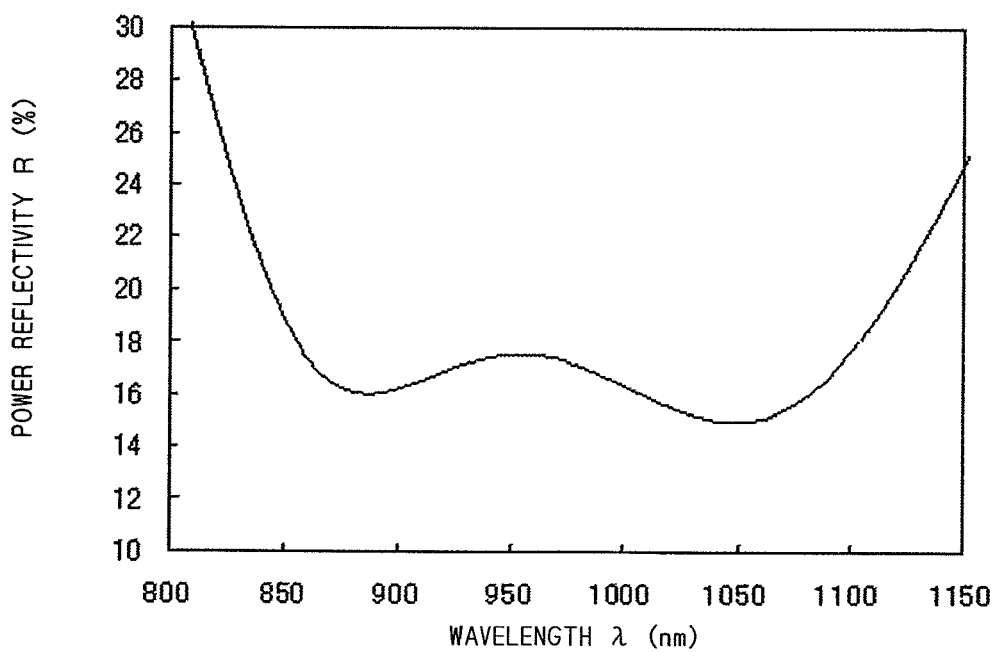
FIG. 82 is a graph showing the wavelength dependence of the power reflectivity of the coating film according to the eighteenth preferred embodiment of the present invention.

As mentioned above, because the wavelength λ of light propagating through the active layer 1a is sometimes varied, it is desirable that the center wavelength $λ_c$ of the wavelength band for which the power reflectivity R falls within the allowable reflectivity range be equal to or close to the design wavelength $λ_t$. For example, the center wavelength $λ_c$ takes on a value equal to the design wavelength $λ_t$ of 980 nm when the thickness of the coating film 21 is determined using the basic thicknesses $d_1$ and $d_2$ obtained by setting the basic amounts of phase change $φ_1$ and $φ_2$ at "0.651305" and "0.381901," respectively, in a similar manner to the above instance and substituting 887 nm, rather than the design wavelength $λ_t$, for λ in Equations (5a) and (5b). FIG. 82 shows the wavelength dependence of the power reflectivity R in this case.

As illustrated in FIG. 82, the power reflectivity R falls within a range from 15.0% to 18.0% for the wavelength λ ranging from 856 nm to 1103 nm. The wavelength band for which the power reflectivity R falls within ±2% from the design reflectivity of 16% is from 856 nm to 1103 nm, to provide a wavelength bandwidth W of 247 nm. The center wavelength $λ_c$ of the wavelength band is 980 nm, which is equal to the design wavelength of 980 nm. The value obtained by dividing the wavelength bandwidth W (247 nm) by the center wavelength $λ_c$ (980 nm) is approximately 0.252, which is greater than 0.06 and shows that the wavelength band for which the power reflectivity R falls within the allowable reflectivity range is a wide band.

In this case, the thicknesses of the first to seventh layer films 14 to 20 of the coating film 21 are 65.52 nm, 232.97 nm, 98.29 nm, 209.36 nm, 88.33 nm, 111.83 nm and 47.18 nm, respectively. The optical thickness t of the coating film 21 is 1435.86 nm. This value is approximately 5.86 times the value $t_r$ (245 nm) which is a quarter of the center wavelength $λ_c$. Thus, the coating film 21 is a very thick film.

Figure 83:
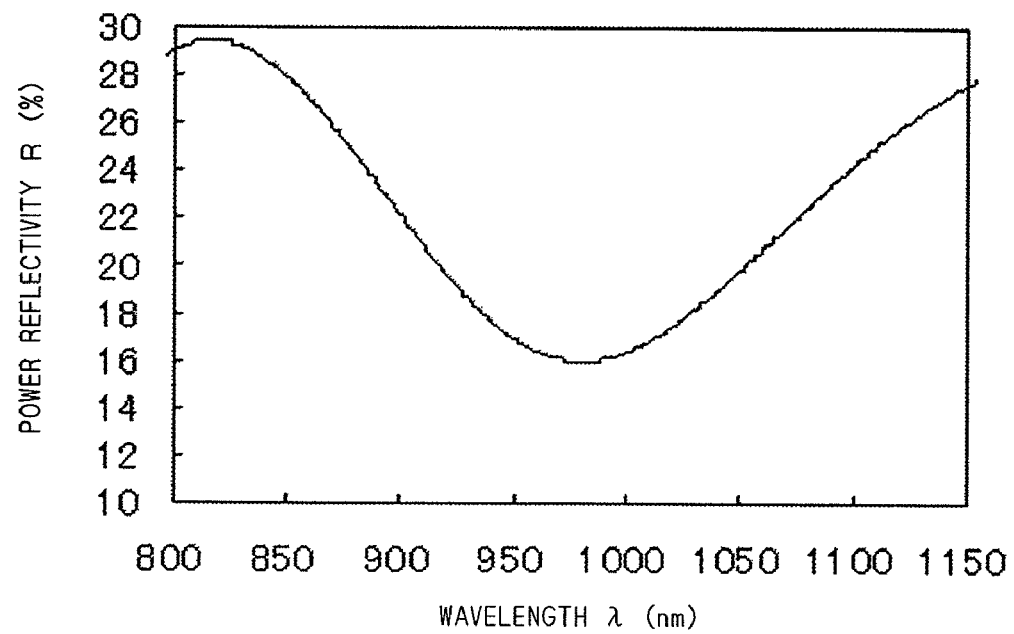
FIG. 83 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 16% for the wavelength λ equal to $λ_c$ (980 nm) when the coating film 2 having the above-mentioned refractive index $n_f$ of "1.20178" and a thickness $d_f$ of five times 203.86 nm, i.e. five times $λ_c/(4n_f)$, is provided on the end surface 1b of the semiconductor photonic element 1. FIG. 83 shows the wavelength dependence of the power reflectivity R in this case. As illustrated in FIG. 83, the wavelength band for which the power reflectivity R falls within ±2% from the design reflectivity of 16% is from 937 nm to 1027 nm, to provide a wavelength bandwidth $W_r$ of 90 nm.

Thus, even when the center wavelength $λ_c$ is made equal to the design wavelength $λ_t$, the wavelength bandwidth W (247 nm) for the coating film 21 is greater than the wavelength bandwidth $W_r$ (90 nm) for the coating film 2 shown in FIG. 2.

Nineteenth Preferred Embodiment

Figure 84:
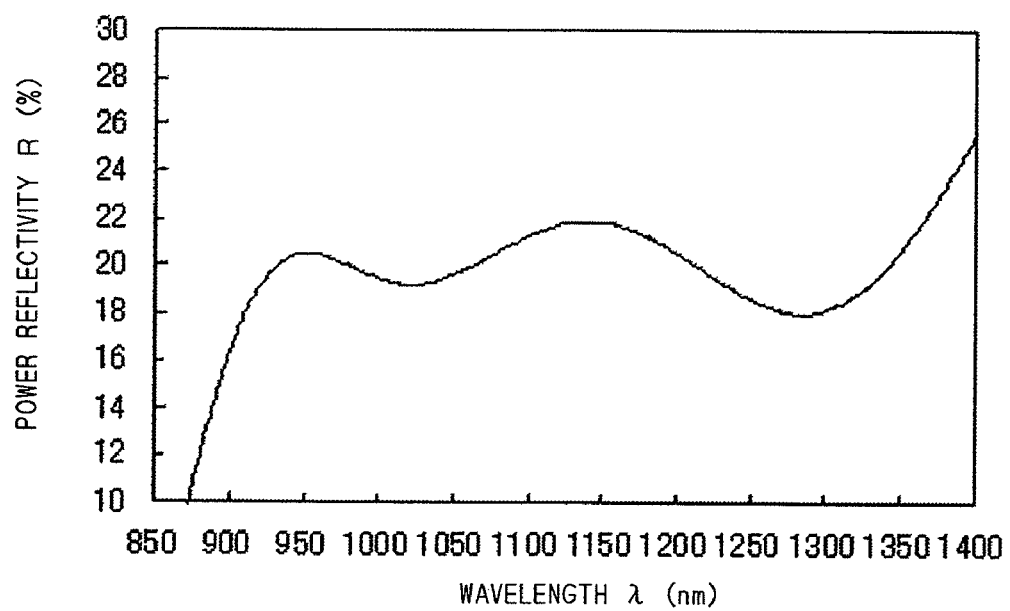
FIG. 84 is a graph showing the wavelength dependence of the power reflectivity of a coating film according to a nineteenth preferred embodiment of the present invention.

FIG. 84 shows the wavelength dependence of the power reflectivity R of the coating film 21 such that the power reflectivity R is 20% when the wavelength λ equals the design wavelength of 980 nm in the semiconductor photonic device of the above-mentioned seventeenth preferred embodiment of the present invention.

For designing the thickness of the coating film 21 having the power reflectivity R of 20% when the wavelength λ equals the design wavelength of 980 nm, a point which provides a phase angle θ of 255 degrees is selected, for example, in Step s1 so that the reflection amplitude vector rv is located in the third quadrant (or the lower left quadrant) of the complex plane according to the above-mentioned seventeenth preferred embodiment. Then, because the magnitude of the complex number at the selected point is 0.447213595, the values of the real and imaginary parts $r_r$ and $r_i$ of the complex number inputted as the value of the amplitude reflectivity r are "−0.115747395" and "−0.431975161," respectively, in Step s2.

When O=2.00, A=2.00, B=2.71 and C=1.02 are set, the basic amounts of phase change $φ_1$ and $φ_2$ determined in Step s5 are "1.01212" and "0.703719," respectively. Accordingly, the thicknesses of the first to seventh layer films 14 to 20 determined in Step s6 are 106.72 nm, 213.33 nm, 106.72 nm, 289.06 nm, 144.60 nm, 108.80 nm and 54.43 nm, respectively.

FIG. 84 described above shows the wavelength dependence of the power reflectivity R of the coating film 21 thus designed. As illustrated in FIG. 84, the power reflectivity R is 20% when the wavelength λ equals the design wavelength of 980 nm. A wavelength band for which the power reflectivity R is approximately equal to the design reflectivity of 20% is wide. The power reflectivity R falls within a range from 18.0% to 22.0% for the wavelength λ ranging from 911 nm to 1365 nm.

When the allowable reflectivity range is, for example, ±2% from the design reflectivity of 20%, the wavelength band for which the power reflectivity R falls within the allowable reflectivity range is also from 911 nm to 1365 nm, to provide a wavelength bandwidth W of 454 nm. The center wavelength $λ_c$ of the wavelength band is 1138 nm. The value obtained by dividing the wavelength bandwidth W by the center wavelength $λ_c$ is approximately 0.399, which is greater than 0.06. It may be said that the wavelength band for which the power reflectivity R falls within the allowable reflectivity range is a wide band.

Because the thicknesses of the first to seventh layer films 14 to 20 take on the above-mentioned values, the optical thickness t of the coating film 21 is 1753.01 nm. This value is approximately 6.15 times the value $t_r$ (285 nm) which is a quarter of the center wavelength $λ_c$. Thus, the coating film 21 is a very thick film. This improves heat dissipation characteristics at the end surface 1b of the semiconductor photonic element 1 to suppress the increase in temperature of the end surface 1b.

Figure 85:
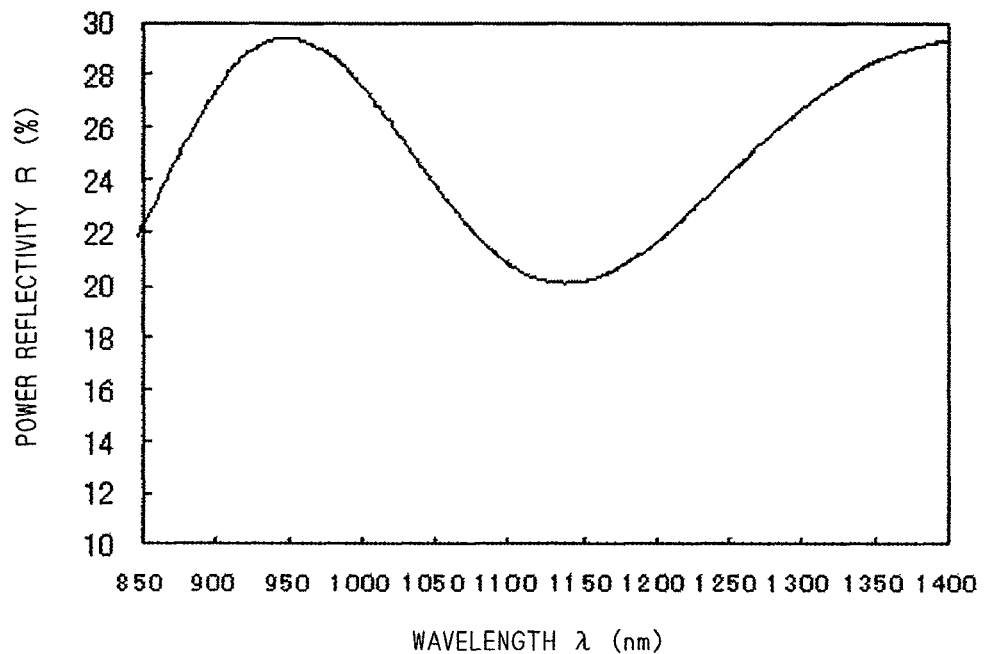
FIG. 85 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 20% for the wavelength λ equal to $λ_c$ (1138 nm) when the coating film 2 having a refractive index $n_f$ of "1.13456" and a thickness $d_f$ of five times 250.76 nm, i.e. five times $λ_c/(4n_f)$, is provided on the end surface 1b of the semiconductor photonic element 1. FIG. 85 shows the wavelength dependence of the power reflectivity R in this case. As illustrated in FIG. 85, the wavelength band for which the power reflectivity R falls within ±2% from the design reflectivity of 20% is from 1076 nm to 1207 nm, to provide a wavelength bandwidth $W_r$ of 131 nm.

The above-mentioned value "1.13456" of the refractive index $n_f$ is obtained by substituting $R_t$=0.20 and $n_c$=3.37 into Equation (8).

Thus, the wavelength bandwidth W (454 nm) for the coating film 21 of the nineteenth preferred embodiment of the present invention is greater than the wavelength bandwidth $W_r$ (131 nm) for the coating film 2 shown in FIG. 2.

Figure 86:
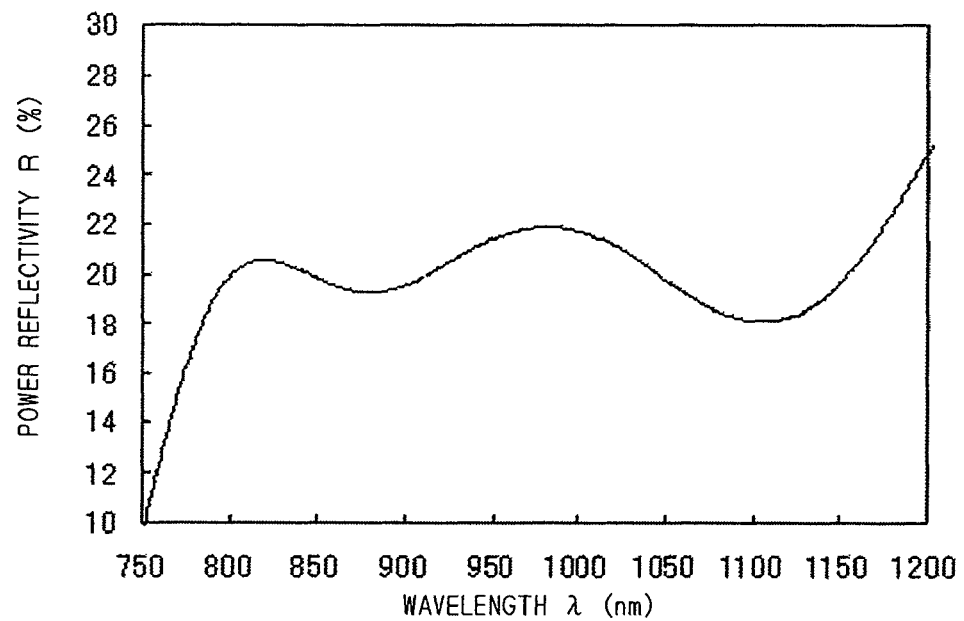
FIG. 86 is a graph showing the wavelength dependence of the power reflectivity of the coating film according to the nineteenth preferred embodiment of the present invention.

As mentioned above, because the wavelength λ of light propagating through the active layer 1a is sometimes varied, it is desirable that the center wavelength $\lambda_c$ of the wavelength band for which the power reflectivity R falls within the allowable reflectivity range be equal to or close to the design wavelength $\lambda_t$. For example, the center wavelength $\lambda_c$ takes on a value equal to the design wavelength $\lambda_t$ of 980 nm when the thickness of the coating film 21 is determined using the basic thicknesses $d_1$ and $d_2$ obtained by setting the basic amounts of phase change $\phi_1$ and $\phi_2$ at "1.01212" and "0.703719," respectively, in a similar manner to the above instance and substituting 844 nm, rather than the design wavelength $\lambda_t$, for λ in Equations (5a) and (5b). FIG. 86 shows the wavelength dependence of the power reflectivity R in this case.

As illustrated in FIG. 86, the power reflectivity R falls within a range from 18.0% to 22.0% for the wavelength λ ranging from 784 nm to 1176 nm. The wavelength band for which the power reflectivity R falls within ±2% from the design reflectivity of 20% is also from 784 nm to 1176 nm, to provide a wavelength bandwidth W of 392 nm. The center wavelength $\lambda_c$ of the wavelength band is 980 nm, which is equal to the design wavelength of 980 nm. The value obtained by dividing the wavelength bandwidth W (392 nm) by the center wavelength $\lambda_c$ (980 nm) is approximately 0.400, which is greater than 0.06 and shows that the wavelength band for which the power reflectivity R falls within the allowable reflectivity range is a wide band.

In this case, the thicknesses of the first to seventh layer films 14 to 20 of the coating film 21 are 91.91 nm, 183.72 nm, 91.91 nm, 248.94 nm, 124.54 nm, 93.70 nm and 46.87 nm, respectively. The optical thickness t of the coating film 21 is 1509.72 nm. This value is approximately 6.16 times the value $t_r$ (245 nm) which is a quarter of the center wavelength $\lambda_c$. Thus, the coating film 21 is a very thick film.

The semiconductor photonic device shown in FIG. 2 will be considered for comparison. For the semiconductor photonic device shown in FIG. 2, the power reflectivity R is 20% for the wavelength λ equal to $\lambda_c$ (980 nm) when the coating film 2 having the above-mentioned refractive index $n_f$ of "1.13456" and a thickness $d_f$ of five times 215.94 nm, i.e. five times $\lambda_c/(4n_f)$, is provided on the end surface 1b of the semiconductor photonic element 1. FIG. 87 shows the wavelength dependence of the power reflectivity R in this case. As illustrated in FIG. 87, the wavelength band for which the power reflectivity R falls within ±2% from the design reflectivity of 20% is from 927 nm to 1040 nm, to provide a wavelength bandwidth $W_r$ of 113 nm.

Thus, even when the center wavelength $\lambda_c$ is made equal to the design wavelength $\lambda_t$, the wavelength bandwidth W (392 nm) for the coating film 21 is greater than the wavelength bandwidth $W_r$ (113 nm) for the coating film 2 shown in FIG. 2.

Twentieth Preferred Embodiment

FIG. 88 shows the wavelength dependence of the power reflectivity R of the coating film 21 such that the power reflectivity R is 24% when the wavelength λ equals the design wavelength of 980 nm in the semiconductor photonic device of the above-mentioned seventeenth preferred embodiment of the present invention.

For designing the thickness of the coating film 21 having the power reflectivity R of 24% when the wavelength λ equals the design wavelength of 980 nm, a point which provides a phase angle θ of 345 degrees is selected, for example, in Step s1 so that the reflection amplitude vector rv is located in the fourth quadrant (or the lower right quadrant) of the complex plane according to the above-mentioned seventeenth preferred embodiment. Then, because the magnitude of the complex number at the selected point is 0.489897948, the values of the real and imaginary parts $r_r$ and $r_i$ of the complex number inputted as the value of the amplitude reflectivity r are "+0.47320508" and "−0.126794919," respectively, in Step s2.

When O=1.95, A=1.85, B 0.10 and C=1.96 are set, the basic amounts of phase change $\phi_1$ and $\phi_2$ determined in Step s5 are "1.40351" and "0.680892," respectively. Accordingly, the thicknesses of the first to seventh layer films 14 to 20 determined in Step s6 are 100.68 nm, 273.64 nm, 95.51 nm, 14.79 nm, 5.16 nm, 289.91 nm and 101.19 nm, respectively.

FIG. 88 described above shows the wavelength dependence of the power reflectivity R of the coating film 21 thus designed. As illustrated in FIG. 88, the power reflectivity R is 24% when the wavelength λ equals the design wavelength of 980 nm. A wavelength band for which the power reflectivity R is approximately equal to the design reflectivity of 24% is wide. The power reflectivity R falls within a range from 22.0% to 24.0% for the wavelength λ ranging from 961 nm to 1153 nm.

When the allowable reflectivity range is, for example, +2% from the design reflectivity of 24%, the wavelength band for which the power reflectivity R falls within the allowable reflectivity range is also from 961 nm to 1153 nm, to provide a wavelength bandwidth W of 192 nm. The center wavelength $\lambda_c$ of the wavelength band is 1057 nm. The value obtained by dividing the wavelength bandwidth W by the center wavelength $\lambda_c$ is approximately 0.182, which is greater than 0.06. It may be said that the wavelength band for which the power reflectivity R falls within the allowable reflectivity range is a wide band.

Because the thicknesses of the first to seventh layer films 14 to 20 take on the above-mentioned values, the optical thickness t of the coating film 21 is 1478.27 nm. This value is approximately 5.60 times the value $t_r$ (264 nm) which is a quarter of the center wavelength $\lambda_c$. Thus, the coating film 21 is a very thick film. This improves heat dissipation characteristics at the end surface 1b of the semiconductor photonic element 1 to suppress the increase in temperature of the end surface 1b.

Figure 89:
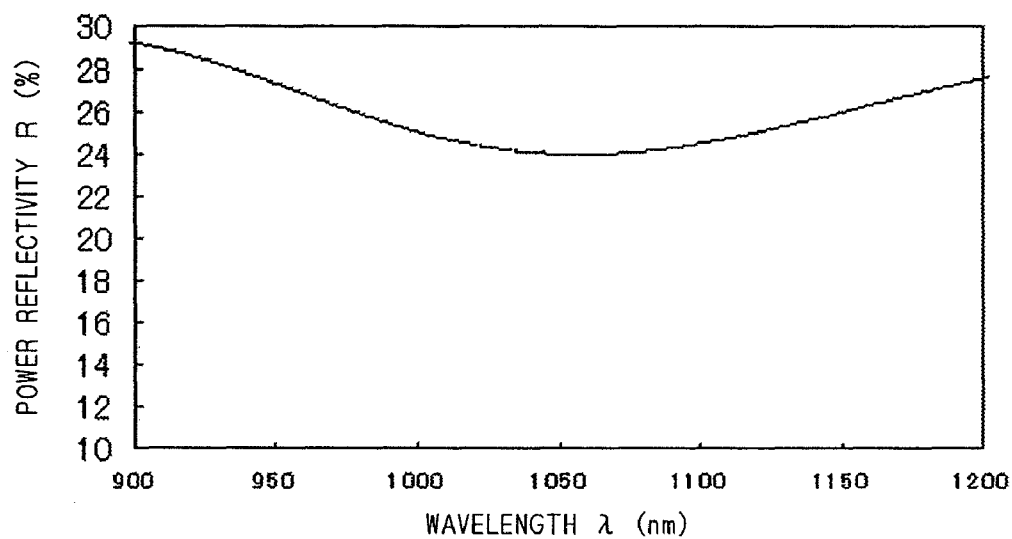
FIG. 89 is a graph showing the wavelength dependence of the power reflectivity of the single-layer coating film.

The semiconductor photonic device shown in FIG. 2 will be considered for comparison. For the semiconductor photonic device shown in FIG. 2, the power reflectivity R is 24% for the wavelength λ equal to $\lambda_c$ (1057 nm) when the coating film 2 having a refractive index $n_f$ of "1.07415" and a thickness $d_f$ of five times 246.01 nm, i.e. five times $\lambda_c/(4n_f)$, is provided on the end surface 1b of the semiconductor photonic element 1. FIG. 89 shows the wavelength dependence of the power reflectivity R in this case. As illustrated in FIG. 89, the wavelength band for which the power reflectivity R falls within ±2% from the design reflectivity of 24% is from 978 nm to 1150 nm, to provide a wavelength bandwidth $W_r$ of 172 nm.

The above-mentioned value "1.07415" of the refractive index $n_f$ is obtained by substituting $R_t$=0.24 and $n_c$=3.37 into Equation (8).

Thus, the wavelength bandwidth W (192 nm) for the coating film 21 of the twentieth preferred embodiment of the present invention is greater than the wavelength bandwidth $W_r$ (172 nm) for the coating film 2 shown in FIG. 2.

Figure 90:
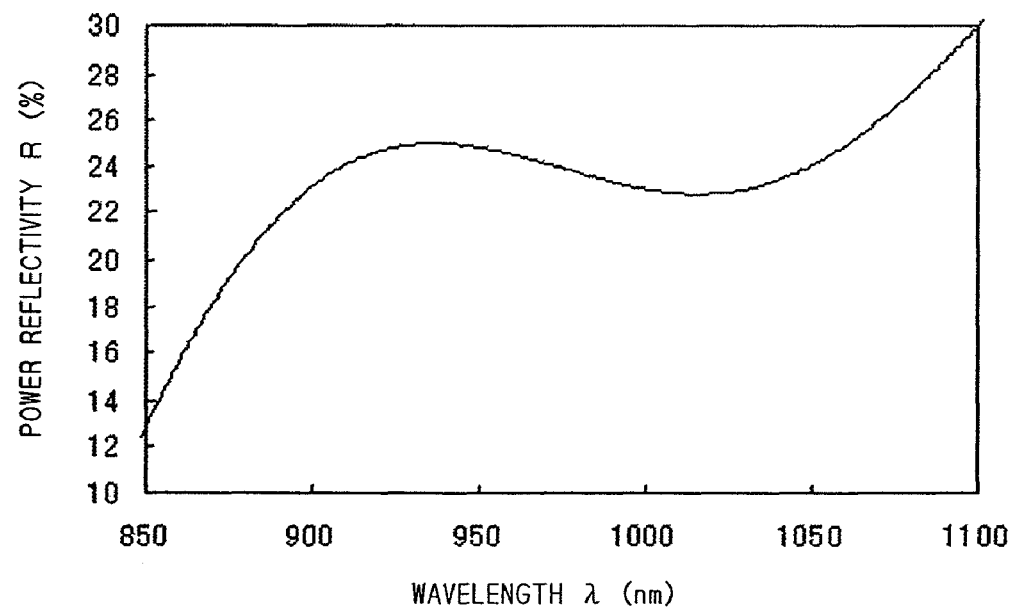
FIG. 90 is a graph showing the wavelength dependence of the power reflectivity of the coating film according to the twentieth preferred embodiment of the present invention.

As mentioned above, because the wavelength λ of light propagating through the active layer 1a is sometimes varied, it is desirable that the center wavelength $\lambda_c$ of the wavelength band for which the power reflectivity R falls within the allowable reflectivity range be equal to or close to the design wavelength $\lambda_t$. For example, the center wavelength $\lambda_c$ takes on a value approximately equal to the design wavelength $\lambda_t$ of 980 nm when the thickness of the coating film 21 is determined using the basic thicknesses $d_1$ and $d_2$ obtained by setting the basic amounts of phase change $\phi_1$ and $\phi_2$ at "1.40351" and "0.680892," respectively, in a similar manner to the above instance and substituting 909 nm, rather than the design wavelength $\lambda_t$, for λ in Equations (5a) and (5b). FIG. 90 shows the wavelength dependence of the power reflectivity R in this case.

As illustrated in FIG. 90, the power reflectivity R falls within a range from 22.0% to 26.0% for the wavelength λ ranging from 891 nm to 1070 nm. The wavelength band for which the power reflectivity R falls within ±2% from the design reflectivity of 24% is also from 891 nm to 1070 nm, to provide a wavelength bandwidth W of 179 nm. The center wavelength $\lambda_c$ of the wavelength band is 981 nm, which is approximately equal to the design wavelength of 980 nm. The value obtained by dividing the wavelength bandwidth W (179 nm) by the center wavelength $\lambda_c$ (981 nm) is approximately 0.182, which is greater than 0.06 and shows that the wavelength band for which the power reflectivity R falls within the allowable reflectivity range is a wide band.

In this case, the thicknesses of the first to seventh layer films 14 to 20 of the coating film 21 are 93.38 nm, 253.81 nm, 88.59 nm, 13.72 nm, 4.79 nm, 268.90 nm and 93.86 nm, respectively. The optical thickness t of the coating film 21 is 1371.15 nm. This value is approximately 5.60 times the value $t_r$ (245 nm) which is a quarter of the center wavelength $\lambda_c$. Thus, the coating film 21 is a very thick film.

The semiconductor photonic device shown in FIG. 2 will be considered for comparison. For the semiconductor photonic device shown in FIG. 2, the power reflectivity R is 24% for the wavelength λ equal to $\lambda_c$ (981 nm) when the coating film 2 having the above-mentioned refractive index $n_f$ of "1.07415" and a thickness $d_f$ of five times 228.32 nm, i.e. five times $\lambda_c/(4n_f)$, is provided on the end surface 1b of the semiconductor photonic element 1. FIG. 91 shows the wavelength dependence of the power reflectivity R in this case. As illustrated in FIG. 91, the wavelength band for which the power reflectivity R falls within ±2% from the design reflectivity of 24% is from 907 nm to 1066 nm, to provide a wavelength bandwidth $W_r$ of 159 nm.

Thus, even when the center wavelength $\lambda_c$ is made close to the design wavelength $\lambda_t$, the wavelength bandwidth W (179 nm) for the coating film 21 is greater than the wavelength bandwidth $W_r$ (159 nm) for the coating film 2 shown in FIG. 2.

Although the center wavelength $\lambda_c$ is close to the design wavelength $\lambda_t$ in the above instance, the center wavelength $\lambda_c$ may be made exactly equal to the design wavelength $\lambda_t$ by adjusting the values of the parameters A, B, C and O or the value substituted for λ in Equations (5a) and (5b).

The conditions and results according to the first to twentieth preferred embodiments described hereinabove are listed in FIGS. 92 and 93.

As described hereinabove, the first to twentieth preferred embodiments of the present invention employ an imaginary number as the value of the amplitude reflectivity r of the coating film provided on the end surface 1b of the semiconductor photonic element 1, to make it possible to design the thickness of the coating film having the predetermined power reflectivity R in consideration for more complex numbers having the same amplitude as the value of the amplitude reflectivity r than real numbers. This improves the design flexibility of the thickness of the coating film to make the coating film having a desired characteristic easy to design.

Additionally, the first to twentieth preferred embodiments determine the thicknesses of the respective layers included in the coating film so that the center wavelength $\lambda_c$ of the wavelength band for which the power reflectivity R of the coating film falls within the allowable reflectivity range is equal to the design wavelength $\lambda_t$. This provides the coating film whose power reflectivity R is varied slightly even if the wavelength λ in the actual device is changed from the design wavelength $\lambda_t$.

In the semiconductor photonic device according to the first to twentieth preferred embodiments, the power reflectivity R of the coating film is varied slightly even if the wavelength λ of light propagating through the active layer 1a is varied, because of the wide wavelength band for which the power reflectivity R of the coating film falls within the allowable reflectivity range. This achieves the provision of the semiconductor photonic device having characteristics less susceptible to the wavelength dependence of the power reflectivity R of the coating film.

The first to twentieth preferred embodiments reliably suppress the variation in the power reflectivity R of the coating film even if the wavelength λ is varied because the allowable reflectivity range is set at ±2% from the median value thereof (the design reflectivity $R_t$).

The coating films described above have the six-layer structure, the seven-layer structure, the eight-layer structure, the nine-layer structure, and the ten-layer structure in the first to twentieth preferred embodiments. The present invention, however, is not limited to these coating films, but is applicable to coating films having other layer structures.

The values of the parameters A, B, C, D, E and O are merely examples. The parameters A, B, C, D, E and O may take on other values to produce similar effects.

The design wavelength $\lambda_t$ is 410 nm, 650 nm, 808 nm, 980 nm, 1310 nm and 1550 nm in the first to twentieth preferred embodiments described above. The present invention, however, is not limited to this, but is applicable to other values of the wavelength.

Although only up to three material layers for the coating film are described, the present invention is applicable to four or more material layers for the coating film.

While the invention has been described in detail, the foregoing description is in all aspects illustrative and not restrictive. It is understood that numerous other modifications and variations can be devised without departing from the scope of the invention.

What is claimed is:

1. A semiconductor photonic device comprising:
a semiconductor photonic element having an effective refractive index $n_c$ and including an active layer through which light having a wavelength λ propagates; and
a coating film including a plurality of layers and located on an end surface of said semiconductor photonic element, wherein
said coating film has an amplitude reflectivity r having a magnitude component and a phase component so that the amplitude reflectivity can be expressed as a complex number with a real part and an imaginary part and the amplitude reflectivity has a non-zero real part and a non-zero imaginary part, said coating film has a power reflectivity $R=|r|^2$, said coating film includes a multi-layer film, said multi-layer film including a first layer having a refractive index $n_1$ and a thickness $d_1$, and a second layer having a refractive index $n_2$ and a thickness $d_2$, arranged in a stack, said first and second layers of said multi-layer film have a thickness ratio equal to $d_1/d_2$, the amplitude reflectivity, r, is $$r = \frac{(m_{11} + m_{12})n_c - (m_{21} + m_{22})}{(m_{11} + m_{12})n_c + (m_{21} + m_{22})},$$

where $m_{11}$, $m_{12}$, $m_{21}$, and $m_{22}$ are elements of the characteristic matrix of said coating film having $\lambda$, $n_1$, $n_2$, $d_1$, $d_2$ and $d_1/d_2$ as variables, the characteristic matrix satisfies $$\begin{bmatrix} m_{11} & m_{12} \\ m_{21} & m_{22} \end{bmatrix} = \begin{bmatrix} \cos\phi_1 & -\frac{i}{n_1}\sin\phi_1 \\ -in_1\sin\phi_1 & \cos\phi_1 \end{bmatrix} \times \begin{bmatrix} \cos\phi_2 & -\frac{i}{n_2}\sin\phi_2 \\ -in_2\sin\phi_2 & \cos\phi_2 \end{bmatrix}$$

where $\phi_1$ is phase change of light having the wavelength $\lambda$ and passing through said first layer of said multi-layer film and $\phi_2$ is phase change of light having the wavelength $\lambda$ and passing through said second layer of said multi-layer film, $$\phi_1 = \frac{2\pi}{\lambda}n_1 d_1, \text{ and } \phi_2 = \frac{2\pi}{\lambda}n_2 d_2.$$

2. The semiconductor photonic device according to claim 1, wherein the power reflectivity of said coating film is less than the power reflectivity at said end surface, the power reflectivity at said end surface being determined by the effective refractive index of said semiconductor photonic element and refractive index of free space that contacts said end surface when said coating film is absent.

3. The semiconductor photonic device according to claim 1, wherein said coating film includes layers of at least two different materials selected from the group consisting of silicon oxide, tantalum oxide, alumina, and aluminum nitride.

4. The semiconductor photonic device according to claim 1 wherein $$r = \frac{(n_c - 1)\cos\varphi_1\cos\varphi_2 + \left(\frac{n_1}{n_2} - \frac{n_2 n_c}{n_1}\right)\sin\varphi_1\sin\varphi_2 - i\left\{\left(\frac{n_c}{n_2} - n_2\right)\cos\varphi_1\sin\varphi_2 + \left(\frac{n_c}{n_1} - n_1\right)\sin\varphi_1\cos\varphi_2\right\}}{(n_c + 1)\cos\varphi_1\cos\varphi_2 - \left(\frac{n_2 n_c}{n_1} + \frac{n_1}{n_2}\right)\sin\varphi_1\sin\varphi_2 - i\left\{\left(\frac{n_c}{n_2} + n_2\right)\cos\varphi_1\sin\varphi_2 + \left(\frac{n_c}{n_1} + n_1\right)\sin\varphi_1\cos\varphi_2\right\}},$$

whereby $d_1$ and $d_2$ result in r having a non-zero real part and a non-zero imaginary part.

5. A semiconductor photonic device comprising:

a semiconductor photonic element having an effective refractive index $n_c$ and including an active layer through which light having a wavelength $\lambda$, propagates; and a coating film including a plurality of layers and located on an end surface of said semiconductor photonic element, wherein said coating film has an amplitude reflectivity r having a magnitude component and a phase component so that the amplitude reflectivity can be expressed as a complex number with a real part and an imaginary part and the amplitude reflectivity has a non-zero real part and a non-zero imaginary part, said coating film has a power reflectivity $R=|r|^2$, said coating film includes first through m multi-layer films, where m is at least 2, the first of said multi-layer films consisting of a first layer having a refractive index $n_1$ and a thickness $d_1$, and a second layer having a refractive index $n_2$ and a thickness $d_2$, arranged in a stack, an nth of said multi-layer films consisting of a first layer having the refractive index $n_1$ and a thickness $A_n d_1$, and a second layer having the refractive index $n_2$ and a thickness $A_n d_2$, arranged in a stack, and said mth multi-layer film consists of a first layer having the refractive index $n_1$ and a thickness $A_m d_1$, and a second layer having the refractive index $n_2$ and a thickness $A_m d_2$, where $A_n$ is thickness ration of said n-th multi-layer film to said first multi-layer film, each of said multi-layer films has a thickness ratio equal to $d_1/d_2$, the amplitude reflectivity, r, is $$r = \frac{(m_{11} + m_{12})n_c - (m_{21} + m_{22})}{(m_{11} + m_{12})n_c + (m_{21} + m_{22})},$$

where $m_{1j}$, $m_{12}$, $m_{21}$, and $m_{22}$ are elements of the characteristic matrix of said coating film having $\lambda$, $n_1$, $n_2$, $d_1$, $d_2$, and $d_1/d_2$ as variables, the characteristic matrix satisfies $$\begin{bmatrix} m_{11} & m_{12} \\ m_{21} & m_{22} \end{bmatrix} = \begin{bmatrix} \cos\phi_1 & -\frac{i}{n_1}\sin\phi_1 \\ -in_1\sin\phi_1 & \cos\phi_1 \end{bmatrix} \begin{bmatrix} \cos\phi_2 & -\frac{i}{n_2}\phi_2 \\ -in_2\sin\phi_2 & \cos\phi_2 \end{bmatrix} \times$$

$$\vdots$$

$$\begin{bmatrix} \cos A_n\phi_1 & -\frac{i}{n_1}\sin A_n\phi_2 \\ -in_1\sin A_n\phi_1 & \cos A_n\phi_1 \end{bmatrix} \begin{bmatrix} \cos A_n\phi_2 & -\frac{i}{n_2}\sin A_n\phi_2 \\ -in_2\sin A_n\phi_2 & \cos A_n\phi_2 \end{bmatrix} \times$$

$$\vdots$$

$$\begin{bmatrix} \cos A_m\phi_1 & -\frac{i}{n}\sin A_m\phi_1 \\ -in_1\sin A_m\phi_1 & \cos A_m\phi_1 \end{bmatrix} \begin{bmatrix} \cos A_m\phi_2 & -\frac{i}{n_2}\sin A_m\phi_2 \\ -in_2\sin A_m\phi_2 & \cos A_m\phi_2 \end{bmatrix},$$

where $\phi_1$ is phase change of light having the wavelength $\lambda$, and passing through said first layers of said multi-layer films and $\phi_2$ is phase change of light having the wavelength $\lambda$ and passing through the second layers of said multi-layer films, $$\phi_1 = \frac{2\pi}{\lambda}n_1 d_1, \text{ and } \phi_2 = \frac{2\pi}{\lambda}n_2 d_2.$$

6. The semiconductor photonic device according to claim 5, wherein the power reflectivity of said coating film is less than the power reflectivity at said end surface, the power reflectivity at said end surface being determined by the effective refractive index of said semiconductor photonic element and refractive index of free space that contacts said end surface when said coating film is absent.

7. The semiconductor photonic device according to claim 5, wherein
said coating film includes layers of two different materials, and
the number of said layers of said coating film is selected from the group consisting of six, seven, eight, and nine.

8. The semiconductor photonic device according to claim 5, wherein
said coating film includes layers of three different materials, and
the number of said layers of said coating film is selected from the group consisting of seven, eight, and ten.

9. The semiconductor photonic device according to claim 5, wherein said coating film includes layers of at least two different materials selected from the group consisting of silicon oxide, tantalum oxide, alumina, and aluminum nitride.

* * * * *